US012449486B2

(12) United States Patent
Isono

(10) Patent No.: US 12,449,486 B2
(45) Date of Patent: Oct. 21, 2025

(54) SEMICONDUCTOR MODULE AND FAILED ELEMENT DETERMINATION METHOD THEREFOR

(71) Applicant: FUJI ELECTRIC CO., LTD., Kawasaki (JP)

(72) Inventor: Tomohiro Isono, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 299 days.

(21) Appl. No.: 17/954,696

(22) Filed: Sep. 28, 2022

(65) Prior Publication Data

US 2023/0143001 A1 May 11, 2023

(30) Foreign Application Priority Data

Nov. 5, 2021 (JP) .................................. 2021-181226

(51) Int. Cl.
*G01R 31/52* (2020.01)
*H01L 23/00* (2006.01)
(Continued)

(52) U.S. Cl.
CPC .......... *G01R 31/52* (2020.01); *H01L 23/3677* (2013.01); *H01L 23/49811* (2013.01); *H01L 23/49833* (2013.01); *H01L 23/49844* (2013.01); *H01L 23/5385* (2013.01); *H01L 23/5386* (2013.01); *H01L 24/48* (2013.01); *H01L 25/0655* (2013.01); *H01L 2224/48011* (2013.01); *H01L 2224/48091* (2013.01);
(Continued)

(58) Field of Classification Search
CPC .......................... G01R 31/364; G01R 31/389; G01R 31/3842; G01R 31/52; H01L 23/00; H01L 23/12; H01L 23/498; H01L 23/538; H01L 23/367; H01L 25/065; H03K 17/082; H03K 17/60; H03K 17/74; H02M 7/537
See application file for complete search history.

(56) References Cited

U.S. PATENT DOCUMENTS 11,522,533 B2 * 12/2022 Nakamura .......... H01L 23/4952
2007/0285974 A1 * 12/2007 Takemura ........... G11C 11/1675
365/158

(Continued)

FOREIGN PATENT DOCUMENTS

CN 103166615 * 6/2013 ............. H10D 99/00
JP 2006-253568 A 9/2006
(Continued)

*Primary Examiner* — Neel D Shah

(57) ABSTRACT

There is provided a semiconductor module capable of determining a semiconductor chip in which a short-circuit failure has occurred without being disassembled. A semiconductor module includes IGBT provided in each of semiconductor chips connected in parallel, switching of which being controlled by a gate voltage based on a gate signal; two external terminals input with the gate signal; a first connection route group having a first connection route and a third connection route connecting the external terminal and the IGBTs provided in the semiconductor chips respectively; and a second connection route group having a second connection route and a fourth connection route connecting the external terminal and the IGBTs provided in the semiconductor chips respectively.

20 Claims, 15 Drawing Sheets

(51) Int. Cl.
*H01L 23/367* (2006.01)
*H01L 23/498* (2006.01)
*H01L 23/538* (2006.01)
*H01L 25/065* (2023.01)

(52) U.S. Cl.
CPC ............... *H01L 2224/48157* (2013.01); *H01L 2924/1203* (2013.01); *H01L 2924/13055* (2013.01)

(56) References Cited

U.S. PATENT DOCUMENTS

2016/0294379 A1* 10/2016 Hayashiguchi ...... H03K 17/122
2021/0013141 A1 1/2021 Nakayama et al.

FOREIGN PATENT DOCUMENTS

| JP | 2019-186510 A | 10/2019 |
| WO | 2020071102 A1 | 9/2020 |

\* cited by examiner

SEMICONDUCTOR MODULE AND FAILED ELEMENT DETERMINATION METHOD THEREFOR

CROSS REFERENCE TO RELATED APPLICATIONS

This application claims the benefit of priority under 35 USC § 119 from Japanese Patent Application No. 2021-181226 filed on Nov. 5, 2021, the contents of which is incorporated herein by reference.

TECHNICAL FIELD

The present invention relates to a semiconductor module including a voltage-controlled switching element, and a failed element determination method therefor.

BACKGROUND ART

In a semiconductor module including semiconductor chips connected in parallel, there has been known a technology of connecting semiconductor chips connected in parallel with a lead frame (for example, PTL 1). Further, in a semiconductor module including semiconductor devices connected in parallel, there has been known a technology of connecting these semiconductor devices and a plurality of pads with wires (for example, PTL 2). In addition, in a power semiconductor module including power semiconductor chips connected in parallel, there has been known a technology in which each gate electrode of the power semiconductor chips connected in parallel and one gate terminal are connected (for example, PTL 3).

CITATION LIST

Patent Literatures

PTL 1: WO 2020/071102
PTL 2: JP 2019-186510 A
PTL 3: JP 2006-253568 A

SUMMARY OF INVENTION

Technical Problem

A short-circuit failure may occur in which a control terminal (for example, a gate terminal) provided in a semiconductor chip, a semiconductor device, and a semiconductor chip for electric power (hereinafter, collectively referred to as a "semiconductor chip") to control switching of the semiconductor chip, and other terminals (for example, an emitter terminal or a drain terminal or the like) provided in the semiconductor chip are short-circuited. When such a short-circuit failure occurs in any one of the semiconductor chips connected in parallel, it is not possible to determine the semiconductor chip in which the short-circuit failure has occurred even if the electrical characteristics (for example, current-voltage characteristics) of these semiconductor chips are measured in a state of being provided in a semiconductor module. Therefore, when such a short-circuit failure occurs, for example, after disassembling the semiconductor module provided with the semiconductor chip, the semiconductor chip in which the short-circuit failure has occurred is identified by analysis of light emission by emission microscopy (EMS). Therefore, there is a problem that it takes time to identify the semiconductor chip in which the short-circuit failure has occurred.

An object of the present invention is to provide a semiconductor module capable of determining a semiconductor chip in which a short-circuit failure has occurred without being disassembled, and a failed element determination method therefor.

Solution to Problem

A semiconductor module according to one aspect of the present invention includes a plurality of voltage-controlled switching elements connected in parallel, switching of which being controlled by a drive voltage based on an input signal; a first external terminal and a second external terminal input with the input signal, a first connection route group having a plurality of connection routes connecting the first external terminal and the plurality of voltage-controlled switching elements, and a second connection route group having a plurality of connection routes connecting the second external terminal and the plurality of voltage-controlled switching elements and different in resistance value from each other.

A failed element determination method according to one aspect of the semiconductor module of the present invention compares a current flowing through the first external terminal and a current flowing through the second external terminal to determine whether or not a failure occurs in any of the plurality of voltage-controlled switching elements.

A failed element determination method according to another aspect of the semiconductor module of the present invention compares a current flowing through the second external terminal and a predetermined comparative current value to determine whether or not a failure occurs in any of the plurality of voltage-controlled switching elements.

Advantageous Effects of Invention

According to each aspect of the present invention, it is possible to determine a semiconductor chip in which a short-circuit failure has occurred without being disassembled.

DESCRIPTION OF EMBODIMENTS

First Embodiment

Figure 1:
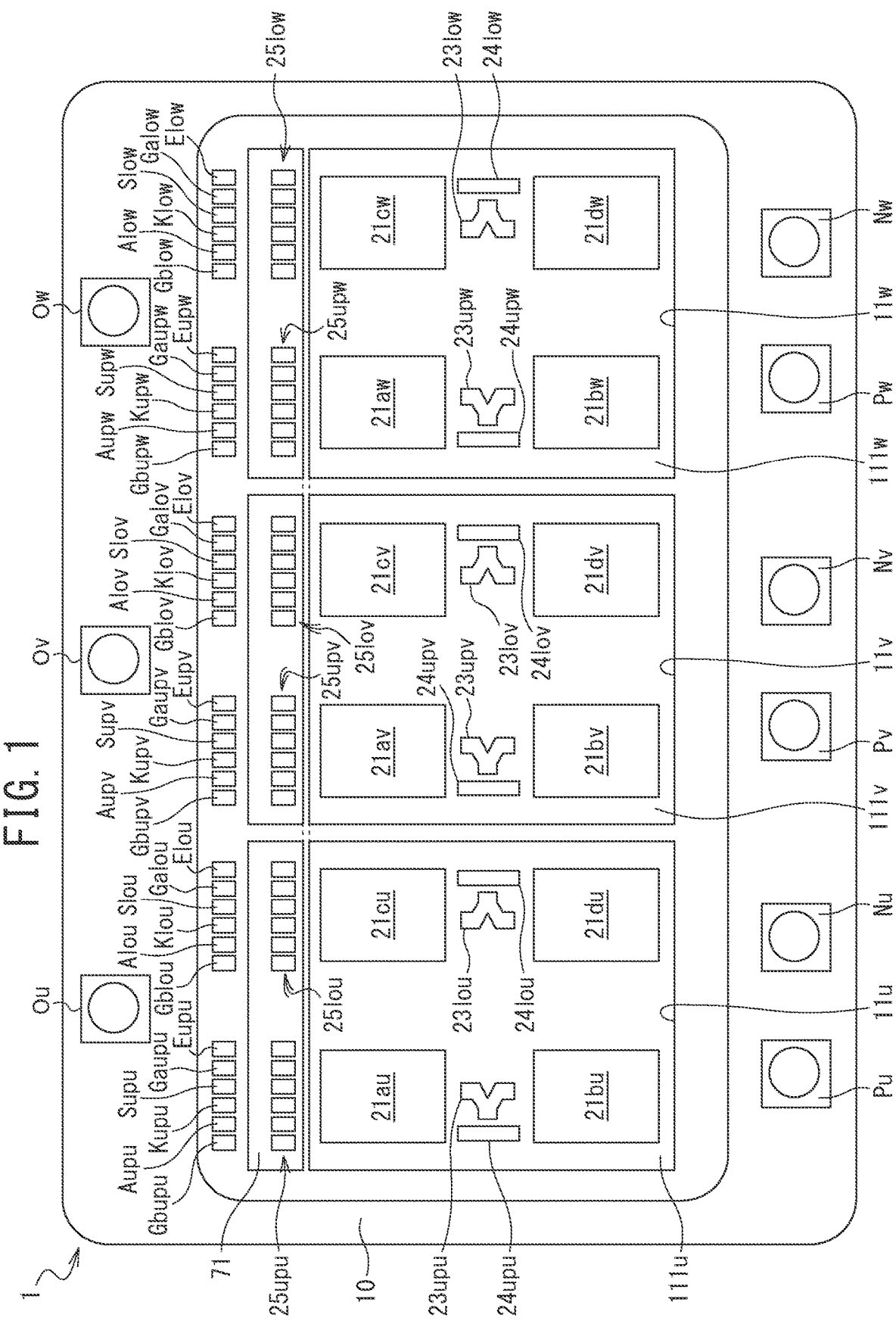
FIG. 1 is a plan view schematically illustrating a schematic configuration of a semiconductor module according to a first embodiment of the present invention.

A semiconductor module according to a first embodiment of the present invention and a failed element determination method therefor will be described with reference to FIGS. 1 to 12. First, a schematic configuration of the semiconductor module according to this embodiment will be described with reference to FIGS. 1 to 4B. In this embodiment, a three-phase power conversion module capable of performing DC/AC conversion as a semiconductor module will be described as an example. However, the semiconductor module according to this embodiment can also be applied to a power conversion module capable of performing DC/DC conversion or AC/DC conversion. FIG. 1 is a diagram schematically illustrating an example of a plane of a semiconductor module 1 according to this embodiment. In FIG. 1, in order to facilitate understanding, wiring patterns and the like formed on laminated substrates 111$u$, 111$v$, and 111$w$ provided in the semiconductor module 1 and a mold resin covering the laminated substrates 111$u$, 111$v$, and 111$w$ and the like are not illustrated.

As illustrated in FIG. 1, the semiconductor module 1 according to this embodiment includes a case 10 having a rectangular shape in a plan view. The case 10 includes a storage unit 11$u$ which accommodates the laminated substrate 111$u$ for U phase provided in the semiconductor module 1, a storage unit 11$v$ which accommodates the laminated substrate 111$v$ for V phase provided in the semiconductor module 1, and a storage unit 11$w$ which accommodates the laminated substrate 111$w$ for W phase provided in the semiconductor module 1.

The case 10 is arranged so as to surround semiconductor chips 21$au$ to 21$du$, 21$av$ to 21$dv$, and 21$aw$ to 21$dw$ (details will be described later), laminated substrates 111$u$, 111$v$, and 111$w$, a plurality of terminals (not illustrated), and a plurality of bonding wires (not illustrated and details will be described later) inside the case 10. The case 10 is mounted on a heat dissipation base or a cooling unit (both not illustrated) and is mechanically fixed to the heat dissipation base or cooling unit by a case joining material (not illustrated). The semiconductor chips 21$au$ to 21$du$ are arranged on the laminated substrate 111$u$, the semiconductor chips 21$av$ to 21$dv$ are arranged on the laminated substrate 111$v$, and the semiconductor chips 21$aw$ to 21$dw$ are arranged on the laminated substrate 111$w$. Consequently, the case 10 can release heat generated from the semiconductor chips 21$au$ to 21$du$, 21$av$ to 21$dv$, and 21$aw$ to 21$dw$ to the outside of the case 10.

Although the details will be described later, each of the semiconductor chips 21$au$ to 21$du$ has a voltage-controlled switching element, each of the semiconductor chips 21$av$ to 21$dv$ has a voltage-controlled switching element, and each of the semiconductor chips 21$aw$ to 21$dw$ has a voltage-controlled switching element. Therefore, the semiconductor module 1 includes the laminated substrates (an example of substrates) 111$u$, 11$v$, and 111$w$ in which a plurality of voltage-controlled switching elements are arranged.

The semiconductor module 1 has a U-phase positive electrode terminal Pu connected to the positive electrode side of DC power. Further, the semiconductor module 1 includes a U-phase negative electrode terminal Nu arranged next to the positive electrode terminal Pu and connected to the negative electrode side of the DC power. The positive electrode terminal Pu and the negative electrode terminal Nu are provided on one side of both sides of the storage unit 11$u$ and at one end on the longitudinal side of the case 10. Further, the semiconductor module 1 is provided with an output terminal Ou from which U-phase AC power is output. The output terminal Ou is provided on the other side of both sides of the storage unit 11$u$ and at the other end on the longitudinal side of the case 10. The positive electrode terminal Pu and the negative electrode terminal Nu are arranged so as to face the output terminal Ou with the storage unit 11$u$ interposed therebetween.

The positive electrode terminal Pu is connected to a predetermined wiring pattern (not illustrated) formed on the laminated substrate 111$u$. The negative electrode terminal Nu is connected to a predetermined wiring pattern (not illustrated) formed on the laminated substrate 111$u$. The semiconductor chip 21$au$ and the semiconductor chip 21$bu$ are connected in parallel by a predetermined wiring pattern (not illustrated) formed on the laminated substrate 111$u$. The output terminal Ou is connected to a predetermined wiring pattern (not illustrated) formed on the laminated substrate 111*u*. The semiconductor chip 21*cu* and the semiconductor chip 21*du* are connected in parallel by a predetermined wiring pattern 112*lou* (not illustrated in FIG. 1, and see FIG. 5) formed on the laminated substrate 111*u*. The semiconductor chips 21*au* and 21*bu* connected in parallel and the semiconductor chips 21*cu* and 21*du* connected in parallel are connected in series between the positive electrode terminal Pu and the negative electrode terminal Nu by a predetermined wiring pattern formed on the laminated substrate 111*u*. Connection portions between the semiconductor chips 21*au* and 21*bu* connected in parallel and the semiconductor chips 21*cu* and 21*du* connected in parallel are connected to the output terminal Ou from which U-phase AC power is output. The semiconductor chips 21*au* and 21*bu* form an upper arm of the U-phase AC power, and the semiconductor chips 21*cu* and 21*du* form a lower arm of the U-phase AC power. In this way, a U-phase inverter circuit which generates U-phase AC power from the DC power supplied from the positive electrode terminal Pu and the negative electrode terminal Nu is configured by the semiconductor chips 21*au* and 21*bu* and the semiconductor chips 21*cu* and 21*du* mounted on the laminated substrate 111*u*.

A terminal group 25*upu* is arranged in a vicinity of a peripheral end portion of the laminated substrate 111*u*. The laminated substrate 111*u* is formed with a resistance adjustment unit 23*upu* and a relay pattern 24*upu* arranged between the semiconductor chip 21*au* and the semiconductor chip 21*bu*. The terminal group 25*upu* has, for example, a plurality of (six in this embodiment) terminals (details will be described later) formed in a rectangular shape by a conductive material. Each terminal of the terminal group 25*upu* is input with various signals when controlling the switching of the voltage-controlled switching element (details will be described later) provided in each of the semiconductor chips 21*au* and 21*bu* via an external terminal (details will be described later), and determining a failure in the voltage-controlled switching element. Therefore, some terminals of the terminal group 25*upu* are connected to the semiconductor chip 21*au* by, for example, bonding wires (not illustrated), some other terminals of the terminal group 25*upu* are connected to the resistance adjustment unit 23*upu*, and the remaining terminals of the terminal group 25*upu* are connected to the relay pattern 24*upu*. The resistance adjustment unit 23*upu* and the relay pattern 24*upu* are connected to the semiconductor chips 21*au* and 21*bu* by, for example, bonding wires (not illustrated). The details of a connection configuration of the terminal group 25*upu*, the semiconductor chips 21*au* and 21*bu*, the resistance adjustment unit 23*upu*, and the relay pattern 24*upu* will be described later.

The semiconductor module 1 has external terminals Gbupu, Aupu, Kupu, Supu, Gaupu, and Eupu provided in the case 10. The external terminals Gbupu, Aupu, Kupu, Supu, Gaupu, and Eupu are provided on the semiconductor module 1 on the outside of the case 10 and connected to various circuits (details will be described later). Further, the external terminals Gbupu, Aupu, Kupu, Supu, Gaupu, and Eupu are connected to any of the plurality of terminals provided in the terminal group 25*upu* in a one-to-one relationship. Consequently, the semiconductor chips 21*au* and 21*bu* and the various circuits can transmit and receive predetermined signals via the external terminals Gbupu, Aupu, Kupu, Supu, Gaupu, and Eupu and the terminal group 25*upu*. Thus, the semiconductor module 1 can control the switching of the voltage-controlled switching elements provided in each of the semiconductor chips 21*au* and 21*bu*, and determine whether or not a failure has occurred in these voltage-controlled switching elements.

A terminal group 25*lou* is arranged in a vicinity of the peripheral end portion of the laminated substrate 111*u*. The laminated substrate 111*u* is formed with a resistance adjustment unit 23*lou* and a relay pattern 24*lou* arranged between the semiconductor chip 21*cu* and the semiconductor chip 21*du*. The terminal group 25*lou* has, for example, a plurality of (six in this embodiment) terminals (details will be described later) formed in a rectangular shape by a conductive material. Each terminal of the terminal group 25*lou* is input with various signals when controlling the switching of the voltage-controlled switching element (details will be described later) provided in each of the semiconductor chips 21*cu* and 21*du*, and determining a failure in the voltage-controlled switching element. Therefore, some terminals of the terminal group 25*lou* are connected to the semiconductor chip 21*cu* by, for example, bonding wires (not illustrated), some other terminals of the terminal group 25*lou* are connected to the resistance adjustment unit 23*lou*, and the remaining terminals of the terminal group 25*lou* are connected to the relay pattern 24*lou*. The resistance adjustment unit 23*lou* and the relay pattern 24*lou* are connected to the semiconductor chips 21*cu* and 21*du* by, for example, bonding wires (not illustrated). The details of a connection configuration of the terminal group 25*lou*, the semiconductor chips 21*cu* and 21*du*, the resistance adjustment unit 23*lou*, and the relay pattern 24*lou* will be described later.

The semiconductor module 1 has external terminals Gblou, Alou, Klou, Slou, Galou, and Elou provided in the case 10. The external terminals Gblou, Alou, Klou, Slou, Galou, and Elou are provided on the semiconductor module 1 on the outside of the case 10 and connected to various circuits (details will be described later). Further, the external terminals Gblou, Alou, Klou, Slou, Galou, and Elou are connected to any of the plurality of terminals provided in the terminal group 25*lou* in a one-to-one relationship. Consequently, the semiconductor chips 21*cu* and 21*du* and the various circuits can transmit and receive predetermined signals via the external terminals Gblou, Alou, Klou, Slou, Galou, and Elou and the terminal group 25*lou*. Thus, the semiconductor module 1 can control the switching of the voltage-controlled switching elements provided in each of the semiconductor chips 21*cu* and 21*du*, and determine whether or not a failure has occurred in these voltage-controlled switching elements.

Figure 2:
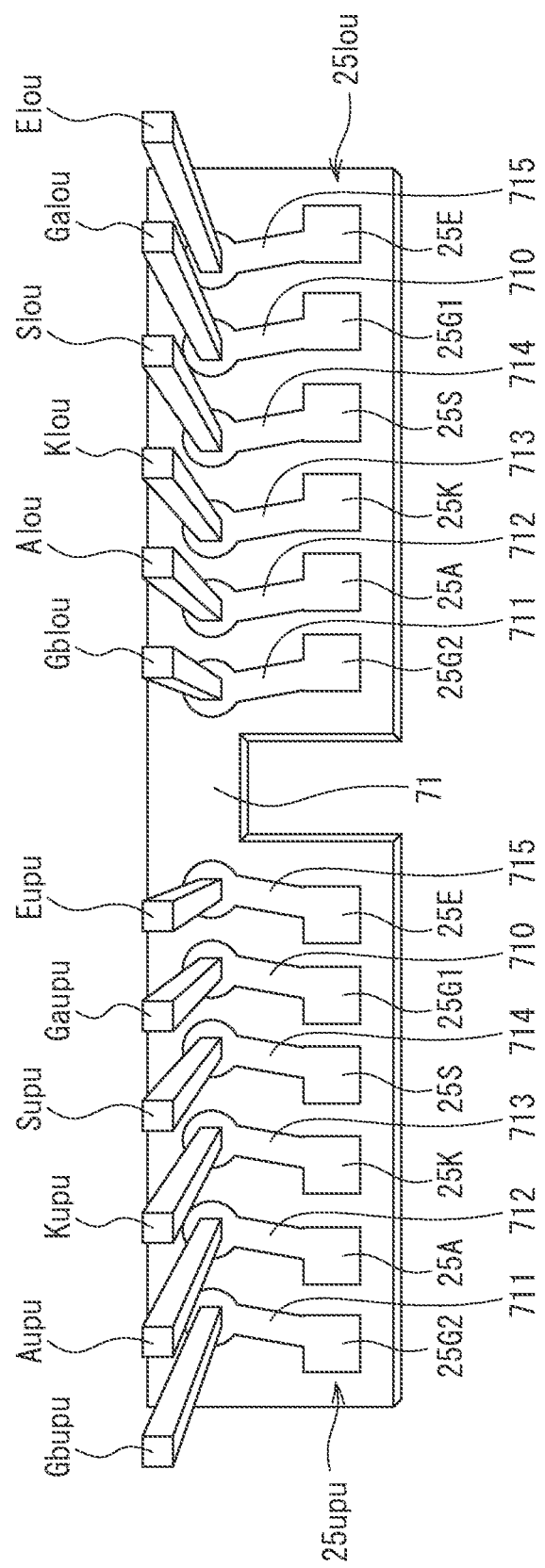
FIG. 2 is a diagram schematically illustrating a schematic configuration of external terminals and terminal groups provided in the semiconductor module according to the first embodiment of the present invention.
Figure 3A:
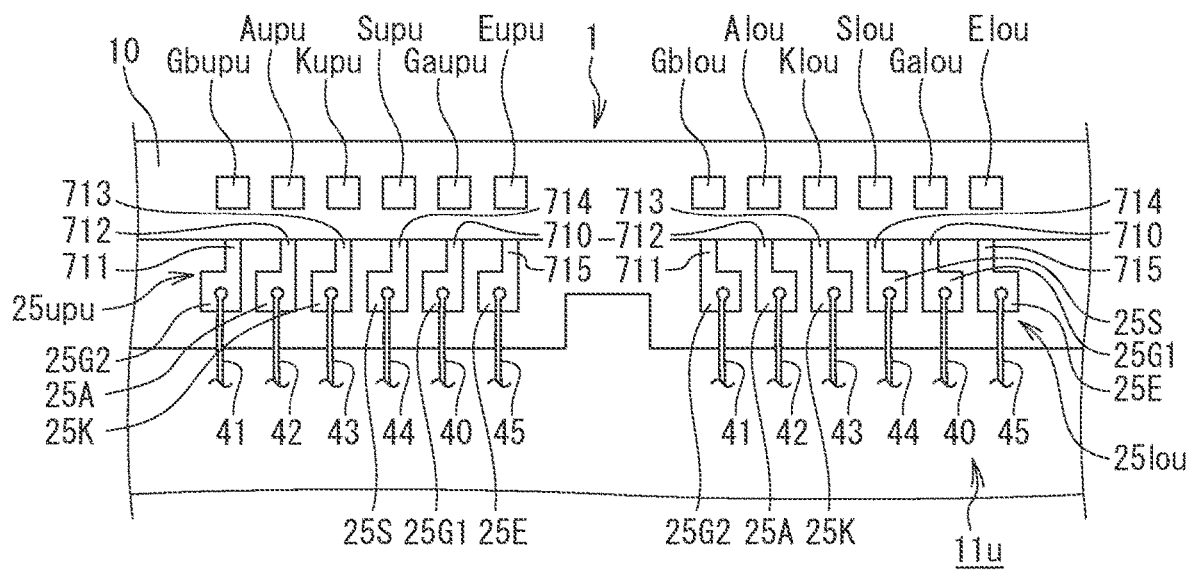
FIGS. 3A and 3B are diagrams schematically illustrating a state in which the external terminals and the terminal groups provided in the semiconductor module according to the first embodiment of the present invention are mounted to a case.
Figure 3B:
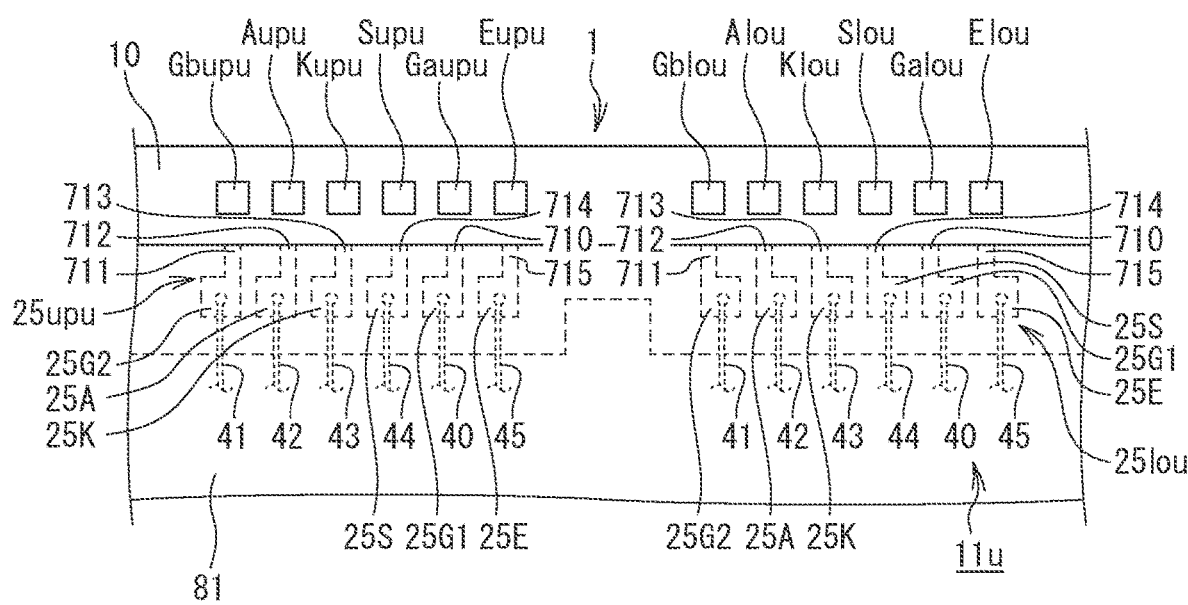

Here, description will be made about a schematic configuration of the external terminal Gaupu and the like and the terminal groups 25*upu* and 25*lou* provided in the semiconductor module 1 with reference to FIGS. 2 to 4B. FIG. 2 is a perspective view schematically illustrating an example of a schematic configuration of the external terminal Gaupu and the like, the terminal groups 25*upu* and 25*lou*, and a printed circuit board 71 provided with these, which are provided in the semiconductor module 1. FIGS. 3A and 3B are diagrams schematically illustrating a state of the printed circuit board 71 integrated with the case 10. FIG. 3A illustrates a state in which a mold resin 81 is not formed in the storage unit 11*u*, and FIG. 3B illustrates a state in which the mold resin 81 is formed in the storage unit 11*u*.

As illustrated in FIG. 2, the external terminals Gaupu, Gbupu, Aupu, Kupu, Supu, and Eupu, the external terminals Galou, Gblou, Alou, Klou, Slou, and Elou, the terminal group 25*upu*, and the terminal group 25*lou* are arranged on the printed circuit board 71, for example. The external terminals Gaupu, Gbupu, Aupu, Kupu, Supu, and Eupu, and the external terminals Galou, Gblou, Alou, Klou, Slou, and Elou are fixed to the printed circuit board 71 by press fitting or soldering or the like. Although the details will be described later, the terminal group 25upu and the terminal group 25lou have a first gate signal input terminal 25G1, a second gate signal input terminal 25G2, an anode side temperature detection terminal 25A, a cathode side temperature detection terminal 25K, a current detection terminal 25S, and an emitter connection terminal 25E, respectively. The first gate signal input terminal 25G1, the second gate signal input terminal 25G2, the anode side temperature detection terminal 25A, the cathode side temperature detection terminal 25K, the current detection terminal 25S, and the emitter connection terminal 25E are formed on the printed circuit board 71.

A wiring portion 710 which electrically connects the external terminal Gaupu and the first gate signal input terminal 25G1, and a wiring portion 711 which electrically connects the external terminal Gbupu and the second gate signal input terminal 25G2 are formed on the printed circuit board 71. A wiring portion 712 which electrically connects the external terminal Aupu and the anode side temperature detection terminal 25A, and a wiring portion 713 which electrically connects the external terminal Kupu and the cathode side temperature detection terminal 25K are formed on the printed circuit board 71. A wiring portion 714 which electrically connects the external terminal Supu and the current detection terminal 25S, and a wiring portion 715 which electrically connects the external terminal Eupu and the emitter connection terminal 25E are formed on the printed circuit board 71.

A wiring portion 710 which electrically connects the external terminal Galou and the first gate signal input terminal 25G1, and a wiring portion 711 which electrically connects the external terminal Gblou and the second gate signal input terminal 25G2 are formed on the printed circuit board 71. A wiring portion 712 which electrically connects the external terminal Alou and the anode side temperature detection terminal 25A, and a wiring portion 713 which electrically connects the external terminal Klou and the cathode side temperature detection terminal 25K are formed on the printed circuit board 71. A wiring portion 714 which electrically connects the external terminal Slou and the current detection terminal 25S, and a wiring portion 715 which electrically connects the external terminal Elou and the emitter connection terminal 25E are formed on the printed circuit board 71.

The printed circuit board 71 is attached to the case 10 and integrally formed with the case 10. It is desirable that the external terminal Gaupu and the external terminal Gbupu to each of which the gate signal is input have the same shape. Further, it is desirable that the first gate signal input terminal 25G1 and the second gate signal input terminal 25G2 have the same shape. In addition, it is desirable that the wiring portion 710 and the wiring portion 711 have the same width and the same length. The printed circuit board 71 is integrally formed with the case 10. It is desirable that the external terminal Galou and the external terminal Gblou to each of which the gate signal is input have the same shape. Further, it is desirable that the first gate signal input terminal 25G1 and the second gate signal input terminal 25G2 have the same shape. In addition, it is desirable that the wiring portion 710 and the wiring portion 711 have the same width and the same length.

As illustrated in FIG. 3A, when the mold resin 81 (not illustrated in FIG. 3A) is not formed in the storage unit 11u, the first gate signal input terminal 25G1, the second gate signal input terminal 25G2, the anode side temperature detection terminal 25A, the cathode side temperature detection terminal 25K, the current detection terminal 25S, and the emitter connection terminal 25E, and a part of each of the wiring portions 710, 711, 712, 713, 714, and 715 provided in each of the terminal group 25upu and the terminal group 25lou are exposed to the storage unit 11u. Further, in this case, the bonding wires 40, 41, 42, 43, 44, and 45 (details will be described later) connected to the first gate signal input terminal 25G1, the second gate signal input terminal 25G2, the anode side temperature detection terminal 25A, the cathode side temperature detection terminal 25K, the current detection terminal 25S, and the emitter connection terminal 25E are exposed to the storage unit 11u.

As illustrated in FIG. 3B, when the mold resin 81 is formed in the storage unit 11u, the first gate signal input terminal 25G1, the second gate signal input terminal 25G2, the anode side temperature detection terminal 25A, the cathode side temperature detection terminal 25K, the current detection terminal 25S, and the emitter connection terminal 25E provided in each of the terminal group 25upu and the terminal group 25lou, and the wiring portions 710, 711, 712, 713, 714, and 715 are covered with the mold resin 81 and are not exposed. On the other hand, as illustrated in FIGS. 3A and 3B, the external terminals Gaupu, Gbupu, Aupu, Kupu, Supu, and Eupu, and the external terminals Galou, Gblou, Alou, Klou, Slou, and Elou are exposed to the outside regardless of whether or not the mold resin 81 is formed in the storage unit 11u. Therefore, although the details will be described later, by using the external terminals Gaupu, Gbupu, Galou, and Gblou, it is possible to determine the presence or absence of failure of the semiconductor chips 21au to 21du without disassembling the semiconductor module 1.

Next, another configuration example of the external terminals Gaupu, Gbupu, Aupu, Kupu, Supu, and Eupu, the external terminals Galou, Gblou, Alou, Klou, Slou, and Elou, and the terminal groups 25upu and 25lou will be described with reference to FIGS. 4A and 4B. The external terminals Gaupu, Gbupu, Aupu, Kupu, Supu, and Eupu and the external terminals Galou, Gblou, Alou, Klou, Slou, and Elou have the same configuration, and the terminal group 25upu and the terminal group 25lou have the same configuration. Therefore, another configuration example of the external terminals Gaupu, Gbupu, Aupu, Kupu, Supu, and Eupu, the external terminals Galou, Gblou, Alou, Klou, Slou, and Elou, and the terminal groups 25upu and 25lou will be described by taking for example, the external terminals Galou, Gblou, Alou, Klou, Slou, and Elou, and the terminal group 25lou.

Figure 4A:
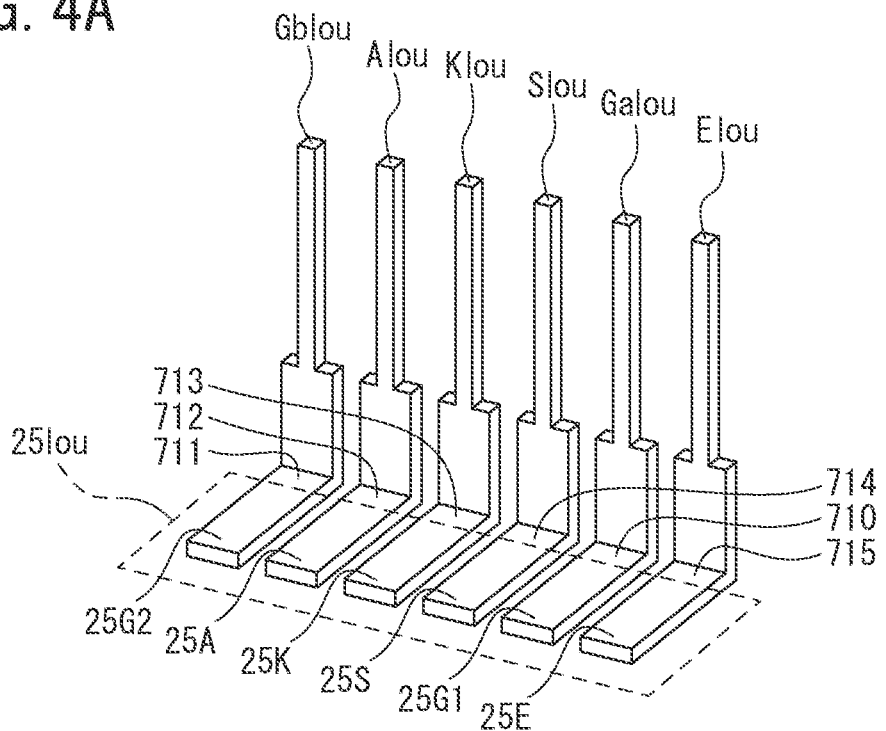
FIGS. 4A and 4B are diagrams schematically illustrating another schematic configuration of the external terminals and the terminal groups provided in the semiconductor module according to the first embodiment of the present invention.
Figure 4B:
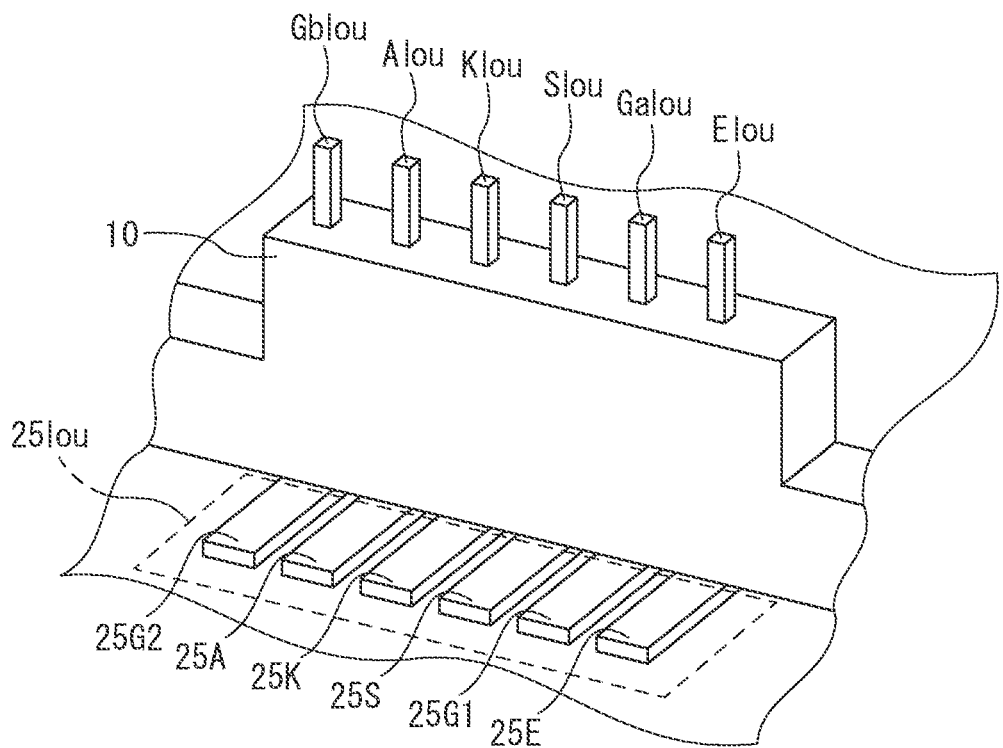

FIGS. 4A and 4B are diagrams schematically illustrating another schematic configuration of the external terminals Galou, Gblou, Alou, Klou, Slou, and Elou and the terminal group 25lou provided in the semiconductor module 1. FIG. 4A is a diagram schematically illustrating another configuration example of the external terminals Galou, Gblou, Alou, Klou, Slou, and Elou and the terminal group 25lou. FIG. 4B is a diagram schematically illustrating a state in which the external terminals Galou, Gblou, Alou, Klou, Slou, and Elou and the terminal group 25lou are mounted to the case 10.

As illustrated in FIG. 4A, in another configuration example, the terminal group 25lou is formed integrally with the external terminals Galou, Gblou, Alou, Klou, Slou, and Elou so as to function as an external lead-out terminal. Specifically, the first gate signal input terminal 25G1, the wiring portion 710, and the external terminal Galou are integrally formed. Thus, the first gate signal input terminal 25G1 is electrically connected to the external terminal Galou via the wiring portion 710. The second gate signal input terminal 25G2, the wiring portion 711, and the external terminal Gblou are integrally formed. Consequently, the second gate signal input terminal 25G2 is electrically connected to the external terminal Gblou via the wiring portion 711. The anode side temperature detection terminal 25A, the wiring portion 712, and the external terminal Alou are integrally formed. Consequently, the anode side temperature detection terminal 25A is electrically connected to the external terminal Alou via the wiring portion 711.

The cathode side temperature detection terminal 25K, the wiring portion 713, and the external terminal Klou are integrally formed. Consequently, the cathode side temperature detection terminal 25K is electrically connected to the external terminal Klou via the wiring portion 713. The current detection terminal 25S, the wiring portion 714, and the external terminal Slou are integrally formed.

Consequently, the current detection terminal 25S is electrically connected to the external terminal Slou via the wiring portion 714. The emitter connection terminal 25E, the wiring portion 715, and the external terminal Elou are integrally formed. Consequently, the emitter connection terminal 25E is electrically connected to the external terminal Elou via the wiring portion 715.

It is desirable that the first gate signal input terminal 25G1, the wiring unit 710 and the external terminal Galou, and the second gate signal input terminal 25G2, the wiring unit 711 and the external terminal Gblou, which are input with the gate signal have the same shape.

As illustrated in FIG. 4B, a part of each of the external terminals Galou, Gblou, Alou, Klou, Slou, and Elou and the terminal group 25lou in another configuration example are exposed from the case 10, and the wiring portions 710 to 715 are arranged in the case 10. The external terminals Galou, Gblou, Alou, Klou, Slou, and Elou, the terminal group 25lou, and the wiring portions 710 to 715 are installed in a mold for forming the case 10 and are integrated with the case 10 together with the formation of the case 10.

Returning to FIG. 1, the laminated substrate 11v has the same configuration as the laminated substrate 111u when the semiconductor chip 21au is read as the semiconductor chip 21av, the semiconductor chip 21bu is read as the semiconductor chip 21bv, the resistance adjustment unit 23upu is read as the resistance adjustment unit 23upv, the relay pattern 24upu is read as the relay pattern 24upv, the terminal group 25upu is read as the terminal group 25upv, the semiconductor chip 21cu is read as the semiconductor chip 21cv, the semiconductor chip 21du is read as the semiconductor chip 21dv, the resistance adjustment unit 23lou is read as the resistance adjustment unit 23lov, and the relay pattern 24lou is read as the relay pattern 24lov.

The semiconductor module1 has external terminals Gbupv, Aupv, Kupv, Supv, Gaupv, and Eupv provided in the case 10 with respect to the storage portion 11v at the same relative positions as the relative positions of the external terminals Gbupu, Aupu, Kupu, Supu, Gaupu, and Eupu relative to the storage unit 11u. The external terminals Gbupv, Aupv, Kupv, Supv, Gaupv, and Eupv have the same structure as the external terminals Gbupu, Aupu, Kupu, Supu, Gaupu, and Eupu and exhibit the same functions.

Further, the semiconductor module 1 has a terminal group 25upv provided in the case 10 with respect to the storage unit 11v at the same relative position as the relative position of the terminal group 25upu relative to the storage unit 11u. The terminal group 25upv has the same structure as the terminal group 25upu and exhibits the same function.

The semiconductor module1 has external terminals Gblov, Alov, Klov, Slov, Galov, and Elov provided in the case 10 with respect to the storage unit 11v at the same relative positions as the relative positions of the external terminals Gblou, Alou, Klou, Slou, Galou, and Elou relative to the storage unit 11u. The external terminals Gblov, Alov, Klov, Slov, Galov, and Elov have the same structure as the external terminals Gblou, Alou, Klou, Slou, Galou, and Elou, and exhibit the same functions as the external terminals Gblou as the external terminals Gblou, Alou, Klou, Slou, Galou, and Elou.

Further, the semiconductor module 1 has a terminal group 25lov provided in the case 10 with respect to the storage unit 11v at the same relative position as the relative position of the terminal group 25lou relative to the storage unit 11u. The terminal group 25lov has the same structure as the terminal group 25lou and exhibits the same function as the terminal group 25lou.

Therefore, the semiconductor chips 21av and 21bv form an upper arm of V-phase AC power, and the semiconductor chips 21cv and 21dv form a lower arm of the V-phase AC power. In this way, a V-phase inverter circuit which generates V-phase AC power from DC power supplied from a positive electrode terminal Pv and a negative electrode terminal Nv is configured by the semiconductor chips 21av and 21bv and the semiconductor chips 21cv and 21dv mounted on the laminated substrate 111v. Further, the semiconductor module 1 can control the switching of the voltage-controlled switching elements provided in each of the semiconductor chips 21av and 21bv and determine the presence or absence of the occurrence of failure of these voltage-controlled switching elements. In addition, the semiconductor module 1 can control the switching of the voltage-controlled switching elements provided in each of the semiconductor chips 21cv and 21dv and determine the presence or absence of the occurrence of failure of these voltage-controlled switching elements.

The laminated substrate 111w has the same configuration as the laminated substrate 111u when the semiconductor chip 21au is read as the semiconductor chip 21aw, the semiconductor chip 21bu is read as the semiconductor chip 21bw, the resistance adjustment unit 23upu is read as the resistance adjustment unit 23upw, the relay pattern 24upu is read as the relay pattern 24upw, the terminal group 25upu is read as the terminal group 25upw, the semiconductor chip 21cu is read as the semiconductor chip 21cw, the semiconductor chip 21du is read as the semiconductor chip 21dw, the resistance adjustment unit 23lou is read as the resistance adjustment unit 23low, and the relay pattern 24lou is read as the relay pattern 24low.

The semiconductor module1 has external terminals Gbupw, Aupw, Kupw, Supw, Gaupw, and Eupw provided in the case 10 with respect to the storage unit 11w at the same relative positions as the relative positions of the external terminals Gbupu, Aupu, Kupu, Supu, Gaupu, and Eupu relative to the storage unit 11u. The external terminals Gbupw, Aupw, Kupw, Supw, Gaupw, and Eupw have the same structure as the external terminals Gbupu, Aupu, Kupu, Supu, Gaupu, and Eupu and exhibit the same functions as the external terminals Gbupu, Aupu, Kupu, Supu, Gaupu.

Further, the semiconductor module 1 has a terminal group 25upw provided in the case 10 with respect to the storage unit 11w at the same relative position as the relative position of the terminal group 25upu relative to the storage unit 11u.

The terminal group 25*upw* has the same structure as the terminal group 25*upu* and exhibits the same function as the terminal group 25*upu*.

The semiconductor module1 has external terminals Gblow, Alow, Klow, Slow, Galow, and Elow provided in the case 10 with respect to the storage unit 11*w* at the same relative positions as the relative positions of the external terminals Gblou, Alou, Klou, Slou, Galou, and Elou relative to the storage unit 11*u*. The external terminals Gblow, Alow, Klow, Slow, Galow, and Elow have the same structure as the external terminals Gblou, Alou, Klou, Slou, Galou, and Elou and exhibit the same functions.

Further, the semiconductor module 1 has a terminal group 25*low* provided in the case 10 with respect to the storage unit 11*w* at the same relative position as the relative position of the terminal group 25*lou* relative to the storage unit 11*u*. The terminal group 25*low* has the same structure as the terminal group 25*lou* and exhibits the same function.

Therefore, the semiconductor chips 21*aw* and 21*bw* form an upper arm of W-phase AC power, and the semiconductor chips 21*cw* and 21*dw* form a lower arm of the W-phase AC power. In this way, a W-phase inverter circuit which generates W-phase AC power from DC power supplied from a positive electrode terminal Pw and a negative electrode terminal Nw is configured by the semiconductor chips 21*aw* and 21*bw* and the semiconductor chips 21*cw* and 21*dw* mounted on the laminated substrate 111*w*. Further, the semiconductor module 1 can control the switching of the voltage-controlled switching elements provided in each of the semiconductor chips 21*aw* and 21*bw* and determine the presence or absence of the occurrence of failure of these voltage-controlled switching elements. In addition, the semiconductor module 1 can control the switching of the voltage-controlled switching elements provided in each of the semiconductor chips 21*cw* and 21*dw* and determine the presence or absence of the occurrence of failure of these voltage-controlled switching elements.

(Configuration of Semiconductor Chip)

Figure 5:
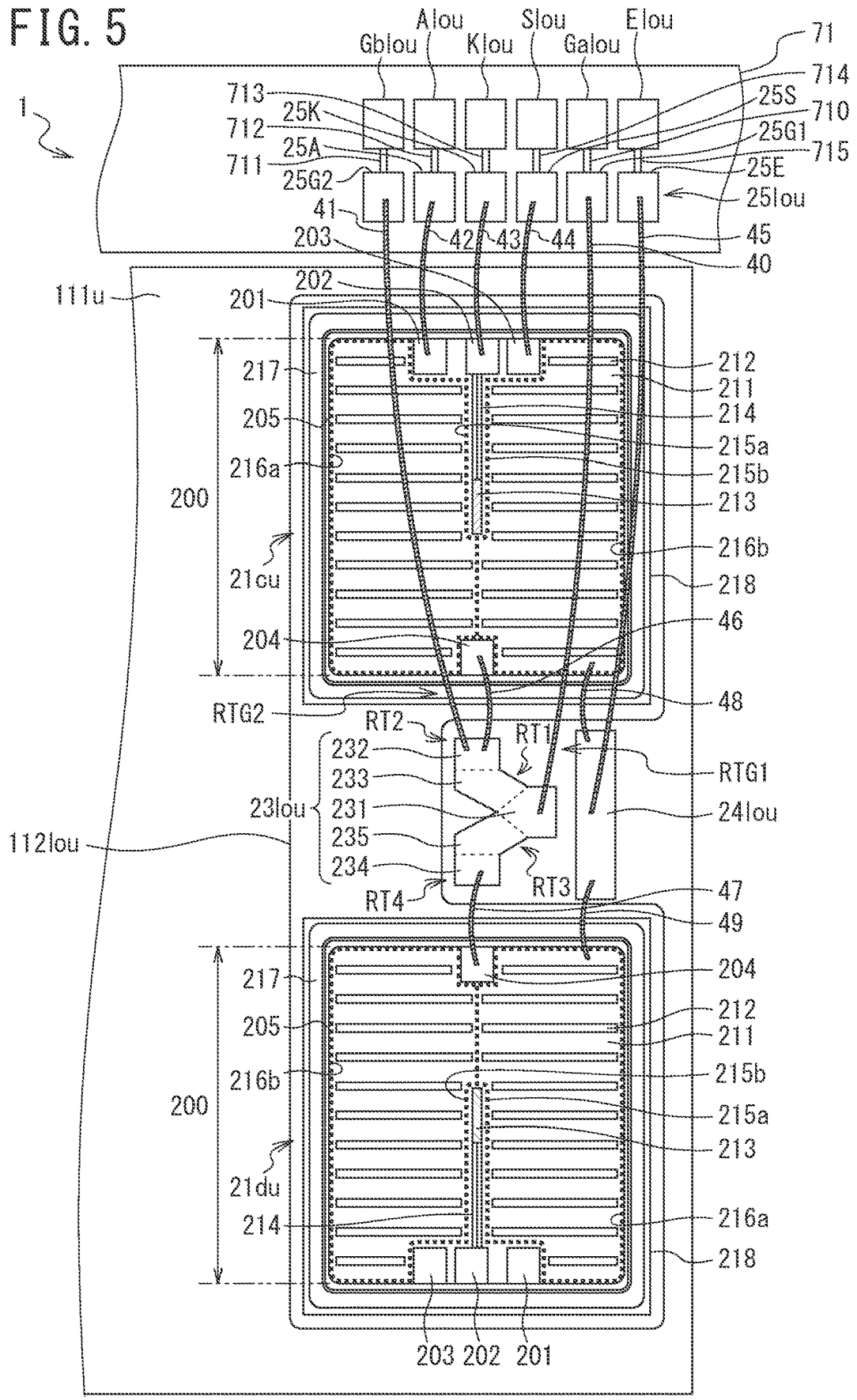
FIG. 5 is a plan view schematically illustrating a schematic configuration of semiconductor chips provided in the semiconductor module according to the first embodiment of the present invention.
Figure 6:
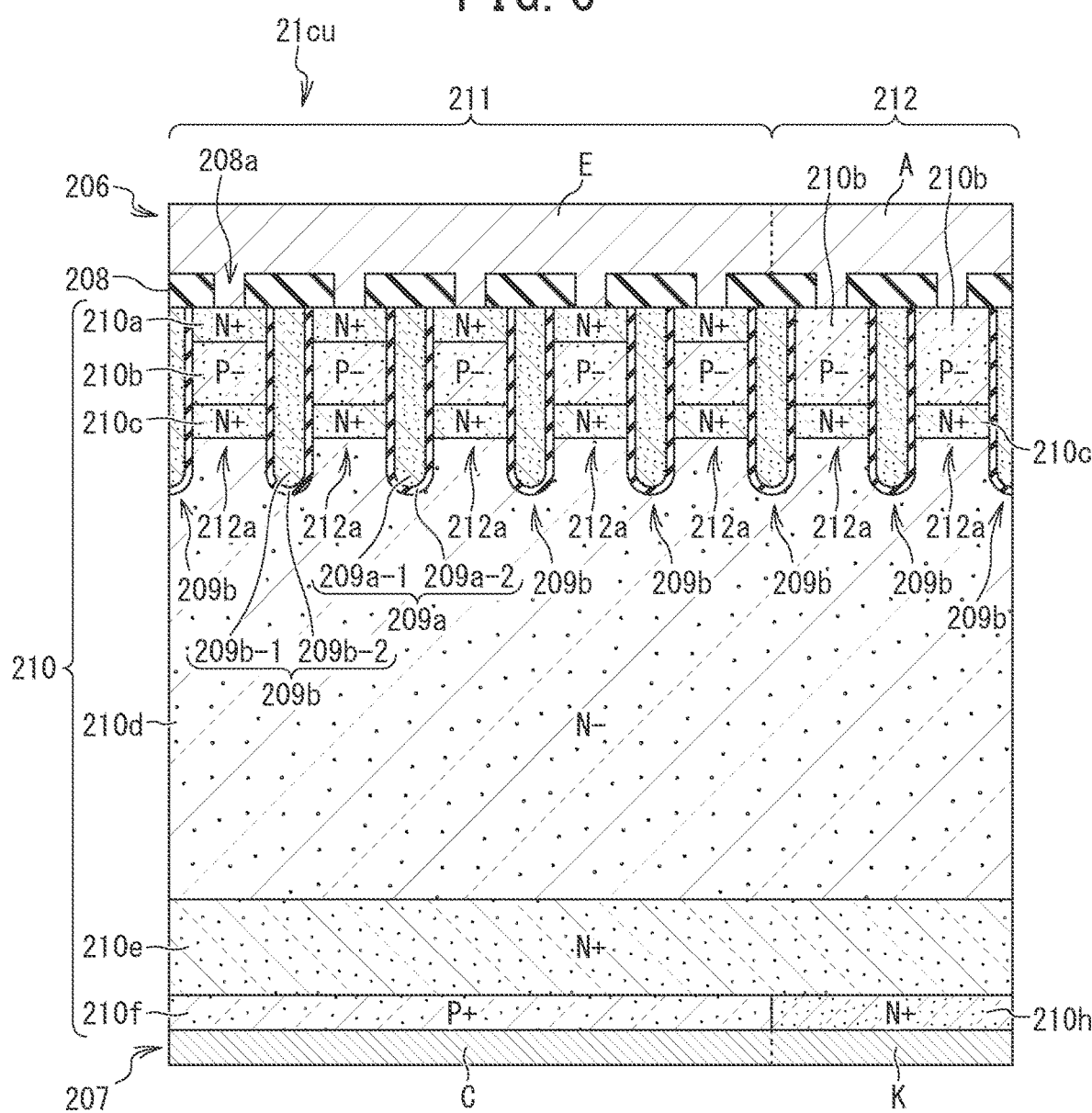
FIG. 6 is a cross-sectional view schematically illustrating the schematic configuration of the semiconductor chip provided in the semiconductor module according to the first embodiment of the present invention.
Figure 7:
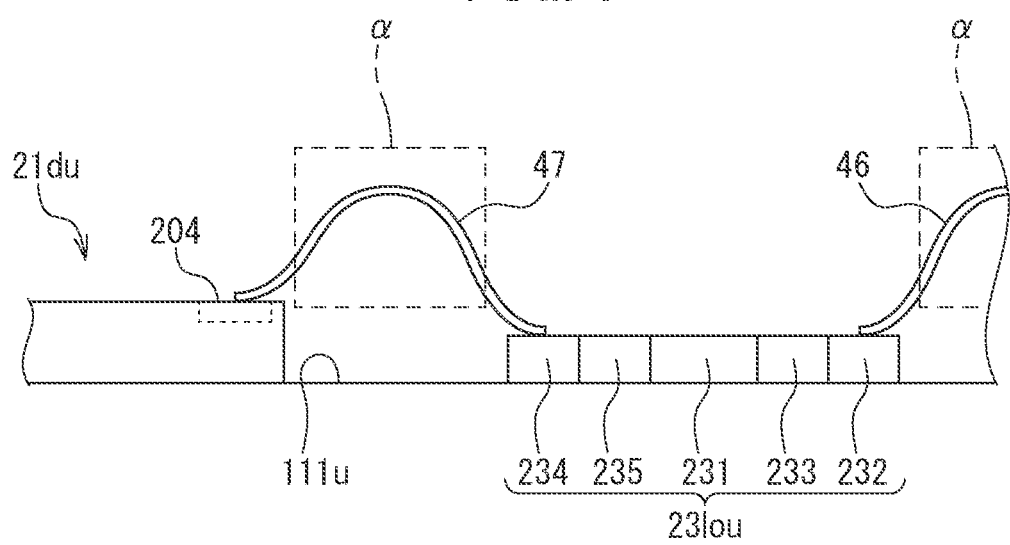
FIG. 7 is a diagram for explaining a loop of a bonding wire connecting between the semiconductor chip and a resistance adjustment unit provided in the semiconductor module according to the first embodiment of the present invention.

The configurations of the semiconductor chips 21*au* to 21*du*, 21*av* to 21*dv*, and 21*aw* to 21*dw* will be described with reference to FIGS. 5 to 7. The semiconductor chips 21*au* to 21*du*, 21*av* to 21*dv*, and 21*aw* to 21*dw* have similar configurations to each other. Therefore, the configurations of the semiconductor chips 21*au* to 21*du*, 21*av* to 21*dv*, and 21*aw* to 21*dw* will be described by taking the semiconductor chip 21*cu* as an example. FIG. 5 is a diagram schematically illustrating a plane of the laminated substrate 111*u* illustrating in an enlarged form, a portion where semiconductor chips 21*cu* and 21*du* are mounted. FIG. 6 is a diagram schematically illustrating a partial cross section of the semiconductor chip 21*cu* (a cross section of a part of a transistor portion 211 and a diode portion 212 adjacent to each other). FIG. 7 is a diagram for explaining a loop of the bonding wire 47 connecting between the semiconductor chip 21*du* and the resistance adjustment unit 23*lou* provided in the semiconductor module 1.

As illustrated in FIG. 5, the semiconductor chip 21*cu* has an active section 200 and an edge termination structure portion 217. The active section 200 is a region in which a current flows inside the semiconductor substrate 210 from the upper surface to the lower surface of the semiconductor substrate 210 (not illustrated in FIG. 5, and see FIG. 6) or from the lower surface to the upper surface thereof in the depth direction.

The active section 200 is provided with the transistor portions 211 and the diode portions 212 alternately. The transistor portion 211 and the diode portion 212 are provided alternately in the active section 200, for example.

An anode pad 201, a cathode pad 202, a sense pad 203, and a gate pad 204 made of a conductive material (for example, aluminum) are provided above the upper surface of the semiconductor substrate 210. The anode pad 201, the cathode pad 202, and the sense pad 203 are arranged on one end side of the periphery of the semiconductor chip 21*cu*, and the gate pad 204 is arranged on the other end side of the periphery facing the one end side with the active section 200 interposed therebetween. The sense pad 203 is connected to a current detection element 21S (not illustrated in FIG. 5, and details will be described later) formed on the semiconductor substrate 210. The gate pad 204 is connected to a gate conductive portion 209*a*-1 (not illustrated in FIG. 5 and details will be described later) of the transistor portion 211. The cathode pad 202 and the anode pad 201 are connected to a temperature detection element 213 (details will be described later).

The semiconductor chip 21*cu* has a gate runner 205 which transmits a drive voltage (gate voltage) based on the gate signal to the transistor portion 211. The gate runner 205 is made of a conductive material such as polysilicon to which, for example, impurities have been added, and is connected to the gate pad 204.

As illustrated in FIG. 5, the semiconductor chip 21*cu* has a gate runner 216*a* formed from the anode pad 201 to the gate pad 204 along the gate runner 205. Further, the semiconductor chip 21*cu* has a gate runner 216*b* formed from the sense pad 203 to the gate pad 204 along the gate runner 205. The gate runner 216*a* and the gate runner 216*b* are made above the active section 200, for example, on an interlayer insulating film 208 (not illustrated in FIG. 5, and see FIG. 6). The gate runner 216*a* and the gate runner 216*b* are formed of a conductive material such as polysilicon to which, for example, impurities have been added. A part of the gate runner 216*a* is in contact with a part of the gate runner 205 through a contact hole formed in the interlayer insulating film 208. A part of the gate runner 216*b* is in contact with a part of the gate runner 205 through a contact hole formed in the interlayer insulating film 208. Consequently, the gate runner 205, the gate runner 216*a*, and the gate runner 216*b* are electrically connected to each other.

As illustrated in FIG. 5, the semiconductor chip 21*cu* has a gate runner 215*a* connected to one end and the other end of the gate runner 216*a* along the anode pad 201, a temperature detection wiring 214, the temperature detection element 213, and the gate pad 204. Further, the semiconductor chip 21*cu* has a gate runner 215*b* connected to one end and the other end of the gate runner 216*b* along the sense pad 203, the temperature detection wiring 214, the temperature detection element 213, and the gate pad 204. The gate runner 215*a* and the gate runner 215*b* are formed above the active section 200, for example, on the interlayer insulating film 208 (not illustrated in FIG. 5, and see FIG. 6). The gate runner 215*a* and the gate runner 215*b* are made of a conductive material such as polysilicon to which, for example, impurities have been added. The gate runner 215*a* and the gate runner 215*b* share one wiring portion at a region between the temperature detection element 213 and the gate pad 204. By arranging the gate runners 215*a* and 215*b* above the active section 200, a gate voltage small in delay and attenuation can be applied to a region away from the gate runner 205 and the gate runners 216*a* and 216*b*.

An insulated gate bipolar transistor (IGBT) 21Q (details will be described later) is configured by apart of a plurality of transistor portions 211 provided in the semiconductor chip 21cu, and a sense transistor is configured by the transistor portion 211 of the remainder (for example, an area of 1/1000 of the IGBT 21Q). Further, a freewheel diode 21D (details will be described later) is configured by a plurality of diode portions 212 provided in the semiconductor chip 21cu.

The edge termination structure portion 217 is provided on the upper surface of the semiconductor substrate 210 between the gate runner 205 and an outer peripheral end 218 of the semiconductor substrate 210. The edge termination structure portion 217 serves to relax electric field concentration on the upper surface side of the semiconductor substrate 210.

The semiconductor chip 21cu has a temperature detection element 213 arranged in, for example, the center of the active section 200, and a temperature detection wiring 214 connecting the temperature detection element 213, the anode pad 201, and the cathode pad 202 in a top view of the semiconductor substrate 210 (that is, when viewed in the depth direction of the semiconductor substrate 210). The temperature detection element 213 is provided above the active section 200. The temperature detection element 213 is configured by, for example, a PN diode made of single crystal silicon or polycrystalline silicon. The temperature detection element 213 detects the temperature corresponding to the heat generation of at least one of the transistor portion 211 and the diode portion 212 based on its own electrical characteristics.

The temperature detection wiring 214 is provided above the active section 200. The temperature detection wiring 214 is made of a semiconductor such as polysilicon to which, for example, impurities have been added. The semiconductor module 1 has the temperature detection element 213 connected to the anode pad 201 and the cathode pad 202. The temperature detection element 213 can detect the temperature of the semiconductor chip 21cu using the voltage or current output from the temperature detection element 213 via the anode pad 201 and the cathode pad 202.

As illustrated in FIG. 6, the semiconductor chip 21cu has the semiconductor substrate 210, the interlayer insulating film 208 formed on the upper surface of the semiconductor substrate 210, an emitter electrode 206 formed on the interlayer insulating film 208, and a collector electrode 207 formed on the lower surface of the semiconductor substrate 210. The interlayer insulating film 208 is made of an insulating material and is formed to cover at least a part of the upper surface of the semiconductor substrate 210. A contact hole 208a is formed in the interlayer insulating film 208. Consequently, the emitter electrode 206 is brought into contact with the upper surface of the semiconductor substrate 210 via the contact hole 208a.

Of the emitter electrode 206, a portion arranged in the region of the transistor portion 211 constituting the IGBT 21Q becomes an emitter terminal E of the IGBT 21Q. Further, of the emitter electrode 206, a portion arranged in the region of the transistor portion 211 constituting the sense transistor becomes a sense terminal S of the current detection element 21S (not illustrated in FIG. 6, and see FIG. 8). The portion of the emitter electrode 206 which serves as the sense terminal S is electrically isolated from the other portion of the emitter electrode 206. In addition, of the emitter electrode 206, a portion arranged in the region of the plurality of diode portions 212 becomes an anode terminal A of the freewheel diode 21D. Incidentally, in FIG. 6, for convenience of explanation, a broken line is added to the emitter electrode 206 to illustrate the boundary between the emitter terminal E and the anode terminal A.

The collector electrode 207 is formed in contact with the entire lower surface of the semiconductor substrate 210, for example. The emitter electrode 206 and the collector electrode 207 are made of, for example, a conductive material such as metal. Of the collector electrode 207, a portion arranged in the region of the transistor portion 211 constituting the IGBT 21Q becomes a collector terminal C of the IGBT 21Q. Further, of the collector electrode 207, a portion arranged in the region of the plurality of diode portions 212 becomes a cathode terminal K of the freewheel diode 21D. Incidentally, in FIG. 6, for convenience of explanation, a broken line is attached to the collector electrode 207 to illustrate the boundary between the collector terminal C and the cathode terminal K.

As illustrated in FIG. 6, a P-type base region 210b is formed on the upper surface side of the semiconductor substrate 210 in the transistor portion 211 and the diode portion 212. Inside the semiconductor substrate 210, an N-type drift region 210d is formed below the base region 210b. Further, a plurality of gate trench portions 209a (only one is illustrated in FIG. 6) and a plurality of dummy trench portions 209b which penetrate the base region 210b and reach the drift region 210d from the upper surface of the semiconductor substrate 210 toward the lower surface of the semiconductor substrate 210 are formed in the semiconductor substrate 210.

A mesa portion 212a which contains the base region 210b and an N+ type storage region 210c formed in the drift region 210d below the base region 210b is formed between the dummy trench portions 209b formed in the diode portion 212 and adjacent to each other. The storage region 210c is a region formed by accumulating impurities at a higher concentration than the drift region 210d.

A mesa portion 212a configured by an N+ type emitter region 210a exposed on the upper surface of the semiconductor substrate 210 and formed in a base region 210b, the base region 210b, and a storage region 210c is formed between the gate trench portion 209a and the dummy trench portion 209b formed in the transistor portion 211 and between the adjacent dummy trench portions 209b.

As illustrated in FIG. 6, in the transistor portion 211, a P+ type collector region 210f is formed in a region adjacent to the lower surface of the semiconductor substrate 210. In the diode portion 212, an N+ type cathode region 210h is formed in a region adjacent to the lower surface of the semiconductor substrate 210. Further, in the semiconductor substrate 210, an N+ type buffer region 210e is formed between the drift region 210d, the collector region 210f, and the cathode region 210h. The impurity concentration of the buffer region 210e is higher than the impurity concentration of the drift region 210d. The buffer region 210e functions as, for example, a field stop layer which prevents a depletion layer extending from the lower surface side of the base region 210b from reaching the collector region 210f and the cathode region 210h.

The gate trench portion 209a has a gate insulating film 209a-2 formed to cover an inner wall of a trench formed by opening the upper surface of the semiconductor substrate 210, and a gate conductive portion 209a-1 formed on the gate insulating film 209a-2 to be embedded in the trench. The gate conductive portion 209a-1 is electrically insulated from the semiconductor substrate 210 by the gate insulating film 209a-2. The gate conductive portion 209a-1 is made of, for example, a conductive material such as polysilicon.

The gate conductive portion 209a-1 has a region facing at least adjacent base regions 210b with the gate insulating film 209a-2 interposed therebetween in the depth direction of the semiconductor substrate 210. The gate trench portion 209a is covered with the interlayer insulating film 208 on the upper surface of the semiconductor substrate 210. Apart of the gate conductive portion 209a-1 is exposed to an opening (not illustrated) formed in the interlayer insulating film 208. The gate conductive portion 209a-1 is connected to the gate runner 205 (see FIG. 5) formed on the interlayer insulating film 208 via the opening. Consequently, when a drive voltage is applied to the gate conductive portion 209a-1 via the gate pad 204 and the gate runner 205, a channel by an inversion layer of electrons is formed on the surface layer of the interface of the base region 210b in contact with the trench in which the gate trench portion 209a is formed.

The dummy trench portion 209b has a dummy insulating film 209b-2 formed to cover an inner wall of a trench formed by opening the upper surface of the semiconductor substrate 210, and a dummy conductive portion 209b-1 formed on the dummy insulating film 209b-2 to be embedded in the trench. The dummy conductive portion 209b-1 is electrically insulated from the semiconductor substrate 210 by the dummy insulating film 209b-2. The dummy conductive portion 209b-1 is made of, for example, a conductive material such as polysilicon.

The dummy conductive portion 209b-1 has the same length as, for example, the gate conductive portion 209a-1 in the depth direction of the semiconductor substrate 210. The dummy trench portion 209b is covered with the interlayer insulating film 208 on the upper surface of the semiconductor substrate 210. The dummy conductive portion 209b-1 is not connected to the gate runner 205.

Since the semiconductor chip 21du has the same configuration as the semiconductor chip 21cu, it has a temperature detection element 213, a temperature detection wiring 214, an anode pad 201, a cathode pad 202, and a sense pad 203. However, in this embodiment, since the temperature detection element 213, the temperature detection wiring 214, the anode pad 201, the cathode pad 202, and the sense pad 203 provided in the semiconductor chip 21du are not used, wirings for connecting to the outside such as bonding wires are not connected.

(Configuration of Connection Route Connecting Voltage-Controlled Switching Element and Signal Input Terminal)

The configuration of the connection route connecting the voltage-controlled switching element and the signal input terminal in the semiconductor module 1 according to this embodiment will be described using FIGS. 5, 7 and 8 while referring to FIGS. 1 to 3B and FIG. 6. The connection route in the semiconductor chips 21au and 21bu, the connection route in the semiconductor chips 21cu and 21du, the connection route in the semiconductor chips 21av and 21bv, the connection route in the semiconductor chips 21cv and 21dv, the connection route in the semiconductor chips 21aw and 21bw, and the connection route in the semiconductor chips 21cw and 21dw have similar configurations to each other. Therefore, the configuration of the connection route connecting the voltage-controlled switching element and the signal input terminal in the semiconductor module 1 according to this embodiment will be described by taking the connection route in the semiconductor chips 21cu and 21du as an example.

As illustrated in FIG. 5, the semiconductor module 1 includes IGBT 21Q (an example of a plurality of voltage-controlled switching elements, and see FIG. 8) provided in each of the semiconductor chip 21cu and the semiconductor chip 21du connected in parallel, switching of which being controlled by a gate voltage (an example of a drive voltage) based on a gate signal (an example of an input signal) Although the details will be described later, the IGBT 21Q provided in the semiconductor chip 21cu and the IGBT 21Q provided in the semiconductor chip 21du are connected to each other in parallel. The semiconductor module 1 includes an external terminal Galou (an example of a first external terminal) and an external terminal Gblou (an example of a second external terminal) to which a gate signal (an example of an input signal) is input. The semiconductor module 1 includes a first connection route group RTG1 having a first connection route RT1 and a third connection route RT3 (an example of a plurality of connection routes) connecting the external terminal Galou and the IGBTs 21Q provided in the semiconductor chips 21cu and 21du respectively. Further, the semiconductor module 1 includes a second connection route group RTG2 having a second connection route RT2 and a fourth connection route RT4 (an example of a plurality of connection routes) connecting the external terminal Gblou and the IGBTs 21Q provided in the semiconductor chips 21cu and 21du respectively.

As illustrated in FIG. 5, the terminal group 25lou has a second gate signal input terminal 25G2, an anode side temperature detection terminal 25A, a cathode side temperature detection terminal 25K, a current detection terminal 25S, a first gate signal input terminal 25G1, and an emitter connection terminal 25E. Incidentally, each of the terminal group 25upu, the terminal group 25upv, the terminal group 25lov, the terminal group 25upw, and the terminal group 25low illustrated in FIG. 1 has the same six terminals as the terminal group 25lou.

One end of the bonding wire 40 is joined to the first gate signal input terminal 25G1. The other end of the bonding wire 40 is joined to the resistance adjustment unit 23lou. Thus, the first gate signal input terminal 25G1 is connected to the resistance adjustment unit 23lou by the bonding wire 40.

One end of the bonding wire 41 is joined to the second gate signal input terminal 25G2. The other end of the bonding wire 41 is joined to the resistance adjustment unit 23lou. Thus, the second gate signal input terminal 25G2 is connected to the resistance adjustment unit 23lou by the bonding wire 41.

One end of the bonding wire 42 is joined to the anode side temperature detection terminal 25A. The other end of the bonding wire 42 is joined to the anode pad 201 of the semiconductor chip 21cu. Thus, the anode side temperature detection terminal 25A is connected to the anode pad 201 by the bonding wire 42.

One end of the bonding wire 43 is joined to the cathode side temperature detection terminal 25K. The other end of the bonding wire 43 is joined to the cathode pad 202 of the semiconductor chip 21cu. Thus, the cathode side temperature detection terminal 25K is connected to the cathode pad 202 by the bonding wire 43.

One end of the bonding wire 44 is joined to the current detection terminal 25S. The other end of the bonding wire 44 is joined to the sense pad 203 of the semiconductor chip 21cu. Thus, the current detection terminal 25S is connected to the sense pad 203 by the bonding wire 44.

One end of the bonding wire 45 is joined to the emitter connection terminal 25E. The other end of the bonding wire 45 is joined to the relay pattern 24lou. Thus, the emitter connection terminal 25E is connected to the relay pattern 24lou by the bonding wire 45.

As illustrated in FIG. 5, the relay pattern 24lou is configured by a conductive pattern formed on the laminated substrate 111u with a conductive material (for example, copper). The relay pattern 24lou has, for example, a rectangular shape in a plan view. The relay pattern 24*lou* is arranged between the semiconductor chip 21*cu* and the semiconductor chip 21*du*. The relay pattern 24*lou* is arranged so that its long side runs along the direction in which the semiconductor chip 21*cu* and the semiconductor chip 21*du* are lined up. For example, the relay pattern 24*lou* is arranged between the semiconductor chip 21*cu* and the semiconductor chip 21*du* so that the distance from one end in the longitudinal direction to the semiconductor chip 21*cu* and the distance from the other end in the longitudinal direction to the semiconductor chip 21*du* become almost equal.

The other end of the bonding wire 45 is joined to the substantially central portion of the relay pattern 24*lou*. One end of a bonding wire 48 is joined to the end of the relay pattern 24*lou* on the semiconductor chip 21*cu* side. The other end of the bonding wire 48 is joined to a part of the emitter electrode 206 (see FIG. 6) which is provided on the semiconductor chip 21*cu* and serves as the emitter terminal E. One end of a bonding wire 49 is joined to the end of the relay pattern 24*lou* on the semiconductor chip 21*du* side. The other end of the bonding wire 49 is joined to a part of an emitter electrode (not illustrated) which is provided on the semiconductor chip 21*du* and serves as an emitter terminal E (see FIG. 8). The bonding wire 48 and the bonding wire 49 have, for example, substantially the same length as each other.

Thus, the emitter terminal E (see FIG. 8) of the IGBT 21Q provided in each of the semiconductor chip 21*cu* and the semiconductor chip 21*du* is connected to the emitter connection terminal 25E via the bonding wire 45. Further, as described above, the relay pattern 24*lou* is arranged so as to be substantially equidistant from the semiconductor chip 21*cu* and the semiconductor chip 21*du*, the other end of the bonding wire 45 is joined to substantially the center of the relay pattern 24*lou*, and the bonding wire 48 and the bonding wires 49 have substantially the same length as each other. Thus, a resistance value between the IGBT 21Q provided in the semiconductor chip 21*cu* and the emitter connection terminal 25E and a resistance value between the IGBT 21Q provided in the semiconductor chip 21*du* and the emitter connection terminal 25E become almost the same.

As illustrated in FIG. 5, the resistance adjustment unit 23*lou* is configured by, for example, a conductive pattern formed on the laminated substrate 111*u* with a conductive material (for example, copper). The resistance adjustment unit 23*lou* has, for example, a bifurcated shape extending from an intermediate portion of a gap between the semiconductor chip 21*cu* and the semiconductor chip 21*du* toward each of the semiconductor chip 21*cu* and the semiconductor chip 21*du*. The resistance adjustment unit 23*lou* has, for example, a Y-shape and is linearly symmetrical. For example, the resistance adjustment unit 23*lou* is arranged in the gap between the semiconductor chip 21*cu* and the semiconductor chip 21*du* so that the distance from one end to the semiconductor chip 21*cu* and the distance from the other end to the semiconductor chip 21*du* are substantially equal. One end of the resistance adjustment unit 23*lou* is arranged in the vicinity of the gate pad 204 of the semiconductor chip 21*cu*, for example. The other end of the resistance adjustment unit 23*lou* is arranged in the vicinity of the gate pad 204 of the semiconductor chip 21*cu*, for example.

The resistance adjustment unit 23*lou* has a first portion 231 including a region to which the other end of the bonding wire 40 is joined. The resistance adjustment unit 23*lou* has a second portion 232 including a region (one end of the resistance adjustment unit 23*lou*) to which the other end of the bonding wire 41 is joined. The resistance adjustment unit 23*lou* has a third portion 233 formed integrally with the first portion 231 and the second portion 232 between the first portion 231 and the second portion 232. The resistance adjustment unit 23*lou* has a fourth portion 234 including a region (the other end of the resistance adjustment unit 23*lou*) to which one end of the bonding wire 47 (details will be described later) is joined. The resistance adjustment unit 23*lou* has a fifth portion 235 integrally formed with the first portion 231 and the fourth portion 234 between the first portion 231 and the fourth portion 234. Incidentally, in FIG. 5, for convenience of explanation, a broken line is attached to the resistance adjustment unit 23*lou*, and the boundary between the first portion 231 and the third portion 233, the boundary between the second portion 232 and the third portion 233, the boundary between the first portion 231 and the fifth portion 235, and the boundary between the fourth portion 234 and the fifth portion 235 are illustrated.

One end of the bonding wire 46 is joined to the second portion 232 in addition to the other end of the bonding wire 41. The other end of the bonding wire 46 is joined to the gate pad 204 of the semiconductor chip 21*cu*. Consequently, the resistance adjustment unit 23*lou* and the gate pad 204 of the semiconductor chip 21*cu* are connected.

One end of the bonding wire 47 is joined to the fourth portion 234, and the other end of the bonding wire 47 is joined to the gate pad 204 of the semiconductor chip 21*du*. Consequently, the resistance adjustment unit 23*lou* and the gate pad 204 of the semiconductor chip 21*du* are connected.

Therefore, the external terminal Galou and the IGBT 21Q provided in the semiconductor chip 21*cu* are connected by the first connection route RT1 configured by the bonding wire 40, the first portion 231, the third portion 233, and the second portion 232 of the resistance adjustment unit 23*lou*, and the bonding wire 46.

Also, the external terminal Gblou and the IGBT 21Q provided in the semiconductor chip 21*cu* are connected by the second connection route RT2 configured by the bonding wire 41, the second portion 232 of the resistance adjustment unit 23*lou*, and the bonding wire 46.

Further, the external terminal Galou and the IGBT 21Q provided in the semiconductor chip 21*du* are connected by the third connection route RT3 configured by the bonding wire 40, the first portion 231, the fifth portion 235, and the fourth portion 234 of the resistance adjustment unit 23*lou*, and the bonding wire 47.

In addition, the external terminal Gblou and the IGBT 21Q provided in the semiconductor chip 21*cu* are connected by the fourth connection route RT4 configured by the bonding wire 41, the second portion 232, the third portion 233, the first portion 231, the fifth portion 235, and the fourth portion 234 of the resistance adjustment unit 23*lou*, and the bonding wire 47.

The route between the external terminal Galou and the first gate signal input terminal 25G1 and the route between the external terminal Gblou and the second gate signal input terminal 25G2 are configured by the wiring portions 710 and 711 having the same shape or length as described with reference to FIGS. 2, 3A, and 3B, and are made of the same material. Therefore, the resistance values of these connection routes are the same respectively. Hereinafter, description will be made about the first connection route RT1 and the second connection route RT2 between the first gate signal input terminal 25G1 and the second gate signal input terminal 25G2, and the IGBT 21Q.

It is desirable that the length of the bonding wire 46 and the length of the bonding wire 47 are substantially the same.

To make the lengths almost the same, for example, the bonding wires 46 and 47 can be made different in loop shape, loop height and the like at the time of bonding and set to substantially the same length as illustrated by a broken line square frame a in FIG. 7. Alternatively, when the distance from one end of the resistance adjustment unit 23*lou* to the semiconductor chip 21*cu* and the distance from the other end of the resistance adjustment unit 23*lou* to the semiconductor chip 21*du* are arranged to be equal, the bonding wires 46 and 47 can be joined with the same loop shape and the same loop height.

It is desirable that the length of the bonding wire 40 and the length of the bonding wire 41 are substantially the same. To make the lengths almost the same, similar to the bonding wires 46 and 47 illustrated in FIG. 7, for example, the bonding wires 40 and 41 can be almost the same length by setting the loop shape, loop height, etc. with each bonding wire at the time of bonding.

Further, it is desirable that the length of the resistance adjustment unit 23*lou* from one end of the bonding wire 46 to the other end of the bonding wire 40 and the length of the resistance adjustment unit 23*lou* from one end of the bonding wire 47 to the other end of the bonding wire 40 are substantially the same. For example, as illustrated in FIG. 5, the bonding wire 46 and the bonding wire 47 may be joined to the resistance adjustment unit 23*lou*.

Thus, the resistance adjustment unit 23*lou* can adjust the length between the first gate signal input terminal 25G1 and the IGBT 21Q of the semiconductor chip 21*cu* and the length between the second gate signal input terminal 25G2 and the IGBT 21Q of the semiconductor chip 21*cu* so as to be different from each other. Also, the resistance adjustment unit 23*lou* can adjust the length between the first gate signal input terminal 25G1 and the IGBT 21Q of the semiconductor chip 21*du* and the length between the second gate signal input terminal 25G2 and the IGBT 21Q of the semiconductor chip 21*du* so as to be different from each other. Further, the resistance adjustment unit 23*lou* can adjust the length between the second gate signal input terminal 25G2 and the IGBT 21Q of the semiconductor chip 21*cu* and the length between the first gate signal input terminal 25G1 and the IGBT 21Q of the semiconductor chip 21*du* so as to be different from each other. By making these lengths different, the resistance adjustment unit 23*lou* can make a resistance value (resistance value a) between the first gate signal input terminal 25G1 and the IGBT 21Q of the semiconductor chip 21*cu*, and a resistance value (resistance value b) between the second gate signal input terminal 25G2 and the IGBT 21Q of the semiconductor chip 21*cu* different. Also, the resistance adjustment unit 23*lou* can make a resistance value (resistance value c) between the first gate signal input terminal 25G1 and the IGBT 21Q of the semiconductor chip 21*du* and a resistance value (resistance value d) between the second gate signal input terminal 25G2 and the IGBT 21Q of the semiconductor chip 21*du* different. Further, the resistance adjustment unit 23*lou* can make the resistance value b between the second gate signal input terminal 25G2 and the IGBT 21Q of the semiconductor chip 21*cu* and the resistance value d between the second gate signal input terminal 25G2 and the IGBT 21Q of the semiconductor chip 21*du* different.

Incidentally, the resistance adjustment unit 23*lou* can adjust the length between the first gate signal input terminal 25G1 and the IGBT 21Q of the semiconductor chip 21*cu* and the length between the first gate signal input terminal 25G1 and the IGBT 21Q of the semiconductor chip 21*du* so as to be the same. The resistance adjustment unit 23*lou* adjusts the length between the first gate signal input terminal 25G1 and the IGBT 21Q of the semiconductor chip 21*cu* and the length between the first gate signal input terminal 25G1 and the IGBT 21Q of the semiconductor chip 21*du* so as to be the same, thereby making it possible to make the resistance value (resistance value a) between the first gate signal input terminal 25G1 and the IGBT 21Q of the semiconductor chip 21*cu* and the resistance value (resistance value c) between the first gate signal input terminal 25G1 and the IGBT 21Q of the semiconductor chip 21*du* to be substantially the same value. Thus, when the resistance value a and the resistance value c are set to substantially the same value, it is effective when the semiconductor module1 is normally operated. During the normal operation, the gate signal is input using only the external terminal Galou. In this case, the resistance values from the external terminal Galou to the respective gate pads of the semiconductor chip 21*cu* and the semiconductor chip 21*du* are substantially the same value. Therefore, it is possible to suppress the deviation between the operations of the semiconductor chip 21*cu* and the semiconductor chip 21*du*. It is desirable that the difference between the resistance value a and the resistance value c is smaller.

The second gate signal input terminal 25G2 is not used during the normal operation of the semiconductor module 1. Therefore, even if the difference between the resistance value b and the resistance value d is large, the operation of the semiconductor module 1 is not affected. Further, the larger the difference between the resistance value b and the resistance value d, the easier it is to determine a failed chip. Thus, it is desirable that the difference between the resistance value b and the resistance value d is larger than the difference between the resistance value a and the resistance value c.

Thus, the plurality of voltage-controlled switching elements provided in the semiconductor module 1 include at least the IGBT 21Q (an example of a first voltage-controlled switching element) provided in the semiconductor chip 21*cu* and the IGBT 21Q (an example of a second voltage-controlled switching element) provided in the semiconductor chip 21*du*. The first connection route group RTG1 on the low side has as a plurality of connection routes, the first connection route RT1 connecting the external terminal Galou provided in the terminal group 25*lou* and the IGBT 21Q provided in the semiconductor chip 21*cu*, and the third connection route RT3 connecting the external terminal Galou and the IGBT 21Q provided in the semiconductor chip 21*du*. The second connection route group RTG2 on the low side has as a plurality of connection routes, the second connection route RT2 connecting the external terminal Gblou provided in the terminal group 25*lou* and the IGBT 21Q provided in the semiconductor chip 21*cu*, and the fourth connection route RT4 connecting the external terminal Gblou and the IGBT 21Q provided in the semiconductor chip 21*du*.

In the semiconductor module 1, the resistance value of the first connection route RT1 and the resistance value of the third connection route RT3 on the low side are the same. The resistance value of the second connection route RT2 and the resistance value of the fourth connection route RT4 are different. The resistance value of the first connection route RT1 and the resistance value of the second connection route RT2 are different. The resistance value of the third connection route RT3 and the resistance value of the fourth connection route RT4 are different. The difference between the resistance value of the first connection route RT1 and the resistance value of the third connection route RT3 is different from the difference between the resistance value of the second connection route RT2 and the resistance value of the fourth connection route RT4.

Each part of the second connection route RT2 and the fourth connection route RT4 is a part of the resistance adjustment unit 23*lou*. Therefore, the second connection route group RTG2 has the resistance adjustment unit 23*lou* which adjusts the mutual resistance values of the second connection route RT2 and the fourth connection route RT4 (an example of a plurality of connection routes) provided in the second connection route group RTG2 and is common to the second connection route RT2 and the fourth connection route RT4. Each part of the first connection route RT1 and the third connection route RT3 is a part of the resistance adjustment unit 23*lou*. In this embodiment, the first connection route RT1 and the third connection route RT3 are formed to have the same length, but can have lengths different from each other (different resistance values) by changing the position where the bonding wire 40 is joined to the resistance adjustment unit 23*lou*. Therefore, the first connection route group RTG1 can have the resistance adjustment unit 23*lou* which adjusts the mutual resistance values of the first connection route RT1 and the third connection route RT3 (an example of a plurality of connection routes) provided in the first connection route group RTG1 and is common to the first connection route RT1 and the third connection route RT3.

As described above, the first connection route RT1 has the bonding wire 40 joined to the first portion 231 of the resistance adjustment unit 23*lou* configured by the conductive pattern. The second connection route RT2 has the bonding wire 41 joined to the second portion 232 of the resistance adjustment unit 23*lou*, which is located at the position different from that of the first portion 231 and is configured by the conductive pattern. In this way, the first connection route group RTG1 and the second connection route group RTG2 respectively have the bonding wires 40 and 41 which are connected to the mutual different positions of the conductive patterns constituting the resistance adjustment unit 23*lou*, and connect the conductive patterns and the IGBT 21Q of the semiconductor chip 21*cu*.

The connection between the external terminal Galou or the external terminal Gblou, the first connection route RT1 to the fourth connection route RT4, and the semiconductor chips 21*cu* and 21*du* will be described with reference to a circuit diagram. FIG. 8 is a circuit diagram of a portion of the laminated substrate 111*u*, which is illustrated in FIG. 5. In FIG. 8, in order to facilitate understanding, the first connection route RT1 to the fourth connection route RT4 are represented by circuit symbols of resistance elements, and a gate drive unit 31 and the like connected to the laminated substrate 111*u* and provided outside the case 10 (see FIG. 1) are also illustrated.

Figure 8:
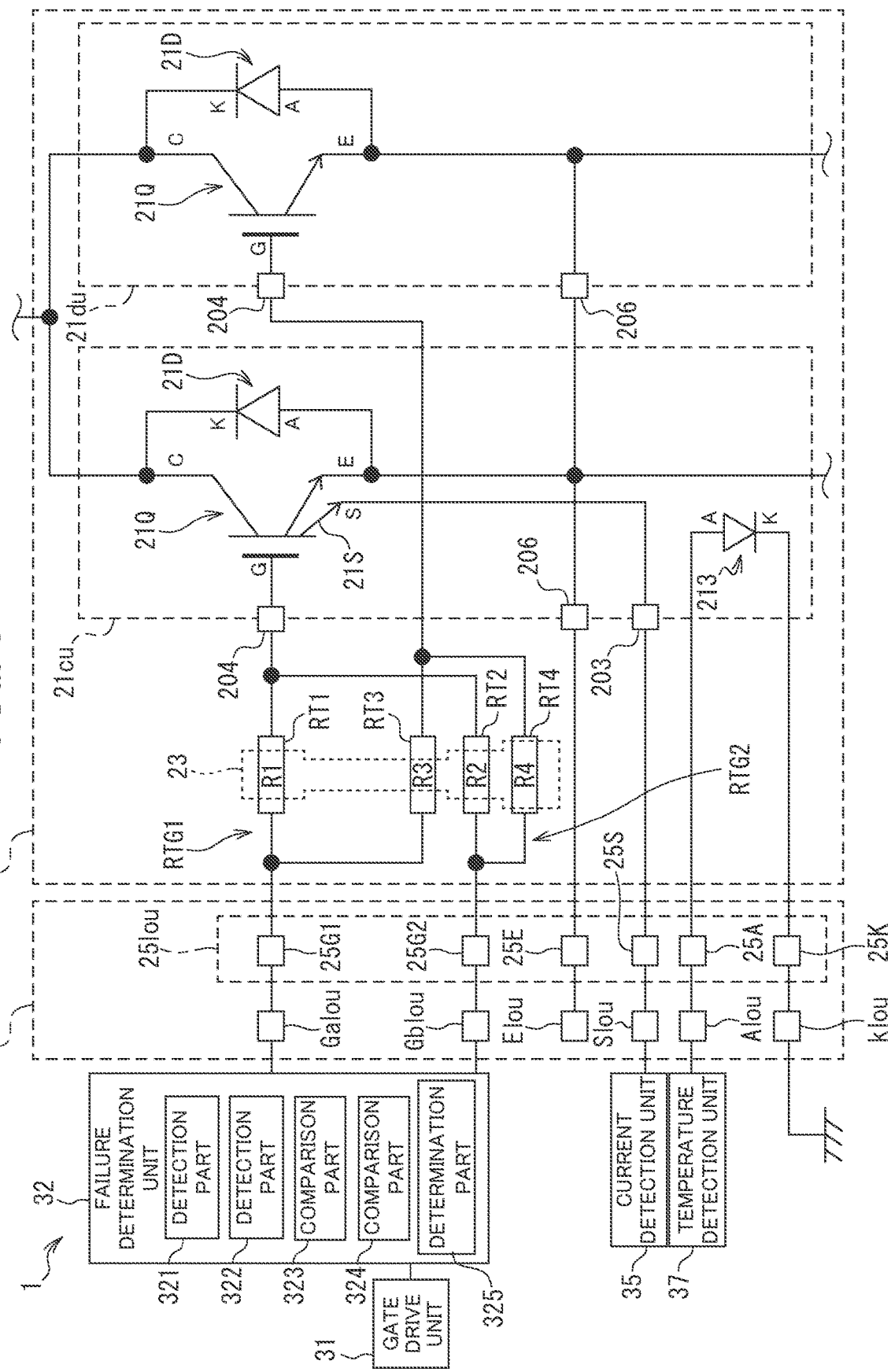
FIG. 8 is a circuit diagram for explaining the connection between the semiconductor chip and signal input terminals provided in the semiconductor module according to the first embodiment of the present invention.

As illustrated in FIG. 8, the semiconductor module 1 includes a plurality of (two in FIG. 8) IGBTs (an example of a plurality of voltage-controlled switching elements) 21Q connected in parallel, switching of which being controlled by a gate voltage (an example of a drive voltage) based on a gate signal (an example of an input signal). As described above, the IGBT 21Q is provided in each of the semiconductor chip 21*cu* and the semiconductor chip 21*du*.

A gate terminal G of the IGBT 21Q provided in the semiconductor chip 21*cu* is connected to the gate pad 204 provided in the semiconductor chip 21*cu*. The collector terminal C of the IGBT 21Q provided in the semiconductor chip 21*cu* is connected to the cathode terminal K of the freewheel diode 21D provided in the semiconductor chip 21*cu*. The emitter terminal E of the IGBT 21Q provided in the semiconductor chip 21*cu* is connected to the emitter electrode 206 provided in the semiconductor chip 21*cu* and the anode terminal A of the freewheel diode 21D.

A gate terminal G of the IGBT 21Q provided in the semiconductor chip 21*du* is connected to the gate pad 204 provided in the semiconductor chip 21*du*. The collector terminal C of the IGBT 21Q provided in the semiconductor chip 21*du* is connected to the cathode terminal K of the freewheel diode 21D provided in the semiconductor chip 21*du*. The emitter terminal E of the IGBT 21Q provided in the semiconductor chip 21*du* is connected to the emitter electrode 206 provided in the semiconductor chip 21*du* and the anode terminal A of the freewheel diode 21D.

As described above, each collector terminal C of the semiconductor chips 21*cu* and 21*du* is configured by a part of the collector electrode 207 (see FIG. 5). The collector electrode 207 of the semiconductor chip 21*cu* is mounted on the laminated substrate 111*u* in contact with a predetermined wiring pattern formed on the laminated substrate 111*u*. The collector electrode 207 of the semiconductor chip 21*du* is mounted on the laminated substrate 111*u* in contact with a wiring pattern with which the semiconductor chip 21*cu* is in contact. Therefore, the collector terminal C of the semiconductor chip 21*cu* and the collector terminal C of the semiconductor chip 21*du* are connected to each other.

The emitter electrode 206 (see FIG. 6) constituting the emitter terminal E of the semiconductor chip 21*cu* and the emitter electrode (not illustrated) constituting the emitter terminal E of the semiconductor chip 21*du* are connected by the relay pattern 24*lou*, the bonding wire 48, and the bonding wire 49 (see FIG. 5). Therefore, the IGBT 21Q of the semiconductor chip 21*cu* and the IGBT 21Q of the semiconductor chip 21*du* are connected in parallel.

Although not illustrated, the collector terminals C of the semiconductor chips 21*cu* and 21*du* are connected to the emitter terminals of the semiconductor chips 21*au* and 21*bu* mounted on the laminated substrate 111*u* and the output terminal Ou (see FIG. 1) via the wiring pattern which is formed on the laminated substrate 111*u* and with which these collector terminals C are in contact. Further, the emitter terminals E of the semiconductor chips 21*cu* and 21*du* are connected to the negative electrode terminal Nu (see FIG. 1) mounted on the laminated substrate 111*u* via the wiring pattern which is formed on the laminated substrate 111*u* and with which these emitter terminals E are in contact. In addition, the collector terminals of the semiconductor chips 21*au* and 21*bu* are connected to the positive electrode terminal Pu (see FIG. 1) mounted on the laminated substrate 111*u* via the wiring pattern which is formed on the laminated substrate 111*u* and with which these collector terminals are in contact.

Although the details will be described later, the semiconductor chips 21*av*, 21*bv*, 21*cv*, and 21*dv* mounted on the laminated substrate 11*v* are connected in the same manner as the connection of the semiconductor chips 21*au*, 21*bu*, 21*cu*, and 21*du* mounted on the laminated substrate 111*u*. Thus, the collector terminals of the semiconductor chips 21*av* and 21*bv* are connected to the positive electrode terminal Pv (see FIG. 1) mounted on the laminated substrate 11*v* via the wiring pattern which is formed on the laminated substrate 11*v* and with which these collector terminals are in contact. The collector terminals of the semiconductor chips 21*cv* and 21*dv* are connected to the emitter terminals of the semiconductor chips 21*av* and 21*bv* mounted on the laminated substrate 11*v* and the output terminal Ov (see FIG. 1) via the wiring pattern which is formed on the laminated substrate 11*v* and with which these collector terminals are in contact. Further, the emitter terminals of the semiconductor chips 21*cv* and 21*dv* are connected to the negative electrode terminal Nv (see FIG. 1) mounted on the laminated substrate 11*v* via the wiring pattern which is formed on the laminated substrate 111*v* and with which these emitter terminals are in contact.

Although the details will be described later, the semiconductor chips 21*aw*, 21*bw*, 21*cw*, and 21*dw* mounted on the laminated substrate 111*w* are connected in the same manner as the connection of the semiconductor chips 21*au*, 21*bu*, 21*cu*, and 21*du* mounted on the laminated substrate 111*u*. Thus, the collector terminals of the semiconductor chips 21*aw* and 21*bw* are connected to the positive electrode terminal Pw (see FIG. 1) mounted on the laminated substrate 111*w* via the wiring pattern which is formed on the laminated substrate 111*w* and with which these collector terminals are in contact. The collector terminals of the semiconductor chips 21*cw* and 21*dw* are connected to the emitter terminals of the semiconductor chips 21*aw* and 21*bw* mounted on the laminated substrate 111*w* and the output terminal Ow (see FIG. 1) via the wiring pattern which is formed on the laminated substrate 111*w* and with which these collector terminals are in contact. Further, the emitter terminals of the semiconductor chips 21*cw* and 21*dw* are connected to the negative electrode terminal Nw (see FIG. 1) mounted on the laminated substrate 111*w* via the wiring pattern which is formed on the laminated substrate 111*w* and with which these emitter terminals are in contact.

As illustrated in FIG. 8, the gate terminal G of the semiconductor chip 21*cu* is connected to the gate pad 204 of the semiconductor chip 21*cu*. The gate pad 204 of the semiconductor chip 21*cu* is connected to the first connection route RT1. The first connection route RT1 is connected to the external terminal Galou via the first gate signal input terminal 25G1 of the terminal group 25*lou*. Therefore, the gate terminal G of the semiconductor chip 21*cu* is connected to the external terminal Galou via the first connection route RT1.

The gate pad 204 of the semiconductor chip 21*cu* is connected to the second connection route RT2. The second connection route RT2 is connected to the external terminal Gblou via the second gate signal input terminal 25G2 of the terminal group 25*lou*. Therefore, the gate terminal G of the semiconductor chip 21*cu* is connected to the external terminal Gblou via the second connection route RT2.

Therefore, the semiconductor module 1 includes the external terminal Galou and the external terminal Gblou as signal input terminals. The external terminal Galou and the external terminal Gblou are connected to the IGBT 21Q of the semiconductor chip 21*cu* of the two IGBTs 21Q through the first connection route RT1 and the second connection route RT2 (an example of different connection routes) among the first to fourth connection routes RT1 to RT4 (an example of a plurality of connection routes). That is, the external terminal Galou is connected to the IGBT 21Q of the semiconductor chip 21*cu* through the first connection route RT1, and the external terminal Gblou is connected to the IGBT 21Q of the semiconductor chip 21*cu* through the second connection route RT2 different from the first connection route RT1.

The gate terminal G of the semiconductor chip 21*du* is connected to the gate pad 204 of the semiconductor chip 21*du*. The gate pad 204 of the semiconductor chip 21*du* is connected to the third connection route RT3. The third connection route RT3 is connected to the external terminal Galou via the first gate signal input terminal 25G1 of the terminal group 25*lou*. Therefore, the gate terminal G of the semiconductor chip 21*du* is connected to the external terminal Galou via the third connection route RT3.

The gate pad 204 of the semiconductor chip 21*du* is connected to the fourth connection route RT4. The fourth connection route RT4 is connected to the external terminal Gblou via the second gate signal input terminal 25G2 of the terminal group 25*lou*. Therefore, the gate terminal G of the semiconductor chip 21*du* is connected to the external terminal Gblou via the fourth connection route RT4.

Therefore, the first gate signal input terminal 25G1 and the second gate signal input terminal 25G2 are connected to the IGBT 21Q of the semiconductor chip 21*du* of the two IGBTs 21Q through the third connection route RT3 and the fourth connection route RT4 (an example of different connection routes) among the first to fourth connection routes RT1 to RT4 (an example of a plurality of connection routes). That is, the first gate signal input terminal 25G1 is connected to the IGBT 21Q of the semiconductor chip 21*du* through the third connection route RT3, and the second gate signal input terminal 25G2 is connected to the IGBT 21Q of the semiconductor chip 21*du* through the fourth connection route RT4 different from the third connection route RT3.

As illustrated in FIG. 8, the sense terminal S of the current detection element 21S provided in the semiconductor chip 21*cu* is connected to the sense pad 203 of the semiconductor chip 21*cu*. The sense pad 203 is connected to the current detection terminal 25S of the terminal group 25*lou*. A current detection unit 35 provided outside the semiconductor module 1 (see FIG. 1) is connected to the current detection terminal 25S via the external terminal Slou. The current detection element 21S outputs a detection current for detecting a collector-emitter current flowing through the IGBT 21Q from the sense terminal S. For example, the current detection unit 35 converts the detection current output from the sense terminal S of the current detection element 21S and input via the sense pad 203 and the current detection terminal 25S into a voltage and compares the voltage with a reference voltage. The current detection unit 35 detects that an abnormal current is flowing in the IGBT 21Q when the voltage is higher than the reference voltage.

As illustrated in FIG. 8, the temperature detection element 213 provided in the semiconductor chip 21*cu* is configured by, for example, the PN diode. An anode terminal A of the temperature detection element 213 is connected to the anode side temperature detection terminal 25A of the terminal group 25*lou*, and a cathode terminal K of the temperature detection element 213 is connected to the cathode side temperature detection terminal 25K. The anode side temperature detection terminal 25A is connected to a temperature detection unit 37 provided outside the semiconductor module 1 via the external terminal Alou. The cathode side temperature detection terminal 25K is connected to a reference potential terminal (for example, a ground terminal) of the temperature detection unit 37 provided outside the semiconductor module 1 via the external terminal Klou. A current flowing through the temperature detection element 213 changes according to a temperature change of the semiconductor chip 21*cu*. Therefore, the temperature detection unit 37 detects the temperature of the semiconductor chip 21*cu* based on the current flowing through the anode side temperature detection terminal 25A (that is, the current flowing through the temperature detection element 213).

As illustrated in FIG. 8, the gate drive unit 31 provided outside the semiconductor module 1 is connected to the external terminal Galou and the external terminal Gblou via a failure determination unit 32. The gate drive unit 31 generates a gate signal which drives the IGBT 21Q provided in each of the semiconductor chips 21cu and 21du, based on a control signal input from a control device (not illustrated) provided outside the semiconductor module 1. The gate signal generated by the gate drive unit 31 is input to the gate terminal G of the IGBT 21Q provided in each of the semiconductor chips 21cu and 21du. The switching (on/off state) of the IGBT 21Q is controlled based on the voltage level of the voltage (gate voltage) of the gate signal input to the gate terminal G.

The semiconductor module 1 includes the failure determination unit 32 which compares gate currents (an example of currents) flowing in the external terminal Galou and the external terminal Gblou respectively, and determines whether or not a failure has occurred in either the IGBT 21Q provided in the semiconductor chip 21cu or the IGBT 21Q provided in the semiconductor chip 21du. The failure determination unit 32 is arranged between the gate drive unit 31 and the external terminal Galou and the external terminal Gblou.

(Failed Element Determination Method for Semiconductor Module)

Next, a failed element determination method for the semiconductor module according to this embodiment will be described using FIGS. 9 to 11 while referring to FIGS. 5 and 8. The failed element determination method for the semiconductor module 1 according to this embodiment compares a current flowing through the external terminal Galou with a current flowing through the external terminal Gblou, and determines whether a failure has occurred in either of the IGBTs 21Q provided in the semiconductor chip 21cu and the semiconductor chip 21du.

Figure 9:
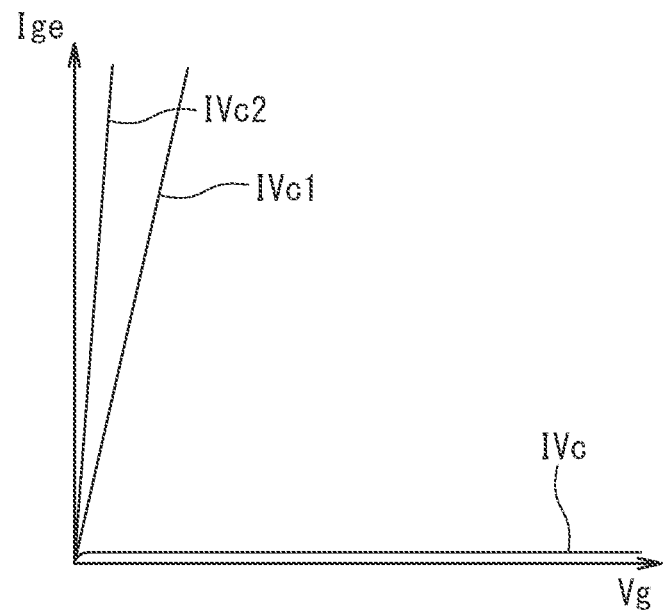
FIG. 9 is a diagram schematically illustrating an IV characteristics at a signal input terminal where an IGBT provided in one of the semiconductor chips provided in the semiconductor module according to the first embodiment of the present invention and connected in parallel fails.
Figure 10:
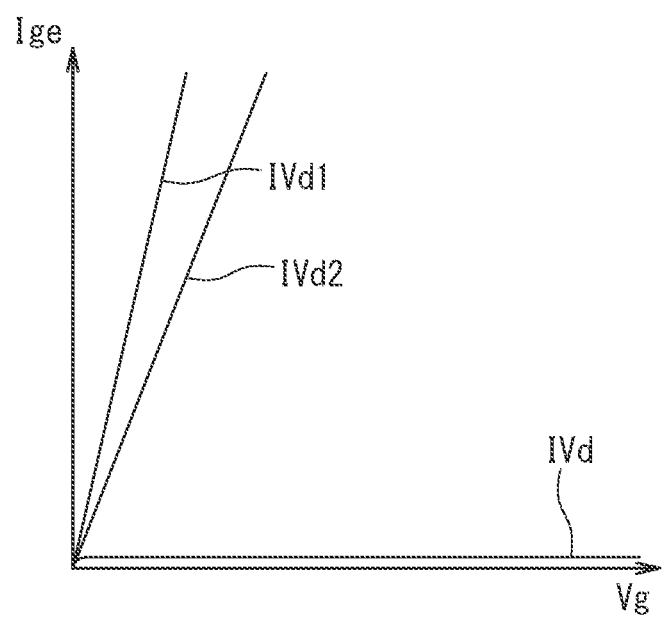
FIG. 10 is a diagram schematically illustrating IV characteristics at a signal input terminal where an IGBT provided in the other of the semiconductor chips provided in the semiconductor module according to the first embodiment of the present invention and connected in parallel fails.

FIGS. 9 and 10 are diagrams schematically illustrating the characteristics of a gate-emitter current Ige (hereinafter may be referred to as "IV characteristics") with respect to the gate voltage Vg of the IGBT 21Q provided in each of the semiconductor chips 21cu and 21du. "IVc" illustrated in FIG. 9 indicates the IV characteristics of the IGBT 21Q when the IGBT 21Q provided in the semiconductor chip 21cu does not fail. "IVc1" illustrated in FIG. 9 indicates the IV characteristics of the IGBT 21Q obtained at the external terminal Galou when the IGBT 21Q provided in the semiconductor chip 21cu fails. "IVc2" illustrated in FIG. 9 indicates the IV characteristics of the IGBT 21Q obtained at the external terminal Gblou when the IGBT 21Q provided in the semiconductor chip 21cu fails. "IVd" illustrated in FIG. 10 indicates the IV characteristics of the IGBT 21Q when the IGBT 21Q provided in the semiconductor chip 21du does not fail. "IVd1" illustrated in FIG. 10 indicates the IV characteristics of the IGBT 21Q obtained at the external terminal Galou when the IGBT 21Q provided in the semiconductor chip 21du fails. "IVd2" illustrated in FIG. 10 indicates the IV characteristics of the IGBT 21Q obtained at the external terminal Gblou when the IGBT 21Q provided in the semiconductor chip 21du fails. The horizontal axes of graphs illustrated in FIGS. 9 and 10 indicate the gate voltage Vg applied to the gate terminal G of the IGBT 21Q, and the vertical axes of the graphs indicate the gate-emitter current Ige of the IGBT 21Q.

As illustrated in FIG. 8, assuming that the resistance value of the first connection route RT1 is "R1" and the resistance value of the second connection route RT2 is "R2", the resistance value of the first connection route RT1 and the resistance value of the second connection route RT2 have a relationship of "R1>R2".

As illustrated in FIG. 8, assuming that the resistance value of the third connection route RT3 is "R3" and the resistance value of the fourth connection route RT4 is "R4", the resistance value of the third connection route RT3 and the resistance value of the fourth connection route RT4 have a relationship of "R3<R4". In this embodiment, the resistance adjustment unit 23lou is formed so that most of the difference (R1−R2) between the resistance values of the first connection route RT1 and the second connection route RT2 is occupied by the resistance value of the third portion 233, and most of the difference (R3−R4) between the resistance values of the third connection route RT3 and the fourth connection route RT4 is occupied by the resistance values of the second portion 232 and the third portion 233.

Not limited to the IGBT 21Q, the gate terminal of the IGBT generally has a high impedance when no failure has occurred in the IGBT. Therefore, the current input to the gate terminal of the IGBT hardly flows to the emitter terminal. Thus, as illustrated by the characteristics IVc in FIG. 9, when a failure (for example, a short circuit failure between the gate and the emitter) has not occurred in the IGBT 21Q provided in the semiconductor chip 21cu, the gate-emitter current Ige hardly flows and hardly changes even if the gate voltage Vg applied to the gate terminal G changes. Similarly, as illustrated by the characteristics IVd in FIG. 10, when a failure (for example, a short circuit failure between the gate and the emitter) has not occurred in the IGBT 21Q provided in the semiconductor chip 21du, the gate-emitter current Ige hardly flows and hardly changes even if the gate voltage Vg applied to the gate terminal G changes.

On the other hand, when a failure (for example, a short circuit failure between the gate and the emitter) occurs in the IGBT, a current flows through the gate terminal. Specifically, when a gate voltage of a predetermined value is output from the gate drive unit 31, the gate voltage is applied to the gate terminal G of the IGBT 21Q provided in each of the semiconductor chip 21cu and the semiconductor chip 21du via the first connection route RT1 and the second connection route RT2. For example, when a failure (for example, a short circuit failure between the gate and the emitter) occurs in the IGBT 21Q provided in the semiconductor chip 21cu, a current path is generated between the gate terminal G and the emitter terminal E of the IGBT 21Q. Therefore, a gate current corresponding to the gate voltage flows through the gate terminal G of the IGBT 21Q of the semiconductor chip 21cu. On the other hand, the gate current hardly flows to the gate terminal G of the IGBT 21Q provided in the semiconductor chip 21du where no failure has occurred.

The gate current output from the gate drive unit 31 is branched by the failure determination unit 32 and input to the external terminal Galou and the external terminal Gblou. The first connection route RT1 connected to the external terminal Galou is larger in resistance value than the second connection route RT2 connected to the external terminal Gblou. Therefore, when the IGBT 21Q of the semiconductor chip 21cu fails and a current path for the current to flow from the gate terminal G to the emitter terminal E is generated, the first connection route RT1 is less likely to carry the gate current than the second connection route RT2. Therefore, as illustrated by the characteristics IVc1 and IVc2 in FIG. 9, the current based on the characteristics IVc2 obtained at the external terminal Gblou has a larger contribution to the gate-emitter current Ige than the current based on the characteristics IVc1 obtained at the external terminal Galou.

Further, when a gate voltage of a predetermined value is output from the gate drive unit 31, the gate voltage is applied to the gate terminal G of the IGBT 21Q provided in each of the semiconductor chip 21cu and the semiconductor chip 21du via the third connection route RT3 and the fourth connection route RT4. For example, when a failure (for example, a short circuit failure between the gate and the emitter) occurs in the IGBT 21Q provided in the semiconductor chip 21du, a current path is generated between the gate terminal G and the emitter terminal E of the IGBT 21Q. Therefore, a gate current corresponding to the gate voltage flows through the gate terminal G of the IGBT 21Q of the semiconductor chip 21du. On the other hand, the gate current hardly flows to the gate terminal G of the IGBT 21Q provided in the semiconductor chip 21cu where no failure has occurred.

The gate current output from the gate drive unit 31 is branched by the failure determination unit 32 and input to the external terminal Galou and the external terminal Gblou. The third connection route RT3 connected to the external terminal Galou is smaller in resistance value than the fourth connection route RT4 connected to the external terminal Gblou. Therefore, when the IGBT 21Q of the semiconductor chip 21du fails and a current path for the current to flow from the gate terminal G to the emitter terminal E is generated, the gate current is likely to flow in the third connection route RT3 than in the fourth connection route RT4. Therefore, as illustrated by the characteristics IVd1 and IVd2 in FIG. 10, the current based on the characteristics IVd1 obtained at the external terminal Galou has a larger contribution to the gate-emitter current Ige than the current based on the characteristics IVc2 obtained at the external terminal Gblou.

Thus, the semiconductor module 1 is configured to reverse the magnitude of the current flowing through the external terminal Galou and the external terminal Gblou depending on which IGBT 21Q of the semiconductor chip 21cu and the semiconductor chip 21du fails. The failure determination unit 32 uses the reverse phenomenon of current to determine whether or not the IGBT 21Q provided in either the semiconductor chip 21cu or the semiconductor chip 21du fails.

Returning to FIG. 8, the failure determination unit 32 has a detection part 321 which detects the current value of the current input from the gate drive unit 31 and output to the external terminal Galou, and a detection part 322 which detects the current value of the current input from the gate drive unit 31 and output to the external terminal Gblou. The failure determination unit 32 has a comparison part 323 which compares the current values detected by the detection parts 321 and 322. The failure determination unit 32 has a comparison part 324 which compares the current value (target current value) determined by the comparison part 323 to be large and a reference current value based on the maximum current flowing through the gate terminal G when the IGBT has not failed.

Further, the failure determination unit 32 has a determination part 325 which determines a semiconductor chip in which a failure has occurred. When the comparison part 324 determines that the target current value is larger than the reference current value, and the target current is the current value detected by the detection part 322 (see FIG. 9), the determination part 325 determines that the IGBT 21Q provided in the semiconductor chip 21cu is out of order and the semiconductor chip 21cu is a failed chip. Further, when the comparison part 324 determines that the target current value is larger than the reference current value, and the target current is the current value detected by the detection part 321 (see FIG. 10), the determination part 325 determines that the IGBT 21Q provided in the semiconductor chip 21du is out of order, and the semiconductor chip 21du is a failed chip. In addition, when the comparison part 324 determines that the target current value is the same as or smaller than the reference current value, the determination part 325 determines that both IGBTs 21Q provided in the semiconductor chips 21cu and 21du do not fail and the semiconductor chips 21cu and 21du are not failed chips.

After the determination of the failed chip is completed, the semiconductor module 1 is disassembled with only the chip determined to be the failed chip as an analysis target, and the back surface (the surface on the laminated substrate side) of the failed chip is exposed to analyze the failed chip.

Although detailed description is omitted, the configuration on the high side and the failed element determination method are similar to the configuration on the low side and the failed element determination method where the semiconductor chip 21cu is read as a semiconductor chip 21au, the semiconductor chip 21du is read as a semiconductor chip 21bu, and the resistance adjustment unit 23lou is read as a resistance adjustment unit 23upu.

(Effect of Semiconductor Module)

The effect of the semiconductor module 1 according to this embodiment will be described using FIG. 11 while referring to FIG. 5. FIG. 11 is a diagram schematically illustrating a connection state between a semiconductor chip provided in a semiconductor module according to a comparative example and a terminal group. In FIG. 11, components developing the same operations and functions as the components provided in the semiconductor module 1 according to this embodiment are designated by the same reference numerals. Further, in FIG. 11, the illustration of the reference numerals for the components not directly related to the effect of the semiconductor module 1 is omitted.

Figure 11:
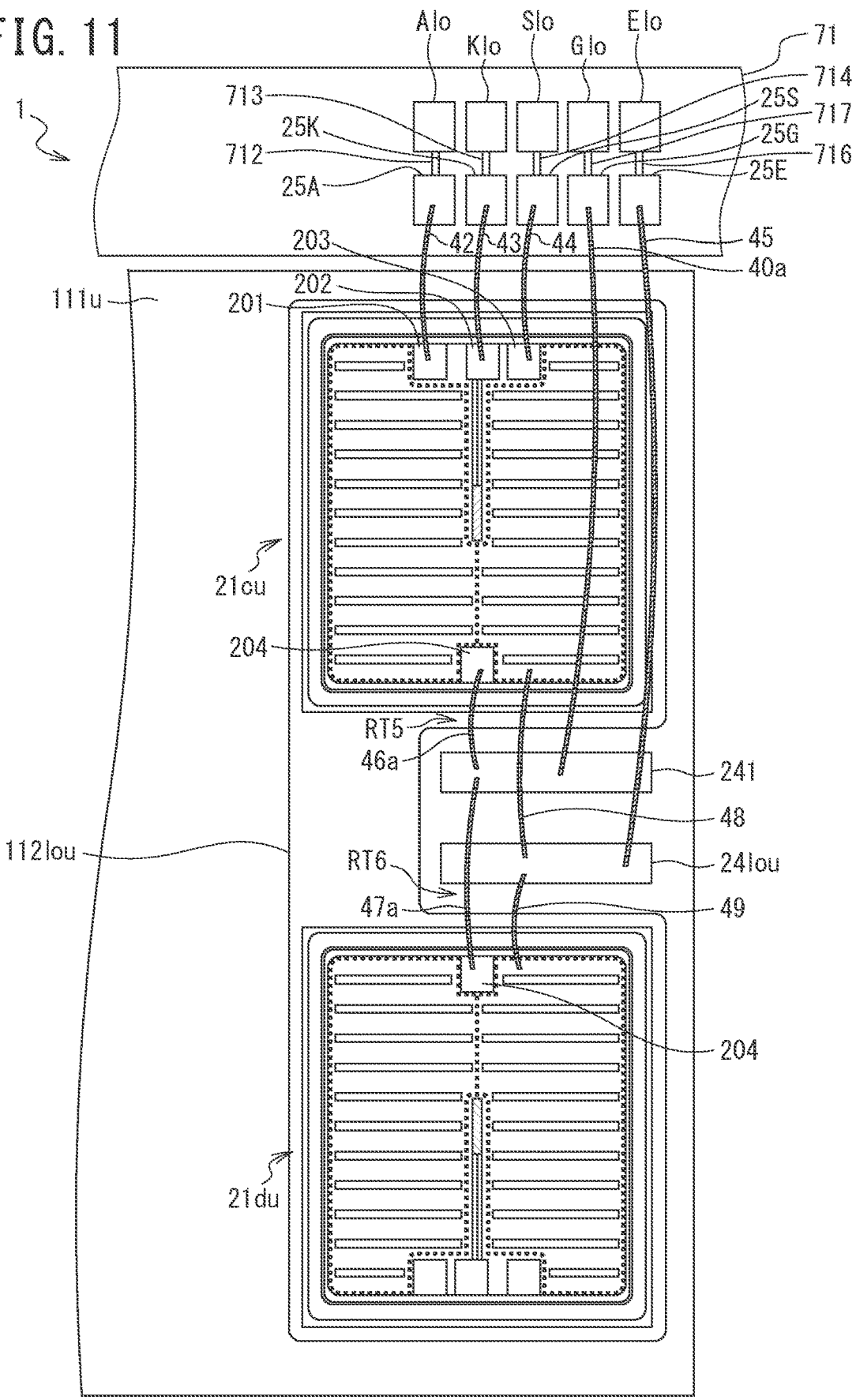
FIG. 11 is a diagram schematically illustrating a connection state of a semiconductor chip and a terminal group provided in a semiconductor module according to a comparative example.

As illustrated in FIG. 11, the semiconductor module according to the comparative example has semiconductor chips 21cu and 21du having the same configuration as the semiconductor chips 21cu and 21du provided in the semiconductor module 1 according to this embodiment. The semiconductor module according to the comparative example has one gate signal input terminal 25G unlike the semiconductor module 1 according to this embodiment. Unlike the semiconductor module 1 according to this embodiment, the semiconductor module according to the comparative example does not have a resistance adjustment unit and has a relay pattern 241. Consequently, in the semiconductor module according to the comparative example, the gate signal input terminal 25G and the relay pattern 241 are connected by a bonding wire 40a. Further, in the semiconductor module according to the comparative example, the relay pattern 241 and a gate pad 204 of the semiconductor chip 21cu are connected by a bonding wire 46a, and the relay pattern 241 and a gate pad 204 of the semiconductor chip 21du are connected by a bonding wire 47a.

A fifth connection route RT5 connecting a gate signal input terminal 25G and the gate pad 204 of the semiconductor chip 21cu is configured by the bonding wire 40a, the relay pattern 241, and the bonding wire 46a. On the other hand, a sixth connection route RT6 connecting the gate signal input terminal 25G and the gate pad 204 of the semiconductor chip 21du is configured by the bonding wire 40a, the relay pattern 241, and the bonding wire 47a. The position where the bonding wire 46a is joined to the relay pattern 241 is close to the position where the bonding wire 47a is joined to the relay pattern 241. Therefore, the difference between the fifth connection route RT5 and the sixth connection route RT6 becomes the length of the bonding wire 46a and the bonding wire 47a. Even if there is a difference in length between the bonding wire 46a and the bonding wire 47a, the difference in resistance value due to this difference is small. Therefore, the current value of a gate current flowing from a gate terminal G toward the semiconductor chips 21cu and 21du is nearly unchanged in the case where a failure (for example, a short circuit failure between the gate and the emitter) occurs in the IGBT 21Q of the semiconductor chip 21cu and the case where a failure (for example, a short circuit failure between the gate and the emitter) occurs in the IGBT 21Q of the semiconductor chip 21du. Therefore, even if the gate current flowing from the gate terminal G toward the semiconductor chips 21cu and 21du is detected, it is not possible to determine which of the semiconductor chips 21cu and 21du has failed. As a result, in the semiconductor module according to the comparative example, unless the case is disassembled, the laminated substrate 111u is removed, and the back surfaces of both the semiconductor chips 21cu and 21du connected in parallel are exposed, it cannot be determined whether either of the semiconductor chips 21cu and 21du is out of order, and it takes time to identify the semiconductor chips 21cu and 21du in which the short-circuit failure has occurred.

On the other hand, the semiconductor module 1 according to this embodiment can determine whether the failure has occurred in either of the semiconductor chips 21cu and 21du by comparing the gate current flowing from the external terminal Galou to the semiconductor chip 21cu and the gate current flowing from the external terminal Gblou to the semiconductor chip 21du. As a result, the semiconductor module 1 according to this embodiment can determine which of the semiconductor chips 21cu and 21du has failed without disassembling the case 10, and it is possible to simplify and shorten the work of identifying the semiconductor chips 21cu and 21du in which the short-circuit failure has occurred.

The detailed configuration and effect of the semiconductor module 1 have been described above by taking the semiconductor chips 21cu and 21du as an example. However, even for each of the semiconductor chips 21au and 21bu, the semiconductor chips 21av and 21bv, the semiconductor chips 21cv and 21dv, the semiconductor chips 21aw and 21bw, and the semiconductor chips 21cw and 21dw, it is possible to determine by the same method whether or not a failure has occurred.

As described above, the semiconductor module 1 according to this embodiment includes the IGBT 21Q, for example, provided in each of the semiconductor chips 21cu and 21du connected in parallel, switching of which being controlled by the gate voltage based on the gate signal and the external terminals Galou and Gblou input with the gate signal. The semiconductor module 1 includes the first connection route group RTG1 having the first connection route RT1 and the third connection route RT3 connecting the external terminal Galou and the IGBTs 21Q provided in the semiconductor chips 21cu and 21du respectively, and the second connection route group RTG2 having the second connection route RT2 and the fourth connection route RT4 connecting the external terminal Gblou and the IGBTs 21Q provided in the semiconductor chips 21cu and 21du respectively.

The first gate signal input terminal 25G1 is connected to the IGBT 21Q of the semiconductor chip 21cu by the first connection route RT1 and is connected to the IGBT 21Q of the semiconductor chip 21du by the third connection route RT3. The second gate signal input terminal 25G2 is connected to the IGBT 21Q of the semiconductor chip 21cu by the second connection route RT2 and is connected to the IGBT 21Q of the semiconductor chip 21du by the fourth connection route RT4. Thus, each of the first gate signal input terminal 25G1 and the second gate signal input terminal 25G2 is connected to the IGBT 21Q with the different connection routes among the first to fourth connection routes RT1 to RT4 (an example of a plurality of connection routes).

By having such a configuration, the semiconductor module 1 can determine the semiconductor chips 21cu and 21du in which the short-circuit failure has occurred without being disassembled.

Modification of First Embodiment

A semiconductor module according to a modification of the first embodiment of the present invention will be described with reference to FIG. 12.

Figure 12:
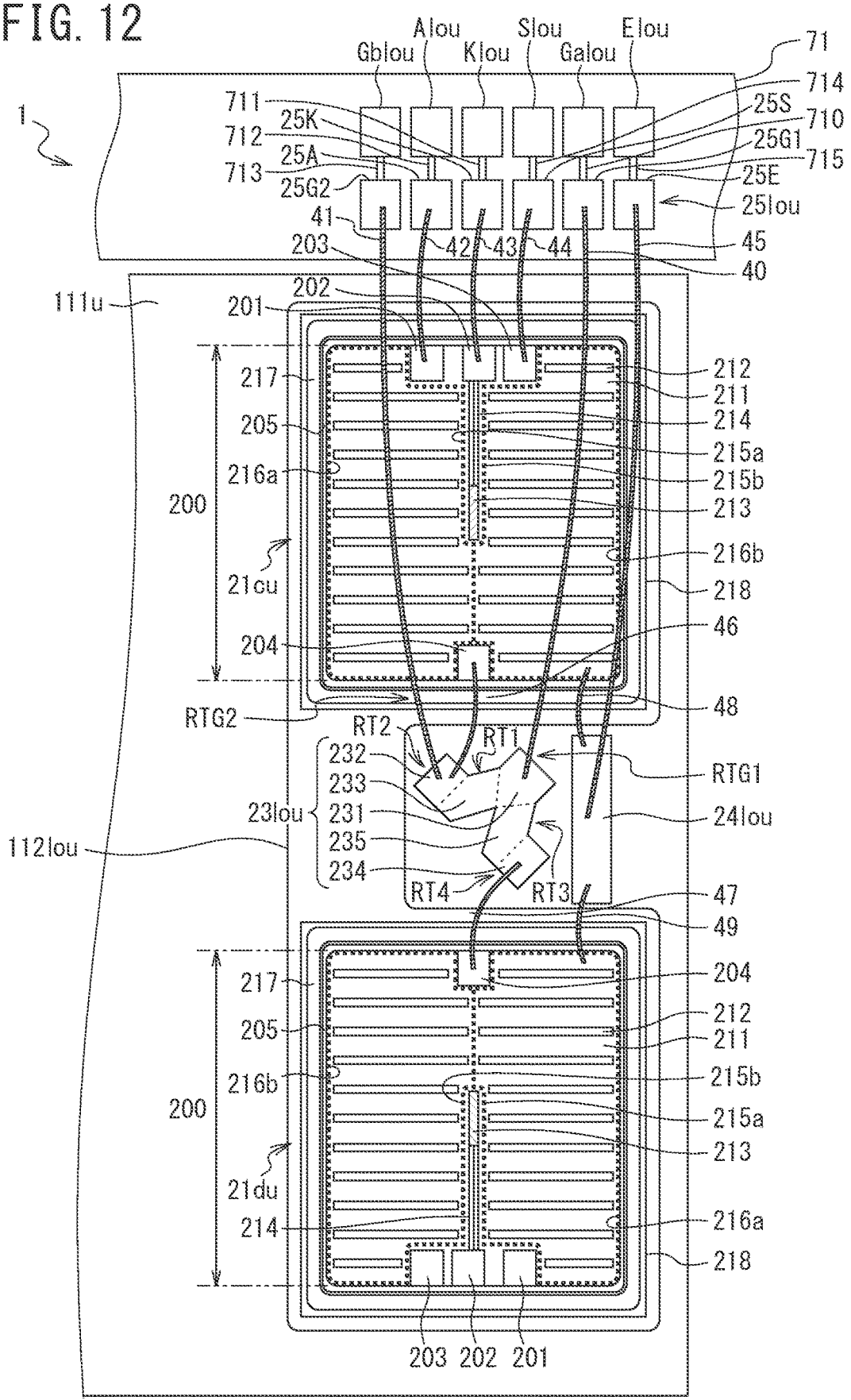
FIG. 12 is a diagram illustrating a schematic configuration of a resistance adjustment unit provided in a semiconductor module according to a modification of the first embodiment of the present invention.

FIG. 12 is a diagram illustrating a plan view schematically illustrating a schematic configuration of semiconductor chips 21cu and 21du provided in the semiconductor module 1 according to this modification. The present semiconductor module 1 has the same configuration as the semiconductor module 1 according to the first embodiment except that the arrangement of the resistance adjustment unit 23lou differs. The resistance adjustment unit 23lou in this modification has a configuration in which it is rotated by 45° counterclockwise from the arrangement illustrated in FIG. 5.

In FIG. 5, it has been described that the bonding wire 40 and the bonding wire 41 are set to the same length by changing the loop height, but in this modification, the distance between the first gate signal input terminal 25G1 and the first portion 231 of the resistance adjustment unit 23lou, and the distance between the second gate signal input terminal 25G2 and the second portion 232 of the resistance adjustment unit 23lou are made equal to each other. Therefore, the bonding wire 40 and the bonding wire 41 can be the same length without changing the loop height of each other.

Thus, the semiconductor module 1 according to this modification can bring about the same effect as the semiconductor module 1 according to the first embodiment.

Second Embodiment

A semiconductor module according to a second embodiment of the present invention will be described with reference to FIGS. 13 to 15. The semiconductor module 2 according to this embodiment has the same configuration as the semiconductor module 1 according to the first embodiment except that the number of semiconductor chips connected in parallel differs, a laminated substrate differs due to the different number of semiconductor chips, the shape of a resistance adjustment unit differs, the number of connection routes differs, and a method of determining a semiconductor chip in which a failure has occurred differs. Therefore, in the description of the semiconductor module 2 according to this embodiment, the same reference numerals are given to the components having the same operations and functions as those of the semiconductor module 1 according to the first embodiment, and the description thereof will be omitted.

A case of the semiconductor module 2 according to this embodiment becomes larger as the number of semiconductor chips increases as compared with the case 10 of the semiconductor module 1 according to the first embodiment. Further, the semiconductor module 2 includes, in addition to the semiconductor chips 21au to 21du, 21av to 21dv, and 21aw to 21dw in the first embodiment, semiconductor chips 21eu and 21fu for the U phase, two semiconductor chips (not illustrated) corresponding to the semiconductor chips 21eu and 21fu for the V phase, and two semiconductor chips (not illustrated) corresponding to the semiconductor chips 21eu and 21*fu* for the W phase, respectively. The case, semiconductor chips, and laminated substrate provided in the semiconductor module 2 will be described with reference to the drawings relating to the case 10, the semiconductor chips, and the laminated substrate in the first embodiment as the need arises.

(Configuration of Connection Route Connecting Voltage-Controlled Switching Element and Signal Input Terminal)

The configuration of the connection route connecting the voltage-controlled switching element and the signal input terminal in the semiconductor module 2 according to this embodiment will be described with reference to FIG. 13. The configuration of the connection route connecting the voltage-controlled switching element and the signal input terminal in the semiconductor module 2 according to this embodiment will be described by taking the connection route in the U phase as an example.

Figure 13:
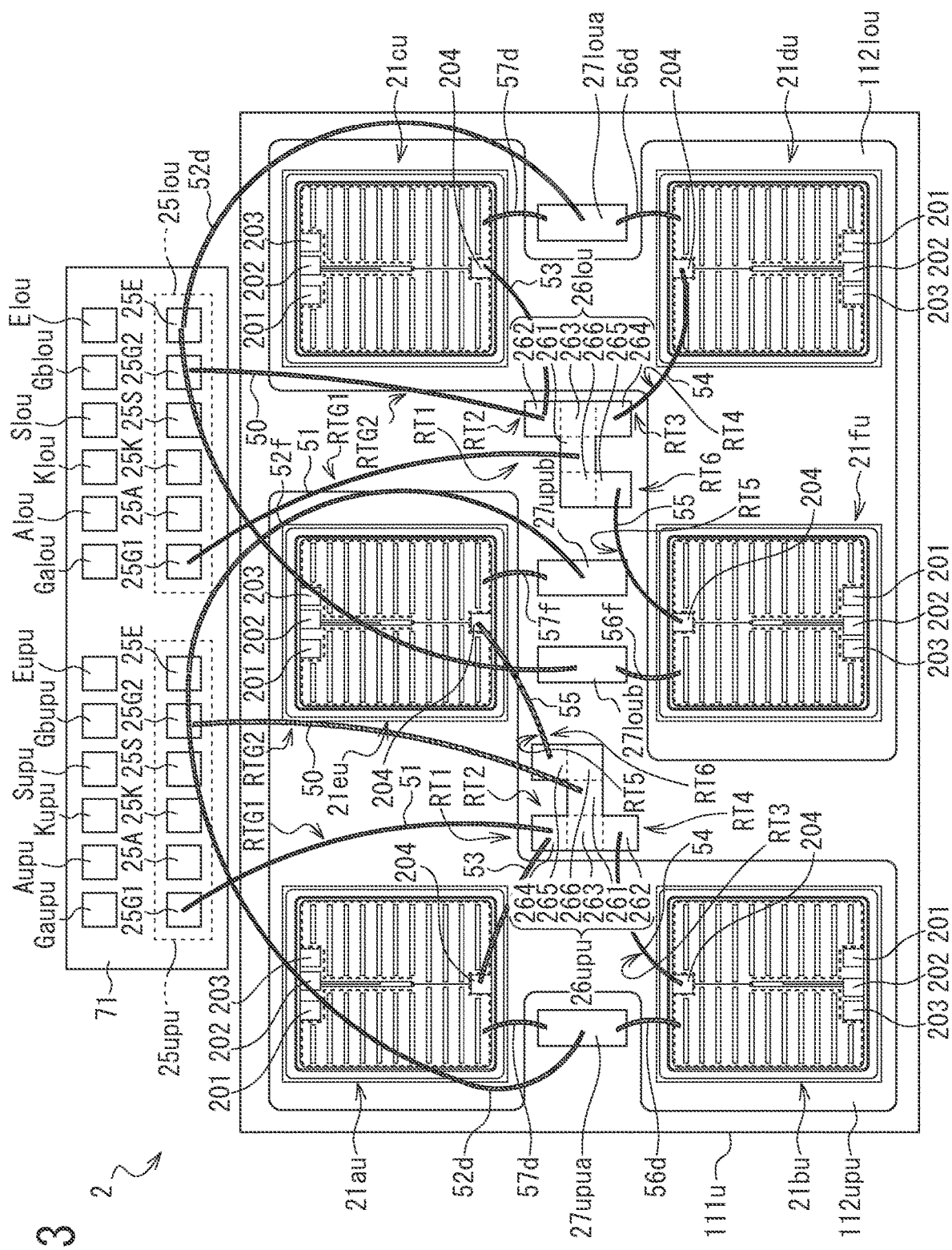
FIG. 13 is a plan view schematically illustrating a schematic configuration of semiconductor chips provided in a semiconductor module according to a second embodiment of the present invention.

As illustrated in FIG. 13, a high-side terminal group 25*upu* and a low-side terminal group 25*lou* in this embodiment have a first gate signal input terminal 25G1 and a second gate signal input terminal 25G2, respectively as in the first embodiment. Incidentally, in this embodiment, each of a terminal group 25*upv*, a terminal group 25*lov*, a terminal group 25*upw*, and a terminal group 25*low* (see FIG. 1) has six terminals in a manner similar to the terminal group 25*upu* and the terminal group 25*lou*. Incidentally, the arrangement position of the terminal may be different between the high side and the low side.

As illustrated in FIG. 13, the semiconductor module 2 includes IGBT 21Q (an example of a plurality of voltage-controlled switching elements, see FIG. 8) provided in each of a semiconductor chip 21*cu*, a semiconductor chip 21*du*, and a semiconductor chip 21*fu* connected in parallel, switching of which being controlled by a gate voltage (an example of a drive voltage) based on a gate signal (an example of an input signal). The IGBT 21Q provided in the semiconductor chip 21*cu*, the IGBT 21Q provided in the semiconductor chip 21*du*, and the IGBT 21Q provided in the semiconductor chip 21*fu* are connected in parallel to each other. The semiconductor module 2 includes an external terminal Galou (an example of a first external terminal) and an external terminal Gblou (an example of a second external terminal) to which the gate signal is input. The semiconductor module 2 includes a first connection route group RTG1 having a first connection route RT1, a third connection route RT3, and a fifth connection route RT5 (an example of a plurality of connection routes) which connect the external terminal Galou and the IGBT 21Q provided in each of the semiconductor chips 21*cu*, 21*du*, and 21*fu*. Further, the semiconductor module 2 includes a second connection route group RTG2 having a second connection route RT2, a fourth connection route RT4, and a sixth connection route RT6 (an example of a plurality of connection routes) connecting the external terminal Gblou and the IGBT 21Q provided in each of the semiconductor chips 21*cu*, 21*du*, and 21*fu*.

As illustrated in FIG. 13, the laminated substrate 111*u* includes a wiring pattern 112*upu* on which the semiconductor chips 21*au*, 21*bu*, and 21*eu* on the high side are mounted, and a wiring pattern 112*lou* on which the semiconductor chips 21*cu*, 21*du*, and 21*fu* on the low side are mounted. Each of the semiconductor chips 21*eu* and 21*fu* has an IGBT 21Q (not illustrated in FIG. 13, see FIG. 14). Therefore, the plurality of voltage-controlled switching elements on the high side in this embodiment include an IGBT 21Q (an example of a first voltage-controlled switching element) provided in the semiconductor chip 21*au*, an IGBT 21Q (an example of a second voltage-controlled switching element) provided in the semiconductor chip 21*bu*, and an IGBT 21Q (an example of a third voltage-controlled switching element) provided in the semiconductor chip 21*eu*. Similarly, the plurality of voltage-controlled switching elements on the low side in this embodiment include an IGBT 21Q (an example of a first voltage-controlled switching element) provided in the semiconductor chip 21*cu*, an IGBT 21Q (an example of a second voltage-controlled switching element) provided in the semiconductor chip 21*du*, and an IGBT 21Q (an example of a third voltage-controlled switching element) provided in the semiconductor chip 21*fu*.

The laminated substrate 111*u* includes a resistance adjustment unit 26*upu* on the high side and a resistance adjustment unit 26*lou* on the low side. The laminated substrate 111*u* includes relay patterns 27*upu*a and 27*upu*b on the high side and relay patterns 27*lou*a and 27*lou*b on the low side. When the wiring pattern 121*upu*, the resistance adjustment unit 26*upu*, and the relay patterns 27*upu*a and 27*upu*b on the high side are rotated by 180° in the plan view of the laminated substrate 111*u*, they have an arrangement of the wiring pattern 112*lou*, the resistance adjustment unit 26*lou*, and the relay patterns 27*lou*a and 27*lou*b on the low side. That is, the wiring pattern 112*upu*, the resistance adjustment unit 26*upu*, and the relay patterns 27*upu*a and 27*upu*b on the high side, and the wiring pattern 112*lou*, the resistance adjustment unit 26*lou*, and the relay patterns 27*lou*a and 27*lou*b on the low side have a point-symmetrical arrangement relationship with respect to the center on the plane of the laminated substrate 111*u*. The wiring pattern 121*upu*, the resistance adjustment unit 26*upu*, and the relay patterns 27*upu*a and 27*upu*b on the high side, and the wiring pattern 112*lou*, the resistance adjustment unit 26*lou*, and the relay patterns 27*lou*a and 27*lou*b on the low side have the same configuration except that they have a point-symmetrical arrangement relationship. Therefore, hereinafter, the configuration of the wiring pattern 121*upu*, the resistance adjustment unit 26*upu*, and the relay patterns 27*upu*a and 27*upu*b on the high side, and the wiring pattern 112*lou*, the resistance adjustment unit 26*lou*, and the relay patterns 27*lou*a and 27*lou*b on the low side will be described by taking the connection route of the terminal group 25*lou*, the semiconductor chips 21*cu*, 21*du*, and 21*fu*, the resistance adjustment unit 26*lou*, and the relay pattern 27*lou* on the low side as an example.

As illustrated in FIG. 13, one end of a bonding wire 51 is joined to the first gate signal input terminal 25G1. The other end of the bonding wire 51 is joined to the resistance adjustment unit 26*lou*. Thus, the first gate signal input terminal 25G1 is connected to the resistance adjustment unit 26*lou* by the bonding wire 51. One end of a bonding wire 50 is joined to the second gate signal input terminal 25G2. The other end of the bonding wire 50 is joined to the resistance adjustment unit 26*lou*. Thus, the second gate signal input terminal 25G2 is connected to the resistance adjustment unit 26*lou* by the bonding wire 50.

As illustrated in FIG. 13, the resistance adjustment unit 26*lou* in this embodiment is configured by, for example, a conductive pattern formed on the laminated substrate 111*u* with a conductive material (for example, copper). The resistance adjustment unit 26*lou* has, for example, a shape obtained by reversing the shape of the lowercase letter "h".

The resistance adjustment unit 26*lou* has a first portion 261 including a region to which the other end of the bonding wire 51 is joined. The resistance adjustment unit 26*lou* has a second portion 262 including a region to which the other end of the bonding wire 50 is joined. One end of a bonding wire 53 for connecting the resistance adjustment unit 26*lou* and the semiconductor chip 21*cu* is joined to the second portion 262 of the resistance adjustment unit 26*lou*. The other end of the bonding wire 53 is joined to a gate pad 204 of the semiconductor chip 21*cu*. The resistance adjustment unit 26*lou* has a third portion 263 formed integrally with the first portion 261 and the second portion 262 between the first portion 261 and the second portion 262. The resistance adjustment unit 26*lou* has a fourth portion 264 including a region to which one end of a bonding wire 54 for connecting to the semiconductor chip 21*du* is joined. The other end of the bonding wire 54 is joined to a gate pad 204 of the semiconductor chip 21*du*. The resistance adjustment unit 26*lou* has the third portion 263 between the first portion 261 and the fourth portion 264. The resistance adjustment unit 26*lou* has a fifth portion 265 including a region to which one end of a bonding wire 55 for connecting to the semiconductor chip 21*fu* is joined. The other end of the bonding wire 55 is joined to a gate pad 204 of the semiconductor chip 21*fu*. The resistance adjustment unit 26*lou* has a sixth portion 266 formed integrally with the first portion 261 and the fifth portion 265 between the first portion 261 and the fifth portion 265. Incidentally, in FIG. 13, for convenience of explanation, a broken line is attached to the resistance adjustment unit 26*lou*, and the boundary between the first portion 261 and the third portion 263, the boundary between the second portion 262 and the third portion 263, the boundary between the third portion 263 and the fourth portion 264, the boundary between the first portion 261 and the sixth portion 266, and the boundary between the fifth portion 265 and the sixth portion 266 are illustrated.

The relay patterns 27*lou*a and 27*lou*b are configured by a conductive pattern formed on the laminated substrate 111*u* with a conductive material (for example, copper). The relay patterns 27*lou*a and 27*lou*b have, for example, a rectangular shape in the plan view of the laminated substrate 111*u*. The relay pattern 27*lou*a is arranged between the semiconductor chip 21*cu* and the semiconductor chip 21*du*. The relay pattern 27*lou*a is arranged so that the long sides thereof run along direction in which the semiconductor chip 21*cu* and the semiconductor chip 21*du* are aligned. For example, the relay pattern 27*lou*a is arranged between the semiconductor chip 21*cu* and the semiconductor chip 21*du* so that the distance from one end in the longitudinal direction to the semiconductor chip 21*cu* and the distance from the other end in the longitudinal direction to the semiconductor chip 21*du* are substantially equal.

An emitter connection terminal 25E provided in the terminal group 25*lou* and the relay pattern 27*lou*a are connected by a bonding wire 52*d*. One end of the bonding wire 52*d* is joined to the emitter connection terminal 25E. The other end of the bonding wire 52*d* is joined to substantially the central portion of the relay pattern 27*lou*a. One end of a bonding wire 57*d* is joined to one end of the relay pattern 27*lou*a on the semiconductor chip 21*cu* side. The other end of the bonding wire 57*d* is joined to a part of an emitter electrode 206 (see FIG. 6) which is provided in the semiconductor chip 21*cu* and serves as an emitter terminal E. One end of a bonding wire 56*d* is joined to the end of the relay pattern 27*lou*a on the semiconductor chip 2*ldu* side. The other end of the bonding wire 56*d* is joined to a part of an emitter electrode (not illustrated) which is provided in the semiconductor chip 21*du* and serves as an emitter terminal E (see FIG. 14). The bonding wire 56*d* and the bonding wire 57*d* have, for example, substantially the same length as each other.

Thus, the emitter terminal E (see FIG. 8) of the IGBT 21Q provided in each of the semiconductor chip 21*cu* and the semiconductor chip 21*du* is connected to the emitter connection terminal 25E via the bonding wire 52*d*. Further, as described above, the relay pattern 27*lou*a is arranged so as to be substantially equidistant from the semiconductor chip 21*cu* and the semiconductor chip 21*du*, the other end of the bonding wire 52*d* is joined to substantially the center of the relay pattern 27*lou*, and the bonding wire 56*d* and the bonding wire 57*d* have substantially the same length as each other. Consequently, the resistance value between the IGBT 21Q provided in the semiconductor chip 21*cu* and the emitter connection terminal 25E and the resistance value between the IGBT 21Q provided in the semiconductor chip 21*du* and the emitter connection terminal 25E become substantially the same magnitude.

The emitter connection terminal 25E provided in the terminal group 25*lou* and the relay pattern 27*lou*b are connected by a bonding wire 52*f*. One end of the bonding wire 52*f* is joined to the emitter connection terminal 25E. The other end of the bonding wire 52*f* is joined to substantially the central portion of the relay pattern 27*lou*b. One end of a bonding wire 56*f* is joined to the end of the relay pattern 27*lou*b on the semiconductor chip 21*fu* side. The other end of the bonding wire 56*f* is joined to a part of an emitter electrode (not illustrated) which is provided in the semiconductor chip 21*fu* and serves as an emitter terminal E. The bonding wire 56*f* has substantially the same length as the bonding wire 56*d* and the bonding wire 57*d*.

As described above, the relay pattern 27*lou*a is arranged so as to be substantially equidistant from the semiconductor chip 21*cu* and the semiconductor chip 21*du*, the other end of the bonding wire 52*d* is joined to substantially the center of the relay pattern 27*lou*a, and the bonding wire 56*d* and the bonding wire 57*d* have approximately the same length as each other. Further, the emitter terminal E of the IGBT 21Q of the semiconductor chip 21*fu* is connected to the emitter connection terminal 25E via the bonding wire 52*f*. In addition, as described above, the distance between the relay pattern 27*lou*b and the semiconductor chip 21*fu* is arranged so as to be substantially equal to the distance between the relay pattern 27*lou*a and the semiconductor chip 21*cu*, the other end of the bonding wire 52*f* is joined to substantially the center of the relay pattern 27*lou*b, and the bonding wire 56*f* has substantially the same length as the bonding wire 56*d* and the bonding wire 57*d*. Thus, the resistance value between the IGBT 21Q provided in the semiconductor chip 21*cu* and the emitter connection terminal 25E, the resistance value between the IGBT 21Q provided in the semiconductor chip 21*du* and the emitter connection terminal 25E, and the resistance value between the IGBT 21Q provided in the semiconductor chip 21*fu* and the emitter connection terminal 25E become substantially the same magnitude.

In the semiconductor module 2 according to this embodiment, the first gate signal input terminal 25G1 and the IGBT 21Q provided in the semiconductor chip 21*cu* are connected by the first connection route RT1 which is configured by the bonding wire 51, the first portion 261, the third portion 263, and the second portion 262 of the resistance adjustment unit 26*lou*, and the bonding wire 53.

In the semiconductor module 2 according to this embodiment, the second gate signal input terminal 25G2 and the IGBT 21Q provided in the semiconductor chip 21*cu* are connected by the second connection route RT2 which is configured by the bonding wire 50, the second portion 262 of the resistance adjustment unit 26*lou*, and the bonding wire 53.

Further, in the semiconductor module 2 according to this embodiment, the first gate signal input terminal 25G1 and the IGBT 21Q provided in the semiconductor chip 21du are connected by the third connection route RT3 which is configured by the bonding wire 51, the first portion 261, the third portion 263, and the fourth portion 264 of the resistance adjustment unit 26lou, and the bonding wire 54.

In the semiconductor module 2 according to this embodiment, the second gate signal input terminal 25G2 and the IGBT 21Q provided in the semiconductor chip 21du are connected by the fourth connection route RT4 which is configured by the bonding wire 50, the second portion 262, the third portion 263, and the fourth portion 264 of the resistance adjustment unit 26lou, and the bonding wire 54.

Further, in the semiconductor module 2 according to this embodiment, the first gate signal input terminal 25G1 and the IGBT 21Q provided in the semiconductor chip 21fu are connected by the fifth connection route RT5 which is configured by the bonding wire 51, the first portion 261, the sixth portion 266, and the fifth portion 265 of the resistance adjustment unit 26lou, and the bonding wire 55.

In the semiconductor module 2 according to this embodiment, the second gate signal input terminal 25G2 and the IGBT 21Q provided in the semiconductor chip 21fu are connected by the sixth connection route RT6 which is configured by the bonding wire 50, the second portion 262, the third portion 263, the first portion 261, the sixth portion 266, and the fifth portion 265 of the resistance adjustment unit 26lou, and the bonding wire 55.

The lengths of the first connection route RT1, the third connection route RT3, and the fifth connection route RT5 are approximately the same. Further, the lengths of the second connection route RT2, the fourth connection route RT4, and the sixth connection route RT6 are different from each other.

Thus, the plurality of voltage-controlled switching elements provided in the semiconductor module 2 have the IGBT 21Q (an example of the first voltage-controlled switching element) provided in the semiconductor chip 21cu and the IGBT 21Q (an example of the second voltage-controlled switching element) provided in the semiconductor chip 21du. Further, the plurality of voltage-controlled switching elements provided in the semiconductor module 2 have the IGBT 21Q (an example of a third voltage-controlled switching element) provided in the semiconductor chip 21fu.

The first connection route group RTG1 on the low side has as a plurality of connection routes, the first connection route RT1 connecting the external terminal Galou provided in the terminal group 25lou and the IGBT 21Q provided in the semiconductor chip 21cu, and the third connection route RT3 connecting the external terminal Galou and the IGBT 21Q provided in the semiconductor chip 21du. Further, the first connection route group RTG1 has as a plurality of connection routes, the fifth connection route RT5 connecting the external terminal Galou provided in the terminal group 25lou and the IGBT 21Q provided in the semiconductor chip 21cu.

The second connection route group RTG2 on the low side has as a plurality of connection routes, the second connection route RT2 connecting the external terminal Gblou provided in the terminal group 25lou and the IGBT 21Q provided in the semiconductor chip 21cu, and the fourth connection route RT4 connecting the external terminal Galou and the IGBT 21Q provided in the semiconductor chip 21du. Further, the second connection route group RTG2 has as a plurality of connection routes, the sixth connection route RT6 connecting the external terminal Gblou provided in the terminal group 25lou and the IGBT 21Q provided in the semiconductor chip 21fu. In the semiconductor module 2, the resistance value of the fifth connection route RT5 and the resistance value of the sixth connection route RT6 on the low side are different from each other.

Each part of the second connection route RT2, the fourth connection route RT4, and the sixth connection route RT6 is a part of the resistance adjustment unit 26lou. Thus, the second connection route group RTG2 has the resistance adjustment unit 26lou which changes the mutual resistance values of the second connection route RT2, the fourth connection route RT4, and the sixth connection route RT6 (an example of a plurality of connection routes) provided in the second connection route group RTG2 and is common to the second connection route RT2, the fourth connection route RT4, and the sixth connection route RT6. Each part of the first connection route RT1, the third connection route RT3, and the fifth connection route RT5 is a part of the resistance adjustment unit 26lou. In this embodiment, the first connection route RT1, the third connection route RT3, and the fifth connection route RT5 are formed to have the same length as each other, but can be of different lengths (i.e., different resistance values) from each other by changing the position where the bonding wire 51 is joined to the resistance adjustment unit 23lou. Thus, the first connection route group RTG1 can have the resistance adjustment unit 26lou which adjusts the mutual resistance values of the first connection route RT1, the third connection route RT3, and the fifth connection route RT5 (an example of a plurality of connection routes) provided in the first connection route group RTG1 and is common to the first connection route RT1, the third connection route RT3, and the fifth connection route RT5.

The connection of the external terminal Galou or the external terminal Gblou, the first connection route RT1 to the sixth connection route RT6, and the semiconductor chips 21cu, 21du, and 21fu will be described using a circuit diagram. FIG. 14 is a circuit diagram on the low side illustrated in FIG. 13 of the laminated substrate 111u. In FIG. 14, for ease of understanding, the first connection route RT1 to the sixth connection route RT6 are represented by circuit symbols of resistance elements, and the gate drive unit 31 and the like connected to the laminated substrate 111u and provided outside the case 10 (see FIG. 1) are also illustrated.

Figure 14:
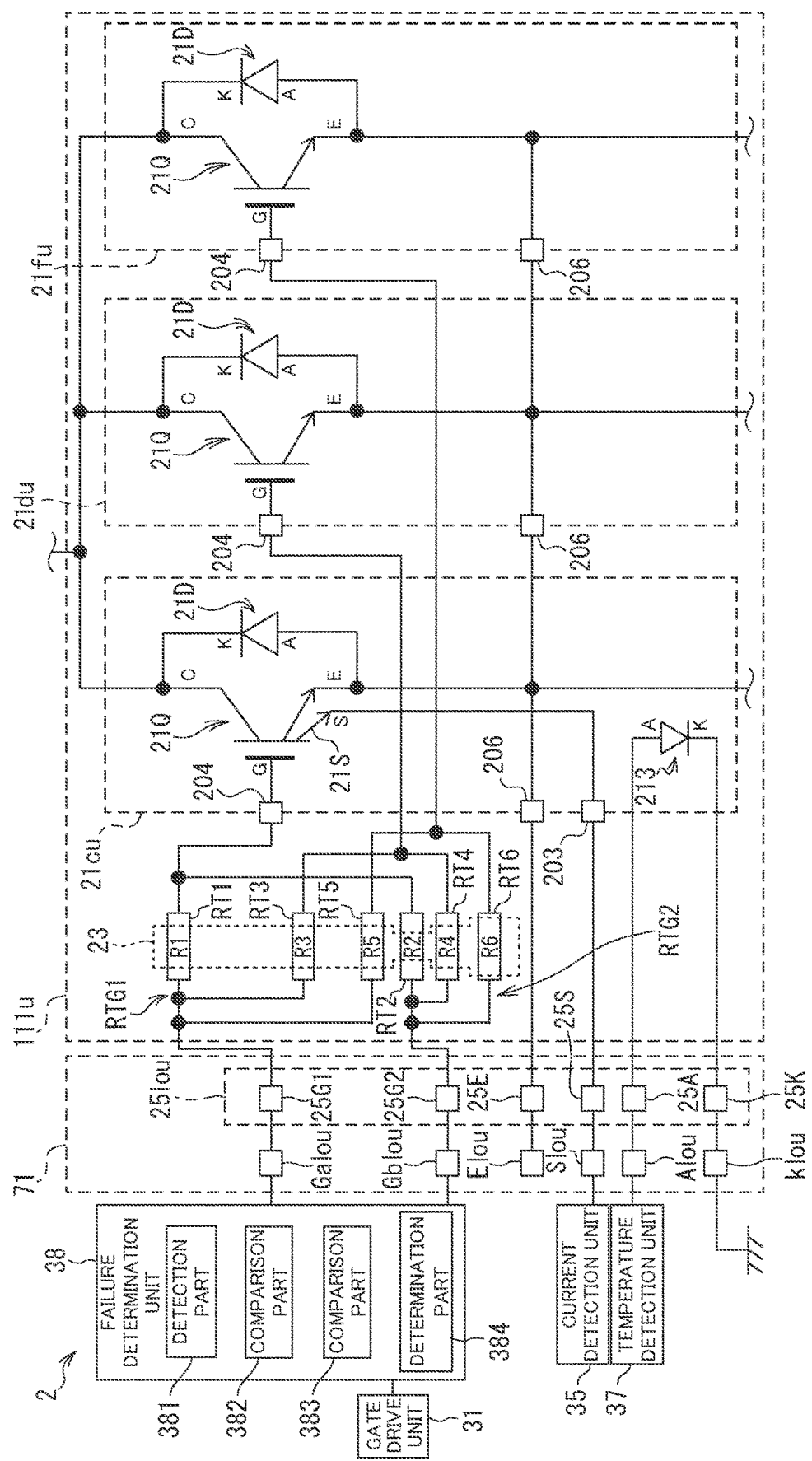
FIG. 14 is a circuit diagram for explaining the connection between the semiconductor chip and signal input terminals provided in the semiconductor module according to the second embodiment of the present invention.

As illustrated in FIG. 14, the semiconductor module 2 includes a plurality of (three in FIG. 14) IGBTs (an example of a plurality of voltage-controlled switching elements) 21Q connected in parallel, switching of which being controlled by a gate voltage (an example of a drive voltage) based on a gate signal (an example of an input signal). As described above, the IGBT 21Q is provided in each of the semiconductor chip 21cu, the semiconductor chip 21du, and the semiconductor chip 21fu. Since the connection between the external terminal Galou and the external terminal Gblou and the semiconductor chip 21cu and the semiconductor chip 21du is the same as in FIG. 8, the description thereof will be omitted.

A gate terminal G of the semiconductor chip 21fu is connected to a gate pad 204 of the semiconductor chip 21fu. The gate pad 204 of the semiconductor chip 21fu is connected to the fifth connection route RT5. The fifth connection route RT5 is connected to the first gate signal input terminal 25G1 of the terminal group 25lou. Therefore, the gate terminal G of the semiconductor chip 21fu is connected to the first gate signal input terminal 25G1 via the fifth connection route RT5.

The semiconductor module 2 includes a failure determination unit 38 which determines whether or not a failure has occurred in any of the IGBTs 21Q (an example of a plurality of voltage-controlled switching elements) provided in the semiconductor chip 21cu, the semiconductor chip 21du, and the semiconductor chip 21fu respectively on the basis of the relationship between the gate current (an example of current) flowing through the second gate signal input terminal 25G2 and the gate voltage (an example of voltage) of the second gate signal input terminal 25G2. The failure determination unit 38 is arranged between the gate drive unit 31 and the external terminal Gblou.

(Failed Element Determination Method for Semiconductor Modules)

Next, description will be made about a failed element determination method for the semiconductor chips 21cu, 21du, and 21fu in the semiconductor module 2 according to this embodiment using FIG. 15 while referring to FIGS. 13 and 14.

In the failed element determination method for the semiconductor module 2 according to this embodiment, the current flowing through the external terminal Gblou is compared with a predetermined comparative current value to determine whether or not a failure has occurred in any of the IGBTs 21Q provided in the semiconductor chips 21au, 21bu, 21cu, 21du, 21eu, and 21fu respectively.

Figure 15:
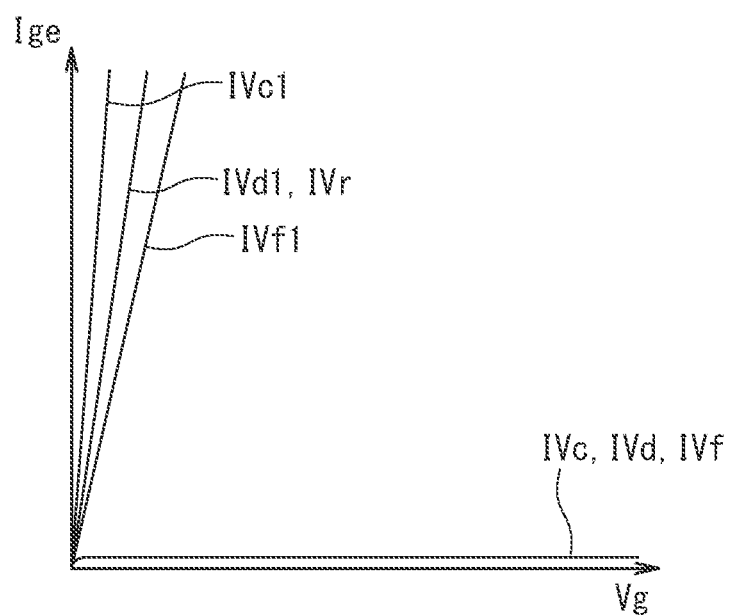
FIG. 15 is a diagram schematically illustrating IV characteristics at signal input terminals where IGBTs provided in the semiconductor chips provided in the semiconductor module according to the first embodiment of the present invention and connected in parallel fail.

FIG. 15 is a diagram schematically illustrating the characteristics of a gate-emitter current Ige (hereinafter, may be referred to as "IV characteristics") with respect to the gate voltage Vg of the IGBT 21Q provided in each of the semiconductor chips 21cu, 21du, and 21fu. "IVc" illustrated in FIG. 15 indicates the IV characteristics of the IGBT 21Q when the IGBT 21Q provided in the semiconductor chip 21cu has not failed. "IVd" illustrated in FIG. 15 indicates the IV characteristics of the IGBT 21Q when the IGBT 21Q provided in the semiconductor chip 21du has not failed. "IVf" illustrated in FIG. 15 indicates the IV characteristics of the IGBT 21Q when the IGBT 21Q provided in the semiconductor chip 21fu has not failed. "IVc1" illustrated in FIG. 15 indicates the IV characteristics of the IGBT 21Q obtained at the external terminal Gblou when the IGBT 21Q provided in the semiconductor chip 21cu fails. "IVd1" illustrated in FIG. 15 indicates the IV characteristics of the IGBT 21Q obtained at the external terminal Gblou when the IGBT 21Q provided in the semiconductor chip 21du fails. "IVf1" illustrated in FIG. 15 indicates the IV characteristics of the IGBT 21Q obtained at the external terminal Gblou when the IGBT 21Q provided in the semiconductor chip 21fu fails. "IVr" illustrated in FIG. 15 indicates comparative IV characteristics compared with the IV characteristics at the external terminal Gblou in the failure determination unit 38. The horizontal axis of the graph illustrated in FIG. 15 indicates the gate voltage Vg applied to the gate terminal G of the IGBT 21Q, and the vertical axis of the graph indicates the gate-emitter current Ige of the IGBT 21Q.

As described above, the second gate signal input terminal 25G2 and the gate pad 204 of the semiconductor chip 21cu are connected by the second connection route RT2. The second connection route RT2 is configured by the bonding wire 50, the second portion 262 of the resistance adjustment unit 26lou, and the bonding wire 53. The second gate signal input terminal 25G2 and the gate pad 204 of the semiconductor chip 21du are connected by the fourth connection route RT4. The fourth connection route RT4 is configured by the bonding wire 50, the second portion 262, the third portion 263, and the fourth portion 264 of the resistance adjustment unit 26lou, and the bonding wire 54. Therefore, assuming that the bonding wire 53 and the bonding wire 54 have substantially the same length, the second connection route RT2 is shorter than the fourth connection route RT4 by the length (i.e., the combined length of the third portion 263 and the fourth portion 264) from the other end of the bonding wire 50 of the second portion 262 to the other end of the bonding wire 54 of the fourth portion 264.

The second gate signal input terminal 25G2 and the gate pad 204 of the semiconductor chip 21fu are connected by the sixth connection route RT6. The sixth connection route RT6 is configured by the bonding wire 50, the second portion 262, the third portion 263, the first portion 261, the sixth portion 266, and the fifth portion 265 of the resistance adjustment unit 26lou, and the bonding wire 55. Therefore, assuming that the bonding wire 54 and the bonding wire 55 have substantially the same length, the fourth connection route RT4 is shorter than the sixth connection route RT6 by the lengths of the first portion 261 and the sixth portion 266.

Consequently, the second connection route RT2 becomes smaller in resistance value than the fourth connection route RT4. Further, the fourth connection route RT4 becomes smaller in resistance value than the sixth connection route RT6. Then, the fourth connection route RT4 has substantially the same length as the first connection route RT1 and has substantially the same resistance value as that. Here, as illustrated in FIG. 14, assuming that the resistance values of the first connection route RT1 to the sixth connection route RT6 are "R1" to "R6" respectively, the second connection route RT2 and the fourth connection route RT4 have a relationship of "R2>R4", and the fourth connection route RT4 and the sixth connection route RT6 have a relationship of "R4>R6". In this embodiment, the resistance adjustment unit 26lou is formed to adjust the resistance value so that most of the difference in resistance value (R2-R4) between the second connection route RT2 and the fourth connection route RT4 is occupied by the resistance value from the other end of the bonding wire 50 of the second portion 262 to the other end of the bonding wire 54 of the fourth portion 264.

Incidentally, the first connection route RT1, the third connection route RT3, and the fifth connection route RT5 have substantially the same length and have substantially the same resistance value. Thus, when the resistance values of the first connection route RT1, the third connection route RT3, and the fifth connection route RT5 are set to substantially the same value, it is effective when the semiconductor module 2 is normally operated. During the normal operation, the gate signal is input to the semiconductor chips 21cu, 21du, and 21fu using only the external terminal Galou. By setting the resistance values of the first connection route RT1, the third connection route RT3, and the fifth connection route RT5 to substantially the same value, it is possible to suppress the deviation between the operations of the three semiconductor chips 21cu, 21du, and 21fu.

As described above, when the IGBT 21Q is not out of order, the current input to the gate terminal G of the IGBT 21Q hardly flows to the emitter terminal E. As a result, as illustrated by the characteristics IVc, the characteristics IVd, and the characteristics IVf in FIG. 15, when a failure (for example, a short-circuit failure between the gate and the emitter) has not occurred in the IGBT 21Q provided in each of the semiconductor chips 21cu, 21du, and 21fu, the gate-emitter current Ige hardly flows and hardly changes even if the gate voltage Vg applied to these gate terminals G changes.

On the other hand, when the failure (for example, the short circuit failure between the gate and the emitter) occurs in any of the IGBTs 21Q, the current flows from the gate terminal G of the failed IGBT 21Q toward the emitter terminal E. Specifically, when a gate voltage of a predetermined value is output from the gate drive unit 31, the gate voltage is applied to the gate terminal G of the IGBT 21Q provided in the semiconductor chip 21*cu* via the second connection route RT2, applied to the gate terminal G of the IGBT 21Q provided in the semiconductor chip 21*du* via the fourth connection route RT4, and applied to the gate terminal G of the IGBT 21Q provided in the semiconductor chip 21*fu* via the sixth connection route RT6.

The gate current output from the gate drive unit 31 is input to the external terminal Gblou via the failure determination unit 38. The second connection route T2 is smaller in resistance value than the fourth connection route RT4 and the sixth connection route RT6. Therefore, in the case where the IGBT 21Q of the semiconductor chip 21*cu* fails and a current path for the current to flow from the gate terminal G to the emitter terminal E is generated, the gate current passing through the external terminal Gblou becomes larger than that in the case where the IGBT 21Q of the semiconductor chip 21*du* and the IGBT 21Q of the semiconductor chip 21*fu* fail and a current path for the current to flow from the gate terminal G to the emitter terminal E is generated.

Therefore, as illustrated in FIG. 15, the characteristics IVc1 when the IGBT 21Q provided in the semiconductor chip 21*cu* fails become larger in inclination than the characteristics IVd1 when the IGBT 21Q provided in the semiconductor chip 21*du* fails and the characteristics IVf1 when the IGBT 21Q provided in the semiconductor chip 21*fu* fails. The failure determination unit 38 compares the current (gate current) with respect to the voltage (gate voltage) at the external terminal Gblou with the current with respect to the voltage at the characteristics IVr. Consequently, the failure determination unit 38 determines whether or not the IGBT 21Q provided in any of the semiconductor chip 21*cu*, the semiconductor chip 21*du*, and the semiconductor chip 21*fu* is out of order.

Specifically, as illustrated in FIG. 15, the inclination of the characteristics IVr being the comparative IV characteristics is set to be smaller than that of the characteristics IVr1 and almost equal to that of the characteristics IVd1 and to be larger than that of the characteristics IVf1. Therefore, when the gate current passing through the external terminal Gblou is almost equal to the current obtained from the characteristics IVr, the failure determination unit 38 determines that the semiconductor chip 21*du* is out of order. Here, when the gate current passing through the external terminal Gblou is within a predetermined range with respect to the characteristics IVr, the failure determination unit 38 determines that the gate current is almost equal to the current obtained from the characteristics IVr. Further, when the gate current passing through the external terminal Gblou is larger than the maximum current in the predetermined range with respect to the characteristics IVr, the failure determination unit 38 determines that the semiconductor chip 21*cu* has failed. Further, when the gate current passing through the external terminal Gblou is smaller than the minimum current in the predetermined range with respect to the characteristics IVr, the failure determination unit 38 determines that the semiconductor chip 21*cu* has failed.

Returning to FIG. 14, the failure determination unit 38 has a detection part 381 which detects the current value of the current input from the gate drive unit 31 and output to the external terminal Gblou. The failure determination unit 38 has a comparison part 382 which compares a current value detected by a detection part 381 with a current value (comparative current value) obtained from a predetermined range with respect to the characteristics IVr (see FIG. 15). The failure determination unit 38 has a comparison part 383 which compares the current value (target current value) detected by the detection part 381 with a reference current value based on the maximum current flowing through the gate terminal G when the IGBT has not failed. Incidentally, the comparative current value can be set in advance and stored in a storage part (not illustrated) in the failure determination unit 38.

Further, the failure determination unit 38 has a determination part 384 which determines a semiconductor chip in which a failure has occurred. When the comparison part 383 determines that the target current value is larger than the reference current value, and the comparison part 382 determines that the target current value is larger than the comparative current value (more specifically, the maximum value in the predetermined range of the comparative current value), the determination part 384 determines that the IGBT 21Q provided in the semiconductor chip 21*cu* is out of order and that the semiconductor chip 21*cu* is a failed chip. When the comparison part 383 determines that the target current value is larger than the reference current value, and the comparison part 382 determines that the target current is about the same as the comparative current value (more specifically, within the predetermined range of the comparative current value), the determination part 384 determines that the IGBT 21Q provided in the semiconductor chip 21*du* has failed and that the semiconductor chip 21*du* is a failed chip. When the comparison part 383 determines that the target current value is larger than the reference current value, and the comparison part 382 determines that the target current is smaller than the comparative current value (more specifically, the minimum value in the predetermined range of the comparative current value), the determination part 384 determines that the IGBT 21Q provided in the semiconductor chip 21*fu* is out of order and that the semiconductor chip 21*fu* is a failed chip. Further, when the comparison part 383 determines that the target current value is the same as or smaller than the reference current value, the determination part 384 determines that any of the IGBTs 21Q provided in the semiconductor chips 21*cu*, 21*du*, and 21*fu* is not out of order, and that the semiconductor chips 21*cu*, 21*du*, and 21*fu* are not failed chips.

Thus, the semiconductor module 2 can determine whether or not any of the semiconductor chips 21*cu*, 21*du*, and 21*fu* is out of order by making different the resistance value of the second connection route RT2, the resistance value of the fourth connection route RT4, and the resistance value of the sixth connection route RT6 in the case where the three semiconductor chips 21*cu*, 21*du*, and 21*fu* are connected in parallel.

Similarly to the first embodiment, a detection part detecting the current flowing through the external terminal Galou is further provided in the failure determination unit 38, and the current flowing through the external terminal Galou can also be used as the comparative current value.

Further, as the comparative current value, one characteristics IVr is used in the above description, but two or more comparative current values may be used. For example, when two comparative current values are used, such a current value as to have an inclination between the characteristics IVc1 and the characteristics IVd1 and such a current value as to have an inclination between the characteristics IVd1 and the characteristics IVf1 are used as the two comparative current values, for example.

Although detailed description is omitted, the configuration on the high side and the failed element determination method are similar to the configuration on the low side and the failed element determination method where the semiconductor chip 21*cu* is read as the semiconductor chip 21*au*, the semiconductor chip 21*du* is read as the semiconductor chip 21*bu*, the semiconductor chip 21*fu* is read as the semiconductor chip 21*eu*, and the resistance adjustment unit 26*lou* is read as the resistance adjustment unit 26*upu*.

Although the illustration and detailed description are omitted, it is possible to determine by using the same method as the U phase, whether or not a failure occurs even in each of the three semiconductor chips on the high side and the three semiconductor chips on the low side, which are provided in the V phase, and the three semiconductor chips on the high side and the three semiconductor chips on the low side, which are provided in the W phase.

As described above, the semiconductor module 2 according to this embodiment includes the IGBT 21Q, for example, provided in the each of semiconductor chips 21*cu*, 21*du*, and 21*fu* connected in parallel, switching of which being controlled by the gate voltage based on the gate signal, and the external terminals Galou and Gblou input with the gate signal. The semiconductor module 2 has the first connection route group RTG1 having the first connection route RT1, the third connection route RT3, and the fifth connection route RT5 connecting the external terminal Galou and the IGBT 21Q provided in each of the semiconductor chips 21*cu*, 21*du*, and 21*fu*, and the second connection route group RTG2 having the second connection route RT2, the fourth connection route RT4, and the sixth connection route RT6 connecting the external terminal Gblou and the IGBT 21Q provided in each of the semiconductor chips 21*cu*, 21*du*, and 21*fu*.

With such a configuration, the semiconductor module 2 can determine a semiconductor chip in which a short-circuit failure has occurred without being disassembled.

Third Embodiment

A semiconductor module according to a third embodiment of the present invention will be described with reference to FIG. 16. The semiconductor module 3 according to this embodiment has the same configuration as the semiconductor module 2 according to the second embodiment except that the number of semiconductor chips connected in parallel differs, a laminated substrate differs due to the different number of semiconductor chips, the shape of a resistance adjustment unit differs, the number of connection routes differs, and a method of determining the semiconductor chip in which a failure has occurred differs. Therefore, in the description of the semiconductor module 3 according to this embodiment, the same reference numerals are given to the components having the same operations and functions as those of the semiconductor module 2 according to the second embodiment, and the description thereof will be omitted.

A case of the semiconductor module 3 according to this embodiment becomes larger as the number of semiconductor chips increases as compared with the case 10 of the semiconductor module 1 according to the first embodiment. Further, the semiconductor module 3 has in the U phase, semiconductor chips 21*au*, 21*bu*, 21*cu*, 21*du*, 21*eu*, 21*fu*, 21*gu*, and 21*hu* (see FIG. 16) having the same configuration as the semiconductor chip 21*au* in the first embodiment. In addition, the semiconductor module 3 includes the same number of semiconductor chips as the U phase in the V phase and the W phase, respectively. The case, the semiconductor chips and the laminated substrate included in the semiconductor module 3 will be described with reference to the drawings relating to the case, the semiconductor chips, and the laminated substrate in the first embodiment and the second embodiment according to need.

(Configuration of Connection Route Connecting Voltage-Controlled Switching Element and Signal Input Terminal)

The configuration of a connection route connecting a voltage-controlled switching element and a signal input terminal in the semiconductor module 3 according to this embodiment will be described with reference to FIG. 16. The configuration of the connection route connecting the voltage-controlled switching element and the signal input terminal in the semiconductor module 3 according to this embodiment will be described by taking the connection route in the U phase as an example.

Figure 16:
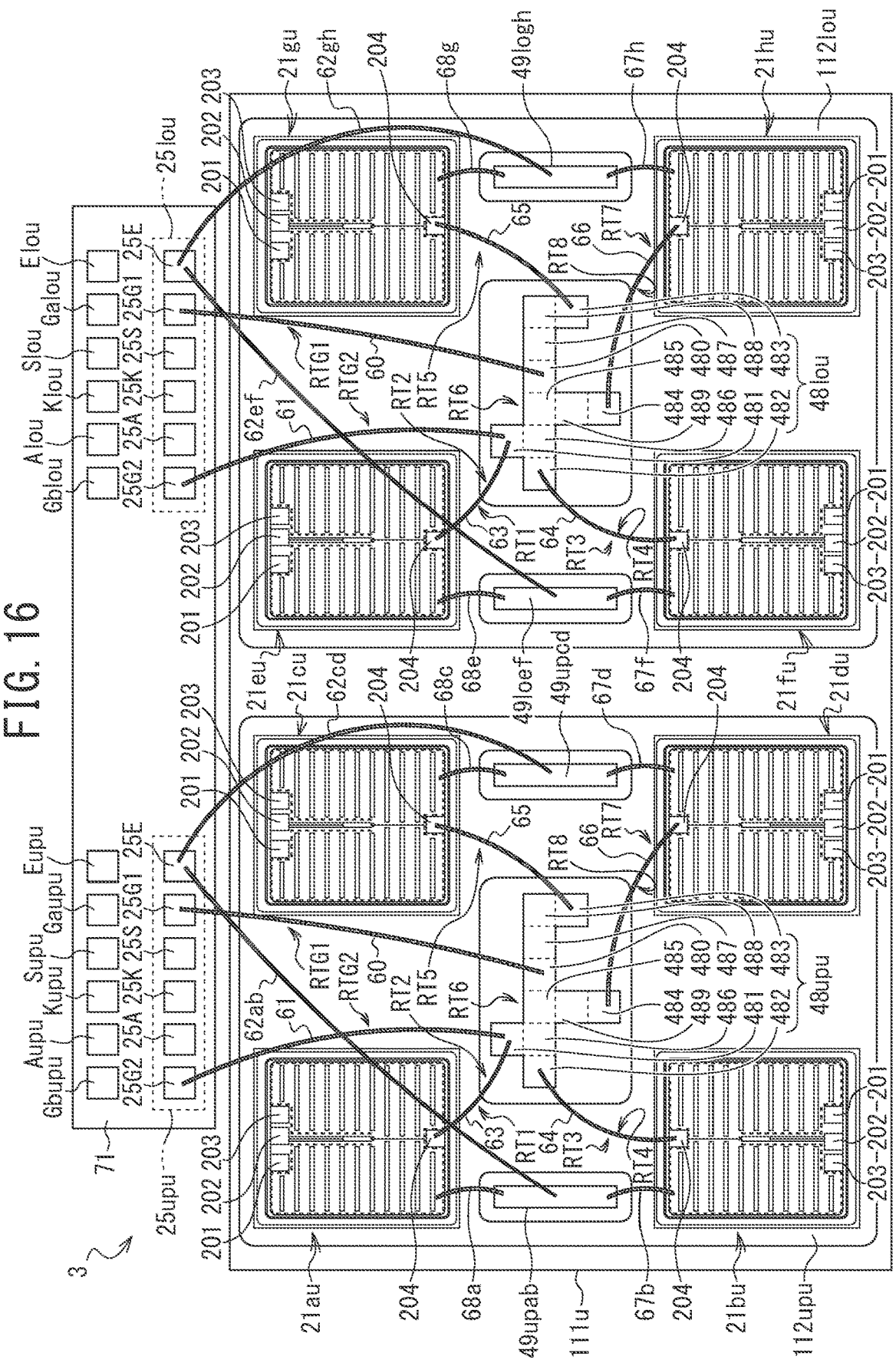
FIG. 16 is a plan view schematically illustrating a schematic configuration of semiconductor chips provided in a semiconductor module according to a third embodiment of the present invention.

As illustrated in FIG. 16, a high-side terminal group 25*upu* and a low-side terminal group 25*lou* in this embodiment have a first gate signal input terminal 25G1 and a second gate signal input terminal 25G2, respectively as in the second embodiment. Incidentally, in this embodiment, each of a terminal group 25*upv*, a terminal group 25*lov*, a terminal group 25*upw*, and a terminal group 25*low* (see FIG. 1) has 6 terminals in a manner similar to the terminal group 25*upu* and the terminal group 25*lou*. Incidentally, the arrangement position of the terminal may be different between the high side and the low side.

As illustrated in FIG. 16, the semiconductor module 3 includes IGBT 21Q (an example of a plurality of voltage-controlled switching elements, see FIG. 14) provided in each of the semiconductor chip 21*au*, the semiconductor chip 21*ub*, the semiconductor chip 21*cu*, and the semiconductor chip 21*du* connected in parallel, switching of which being controlled by a gate voltage (an example of a drive voltage) based on a gate signal (an example of an input signal). The IGBT 21Q provided in the semiconductor chip 21*au*, the IGBT 21Q provided in the semiconductor chip 21*bu*, the IGBT 21Q provided in the semiconductor chip 21*cu*, and the IGBT 21Q provided in the semiconductor chip 21*du* are connected in parallel to each other.

The semiconductor module 3 includes an external terminal Gaupu (an example of a first external terminal) and an external terminal Gbupu (an example of a second external terminal) input with the gate signal and provided in the terminal group 25*upu*. The semiconductor module 3 includes a first connection route group RTG1 having a first connection route RT1, a third connection route RT3, a fifth connection route RT5, and a seventh connection route RT7 (an example of a plurality of connection routes) connecting the external terminal Gaupu and the IGBT 21Q provided in each of the semiconductor chips 21*au*, 21*bu*, 21*cu*, and 21*du*. Further, the semiconductor module 3 includes a second connection route group RTG2 having a second connection route RT2, a fourth connection route RT4, a sixth connection route RT6, and an eighth connection route RT8 (an example of a plurality of connection routes) connecting the external terminal Gbupu and the IGBT 21Q provided in each of the semiconductor chips 21*au*, 21*bu*, 21*cu*, and 21*du*.

The semiconductor module 3 includes IGBT 21Q (an example of a plurality of voltage-controlled switching elements) provided in each of the semiconductor chip 21*eu*, the semiconductor chip 21*fu*, the semiconductor chip 21*gu*, and the semiconductor chip 21*hu* connected in parallel, switching of which being controlled by the gate voltage based on the gate signal. The IGBT 21Q provided in the semiconductor chip 21*eu*, the IGBT 21Q provided in the semiconductor chip 21*fu*, the IGBT 21Q provided in the semiconductor chip 21*gu*, and the IGBT 21Q provided in the semiconductor chip 21*hu* are connected in parallel with each other.

The semiconductor module 3 includes an external terminal Galou (an example of a first external terminal) and an external terminal Gblou (an example of a second external terminal) input with a gate signal and provided in the terminal group 25*lou*. The semiconductor module 3 includes a first connection route group RTG1 having a first connection route RT1, a third connection route RT3, a fifth connection route RT5, and a seventh connection route RT7 (an example of a plurality of connection routes) connecting the external terminal Galou and the IGBT 21Q provided in each of the semiconductor chips 21*eu*, 21*fu*, 21*gu*, and 21*hu*. Further, the semiconductor module 3 includes a second connection route group RTG2 having a second connection route RT2, a fourth connection route RT4, a sixth connection route RT6, and an eighth connection route RT8 (an example of a plurality of connection routes) connecting the external terminal Gblou and the IGBT 21Q provided in each of the semiconductor chips 21*eu*, 21*fu*, 21*gu*, and 21*hu*.

As illustrated in FIG. 16, the laminated substrate 111*u* includes a wiring pattern 112*upu* on which the semiconductor chips 21*au*, 21*bu*, 21*cu*, and 21*du* on the high side are mounted, and a wiring pattern 112*lou* on which the semiconductor chips 21*eu*, 21*fu*, 21*gu*, and 21*hu* on the low side are mounted. Therefore, the plurality of voltage-controlled switching elements on the high side in this embodiment include the IGBT 21Q (an example of a first voltage-controlled switching element) provided in the semiconductor chip 21*au*, the IGBT 21Q (an example of a second voltage-controlled switching element) provided in the semiconductor chip 21*bu*, and the IGBT 21Q (an example of a third voltage-controlled switching element) provided in the semiconductor chip 21*cu*. Further, the plurality of voltage-controlled switching elements on the high side in this embodiment include the IGBT 21Q (an example of a fourth voltage-controlled switching element) provided in the semiconductor chip 21*du*.

Similarly, the plurality of voltage-controlled switching elements on the low side in this embodiment include the IGBT 21Q (an example of the first voltage-controlled switching element) provided in the semiconductor chip 21*eu*, the IGBT 21Q (an example of the second voltage-controlled switching element) provided in the semiconductor chip 21*fu*, and the IGBT 21Q (an example of the third voltage-controlled switching element) provided in the semiconductor chip 21*gu*. Further, the plurality of voltage-controlled switching elements on the low side in this embodiment include the IGBT 21Q (an example of the fourth voltage-controlled switching element) provided in the semiconductor chip 21*hu*.

The laminated substrate 111*u* includes a resistance adjustment unit 48*upu* on the high side and a resistance adjustment unit 48*lou* on the low side. The laminated substrate 111*u* includes relay patterns 49*upab* and 49*upcd* on the high side and relay patterns 49*loef* and 49*logh* on the low side. The relay patterns 49*upab* and 49*upcd* on the high side and the relay patterns 49*loef* and 49*logh* on the low side have the same configuration. Therefore, the configuration of the relay patterns 49*upab* and 49*upcd* on the high side and the relay patterns 49*loef* and 49*logh* on the low side will hereinafter be described by taking as an example, the connection route of the terminal group 25*lou*, the semiconductor chips 21*eu*, 21*fu*, 21*gu*, and 21*hu*, the resistance adjustment unit 48*lou*, and the relay patterns 49*loef* and 49*logh* on the low side.

As illustrated in FIG. 16, one end of a bonding wire 60 is bonded to the first gate signal input terminal 25G1. The other end of the bonding wire 60 is joined to the resistance adjustment unit 48*lou*. Thus, the first gate signal input terminal 25G1 is connected to the resistance adjustment unit 48*lou* by the bonding wire 60. One end of a bonding wire 61 is joined to the second gate signal input terminal 25G2. The other end of the bonding wire 61 is joined to the resistance adjustment unit 48*lou*. As a result, the second gate signal input terminal 25G2 is connected to the resistance adjustment unit 48*lou* by the bonding wire 61. The resistance adjustment unit 48*lou* in this embodiment is configured by, for example, a conductive pattern formed on the laminated substrate 111*u* with a conductive material (for example, copper).

The resistance adjustment unit 48*lou* includes a reference portion 480 including a region to which the other end of the bonding wire 60 is joined. The resistance adjustment unit 48*lou* includes a first portion 481 including a region to which the other end of the bonding wire 61 is joined. One end of a bonding wire 63 for connecting the resistance adjustment unit 48*lou* and the semiconductor chip 21*eu* is joined to the first portion 481 of the resistance adjustment unit 48*lou*. The other end of the bonding wire 63 is joined to a gate pad 204 of the semiconductor chip 21*eu*. The resistance adjustment unit 48*lou* includes a fifth portion 485 and a sixth portion 486 integrally formed with the reference portion 480 and the first portion 481 between the reference portion 480 and the first portion 481. The fifth portion 485 is connected to the reference portion 480, and the sixth portion 486 is connected to the first portion 481.

The resistance adjustment unit 48*lou* has a second portion 482 including a region to which one end of a bonding wire 64 for connecting to the semiconductor chip 21*fu* is joined. The other end of the bonding wire 64 is joined to a gate pad 204 of the semiconductor chip 21*fu*. The second portion 482 is connected to the sixth portion 486.

The resistance adjustment unit 48*lou* has a third portion 483 connected to the semiconductor chip 21*gu* via a bonding wire 65. The third portion 483 includes a region to which one end of the bonding wire 65 is joined. The other end of the bonding wire 65 is joined to a gate pad 204 of the semiconductor chip 21*gu*. The resistance adjustment unit 48*lou* has a seventh portion 487 and an eighth portion 488 integrally formed with the reference portion 480 and the third portion 483 between the reference portion 480 and the third portion 483. The seventh portion 487 is connected to the reference portion 480, and the eighth portion 488 is connected to the third portion 483.

The resistance adjustment unit 48*lou* has a fourth portion 484 connected to the semiconductor chip 21*hu* via a bonding wire 66. The fourth portion 484 includes a region to which one end of the bonding wire 66 is joined. The other end of the bonding wire 66 is joined to a gate pad 204 of the semiconductor chip 21*hu*. The resistance adjustment unit 48*lou* has a ninth portion 489 formed integrally with the fourth portion 484 and the fifth portion 485 between the fourth portion 484 and the fifth portion 485.

Incidentally, in FIG. 16, for convenience of explanation, a broken line is added to the resistance adjustment unit 48*lou* to illustrate the boundary between the reference portion 480 and the fifth portion 485 and the seventh portion 487, the boundary between the first portion 481 and the sixth portion 486, the boundary between the second portion 482 and the sixth portion 486, the boundary between the third portion 483 and the eighth portion 488, the boundary between the fourth portion 484 and the ninth portion 489, the boundary between the fifth portion 485 and the sixth portion 486 and the ninth portion 489, and the boundary between the seventh portion 487 and the eighth portion 488.

The relay patterns 49*loef* and 49*logh* are configured by a conductive pattern formed on the laminated substrate 111*u* with a conductive material (for example, copper). The relay patterns 49*loef* and 49*logh* have, for example, a rectangular shape in the plan view of the laminated substrate 111*u*. The relay pattern 49*loef* is arranged between the semiconductor chip 21*eu* and the semiconductor chip 21*fu*. The relay pattern 49*loef* is arranged so that the long side thereof runs along the direction in which the semiconductor chip 21*eu* and the semiconductor chip 21*fu* are arranged. The relay pattern 49*loef* is arranged between the semiconductor chip 21*eu* and the semiconductor chip 21*fu* so that the distance from one end in the longitudinal direction to the semiconductor chip 21*eu* is substantially equal to the distance from the other end in the longitudinal direction to the semiconductor chip 21*fu*, for example.

An emitter connection terminal 25E provided in the terminal group 25*lou* and the relay pattern 49*loef* are connected by a bonding wire 62*ef*. One end of the bonding wire 62*ef* is joined to the emitter connection terminal 25E. The other end of the bonding wire 62*ef* is joined to substantially the central portion of the relay pattern 49*loef*. One end of a bonding wire 68*e* is joined to one end of the relay pattern 49*loef* on the semiconductor chip 21*eu* side. The other end of the bonding wire 68*e* is joined to a part of an emitter electrode (not illustrated) which is provided in the semiconductor chip 21*eu* and serves as an emitter terminal. One end of a bonding wire 67*f* is joined to the end of the relay pattern 49*loef* on the semiconductor chip 21*fu* side. The other end of the bonding wire 67*f* is joined to a part of an emitter electrode (not illustrated) which is provided in the semiconductor chip 21*fu* and serves as an emitter terminal (not illustrated). The bonding wire 67*f* and the bonding wire 68*e* have, for example, substantially the same length as each other.

Thus, the emitter terminal (not illustrated) of the IGBT 21Q provided on each of the semiconductor chip 21*eu* and the semiconductor chip 21*fu* is connected to the emitter connection terminal 25E via the bonding wire 62*ef*. Further, as described above, the relay pattern 49*loef* is arranged so as to be substantially equidistant from the semiconductor chip 21*eu* and the semiconductor chip 21*fu*, the other end of the bonding wire 62*ef* is joined to substantially the center of the relay pattern 49*loef*, and the bonding wire 67*f* and the bonding wires 68*e* have substantially the same length as each other. Consequently, the resistance value between the IGBT 21Q provided in the semiconductor chip 21*eu* and the emitter connection terminal 25E and the resistance value between the IGBT 21Q provided in the semiconductor chip 21*fu* and the emitter connection terminal 25E become almost the same magnitude.

The emitter connection terminal 25E provided in the terminal group 25*lou* and the relay pattern 49*logh* are connected by a bonding wire 62*gh*. One end of the bonding wire 62*gh* is joined to the emitter connection terminal 25E. The other end of the bonding wire 62*gh* is joined to substantially the central portion of the relay pattern 49*logh*. One end of a bonding wire 68*g* is joined to one end of the relay pattern 49*logh* on the semiconductor chip 21*gu* side. The other end of the bonding wire 68*g* is joined to a part of the emitter electrode (not illustrated) which is provided in the semiconductor chip 21*gu* and serves as the emitter terminal. One end of a bonding wire 67*h* is joined to the end of the relay pattern 49*logh* on the semiconductor chip 21*hu* side. The other end of the bonding wire 67*h* is joined to a part of an emitter electrode (not illustrated) which is provided in the semiconductor chip 21*hu* and serves as an emitter terminal (not illustrated). The bonding wire 67*h* and the bonding wire 68*g* have, for example, substantially the same length as each other.

Thus, the emitter terminal (not illustrated) of the IGBT 21Q provided in each of the semiconductor chip 21*gu* and the semiconductor chip 21*hu* is connected to the emitter connection terminal 25E via the bonding wire 62*gh*. Further, as described above, the relay pattern 49*logh* is arranged so as to be substantially equidistant from the semiconductor chip 21*gu* and the semiconductor chip 21*hu*, the other end of the bonding wire 62*gh* is joined to substantially the center of the relay pattern 49*logh*, and the bonding wire 67*h* and the bonding wire 68*g* have substantially the same length as each other. Consequently, the resistance value between the IGBT 21Q provided in the semiconductor chip 21*gu* and the emitter connection terminal 25E and the resistance value between the IGBT 21Q provided in the semiconductor chip 21*hu* and the emitter connection terminal 25E become almost the same magnitude.

The relay pattern 49*loef* and the relay pattern 49*logh* have the same shape as each other. The bonding wire 67*h* and the bonding wire 68*g* have the same length as the bonding wire 67*f* and the bonding wire 68*e*. Further, the bonding wire 62*ef* and the bonding wire 62*gh* have the same length. Therefore, the resistance value between the IGBT 21Q provided in the semiconductor chip 21*eu* and the emitter connection terminal 25E, the resistance value between the IGBT 21Q provided in the semiconductor chip 21*fu* and the emitter connection terminal 25E, the resistance value between the IGBT 21Q provided in the semiconductor chip 21*gu* and the emitter connection terminal 25E, and the resistance value between the IGBT 21Q provided in the semiconductor chip 21*hu* and the emitter connection terminal 25E become almost the same magnitude.

In the semiconductor module 3 according to this embodiment, the first gate signal input terminal 25G1 and the IGBT 21Q provided in the semiconductor chip 21*eu* are connected by the first connection route RT1 which is configured by the bonding wire 60, the reference portion 480, the fifth portion 485, the sixth portion 486, and the first portion 481 of the resistance adjustment unit 48*lou*, and the bonding wire 63.

In the semiconductor module 3 according to this embodiment, the second gate signal input terminal 25G2 and the IGBT 21Q provided in the semiconductor chip 21*eu* are connected by the second connection route RT2 which is configured by the bonding wire 61, the first portion 481 of the resistance adjustment unit 48*lou*, and the bonding wire 63.

Further, in the semiconductor module 3 according to this embodiment, the first gate signal input terminal 25G1 and the IGBT 21Q provided in the semiconductor chip 21*fu* are connected by the third connection route RT3 which is configured by the bonding wire 60, the reference portion 480, the fifth portion 485, the sixth portion 486, and the second portion 482 of the resistance adjustment unit 48*lou*, and the bonding wire 64.

In the semiconductor module 3 according to this embodiment, the second gate signal input terminal 25G2 and the IGBT 21Q provided in the semiconductor chip 21*fu* are connected by the fourth connection route RT4 which is configured by the bonding wire 61, the first portion 481, the sixth portion 486, and the second portion 482 of the resistance adjustment unit 48*lou*, and the bonding wire 64.

Further, in the semiconductor module 3 according to this embodiment, the first gate signal input terminal 25G1 and the IGBT 21Q provided in the semiconductor chip 21gu are connected by the fifth connection route RT5 which is configured by the bonding wire 60, the reference portion 480, the seventh portion 487, the eighth portion 488, and the third portion 483 of the resistance adjustment unit 48lou, and the bonding wire 65.

In the semiconductor module 3 according to this embodiment, the second gate signal input terminal 25G2 and the IGBT 21Q provided in the semiconductor chip 21gu are connected by the sixth connection route RT6 which is configured by the bonding wire 61, the first portion 481, the sixth portion 486, the fifth portion 485, the reference portion 480, the seventh portion 487, the eighth portion 488, and the third portion 483 of the resistance adjustment unit 48lou, and the bonding wire 65.

Further, in the semiconductor module 3 according to this embodiment, the first gate signal input terminal 25G1 and the IGBT 21Q provided in the semiconductor chip 21hu are connected by the seventh connection route RT7 which is configured by the bonding wire 60, the reference portion 480, the fifth portion 485, the ninth portion 489, and the fourth portion 484 of the resistance adjustment unit 48lou, and the bonding wire 66.

In the semiconductor module 3 according to this embodiment, the second gate signal input terminal 25G2 and the IGBT 21Q provided in the semiconductor chip 21hu are connected by the eighth connection route RT8 which is configured by the bonding wire 61, the first portion 481, the sixth portion 486, the ninth portion 489, and the fourth portion 484 of the resistance adjustment unit 48lou, and the bonding wire 66.

The lengths of the first connection route RT1, the third connection route RT3, the fifth connection route RT5, and the seventh connection route RT7 are substantially the same. Further, the lengths of the second connection route RT2, the fourth connection route RT4, the sixth connection route RT6, and the eighth connection route RT8 are different from each other.

Thus, the plurality of voltage-controlled switching elements provided in the semiconductor module 3 have the IGBT 21Q (an example of the first voltage-controlled switching element) provided in the semiconductor chip 21au and the IGBT 21Q (an example of the second voltage-controlled switching element) provided in the semiconductor chip 21bu. Also, the plurality of voltage-controlled switching elements provided in the semiconductor module 3 have the IGBT 21Q (an example of the third voltage-controlled switching element) provided in the semiconductor chip 21gu. Further, the plurality of voltage-controlled switching elements provided in the semiconductor module 3 have the IGBT 21Q (an example of the fourth voltage-controlled switching element) provided in the semiconductor chip 21hu.

The first connection route group RTG1 on the low side has as a plurality of connection routes, the first connection route RT1 connecting the external terminal Galou provided in the terminal group 25lou and the IGBT 21Q provided in the semiconductor chip 21au, and the third connection route RT3 connecting the external terminal Galou and the IGBT 21Q provided in the semiconductor chip 21bu. Also, the first connection route group RTG1 has as a plurality of connection routes, the fifth connection route RT5 connecting the external terminal Galou and the IGBT 21Q provided in the semiconductor chip 21gu. Further, the first connection route group RTG1 has as a plurality of connection routes, the seventh connection route RT7 connecting the external terminal Galou and the IGBT 21Q provided in the semiconductor chip 21hu.

The second connection route group RTG2 on the low side has as a plurality of connection routes, the second connection route RT2 connecting the external terminal Gblou provided in the terminal group 25lou and the IGBT 21Q provided in the semiconductor chip 21au, and the fourth connection route RT4 connecting the external terminal Galou and the IGBT 21Q provided in the semiconductor chip 21bu. Also, the second connection route group RTG2 has as a plurality of connection routes, the sixth connection route RT6 connecting the external terminal Gblou and the IGBT 21Q provided in the semiconductor chip 21gu. Further, the second connection route group RTG2 has as a plurality of connection routes, the eighth connection route RT8 connecting the external terminal Gblou and the IGBT 21Q provided in the semiconductor chip 21hu.

In the semiconductor module 3, the resistance value of the seventh connection route RT7 and the resistance value of the eighth connection route RT8 on the low side are different from each other. Specifically, on the low side of the semiconductor module 3, the resistance value of the second connection route RT2 is the smallest, the resistance value of the fourth connection route RT4 is larger than the resistance value of the second connection route RT2, the resistance value of the eighth connection route RT8 is larger than the resistance value of the fourth connection route RT4, and the resistance value of the sixth connection route RT6 is the largest.

Each part of the second connection route RT2, the fourth connection route RT4, the sixth connection route RT6, and the eighth connection route RT8 on the low side is a part of the resistance adjustment unit 48lou. Therefore, the second connection route group RTG2 has the resistance adjustment unit 48lou which changes the mutual resistance values of the second connection route RT2, the fourth connection route RT4, the sixth connection route RT6, and the eighth connection route RT8 (an example of a plurality of connection routes) provided in the second connection route group RTG2 and is common to the second connection route RT2, the fourth connection route RT4, the sixth connection route RT6, and the eighth connection route RT8. Each part of the first connection route RT1, the third connection route RT3, the fifth connection route RT5, and the seventh connection route RT7 on the low side is a part of the resistance adjustment unit 48lou. In this embodiment, the first connection route RT1, the third connection route RT3, the fifth connection route RT5, and the seventh connection route RT7 are formed to have the same length as each other, but they can be of different lengths (that is, different resistance values) by changing the position where the bonding wire 60 is joined to the resistance adjustment unit 48lou. Therefore, the first connection route group RTG1 can have the resistance adjustment unit 48lou which adjusts the mutual resistance values of the first connection route RT1, the third connection route RT3, the fifth connection route RT5, and the seventh connection route RT7 (an example of a plurality of connection routes) provided in the first connection route group RTG1 and is common to the first connection route RT1, the third connection route RT3, the fifth connection route RT5, and the seventh connection route RT7.

(Failed Element Determination Method for Semiconductor Module)

Next, a failed element determination method for the semiconductor chips 21au, 21bu, 21cu, 21du, 21eu, 21fu, 21gu, an 21hu in the semiconductor module 3 according to this embodiment will be described. The failed element determination method for the semiconductor module 3 according to this embodiment compares a current flowing through the external terminal Gblou with a predetermined comparative current value to determine whether or not a failure has occurred in any of the IGBTs 21Q provided in the semiconductor chips 21*au*, 21*bu*, 21*cu*, 21*du*, 21*eu*, 21*fu*, 21*gu*, and 21*hu* respectively.

The failed element determination method for the semiconductor module 3 according to this embodiment is similar to the failed element determination method for the semiconductor module 2 according to the second embodiment except that the two comparative current values are used. As described above, on the low side of the semiconductor module 3, the resistance value of the second connection route RT2 is the smallest, the resistance value of the fourth connection route RT4 is larger than the resistance value of the second connection route RT2, the resistance value of the eighth connection route RT8 is larger than the resistance value of the fourth connection route RT4, and the resistance value of the sixth connection route RT6 is the largest.

Therefore, the inclination of the IV characteristics for the first comparison is set to be smaller than the inclination of the IV characteristics when a failure occurs in the IGBT 21Q provided in the semiconductor chip 21*eu*, to be almost the same as the inclination of the IV characteristics when a failure occurs in the IGBT 21Q provided in the semiconductor chip 21*fu*, and to be larger than the inclination of the IV characteristics when a failure occurs in the IGBT 21Q provided in the semiconductor chip 21*hu*. The inclination of the IV characteristics for the second comparison is set to be smaller than the inclination of the IV characteristics when a failure occurs in the IGBT 21Q provided in the semiconductor chip 21*fu*, to be almost the same as the inclination of the IV characteristics when a failure occurs in the IGBT 21Q provided in the semiconductor chip 21*hu*, and to be larger than the inclination of the IV characteristics when a failure occurs in the IGBT 21Q provided in the semiconductor chip 21*gu*.

A failure determination unit (not illustrated) provided in the semiconductor module 3 compares the current value (target current value) of a current input from a gate drive unit (not illustrated) provided in the semiconductor module 3 and output to the external terminal Gblou with a reference current value based on the maximum current flowing through the gate terminal G when the IGBT is not out of order. When the target current value is equal to or less than the reference current value, the failure determination unit determines that none of the semiconductor chips 21*eu*, 21*fu*, 21*gu*, and 21*hu* have failed.

When the target current value is larger than the reference current value, the failure determination unit determines a current value (first comparative current value) obtained from a predetermined range for the IV characteristics for the first comparison and a current value (second comparative current value) obtained from a predetermined range for the IV characteristics for the second comparison. When the target current value is larger than the maximum current in the predetermined range with respect to the first comparison current value, the failure determination unit determines that the IGBT 21Q provided in the semiconductor chip 21*eu* is out of order. When the target current value is within the predetermined range with respect to the first comparative current value, the failure determination unit determines that the IGBT 21Q provided in the semiconductor chip 21*fu* is out of order. When the target current value is within the predetermined range with respect to the second comparative current value, the failure determination unit determines that the IGBT 21Q provided in the semiconductor chip 21*gu* is out of order. When the target current value is larger than the minimum current in the predetermined range with respect to the second comparative current value, the failure determination unit determines that the IGBT 21Q provided in the semiconductor chip 21*hu* is out of order.

Thus, the semiconductor module 3 can determine whether or not any of the semiconductor chips 21*eu*, 21*fu*, 21*gu*, and 21*hu* is out of order by making different the resistance value of the second connection route RT2, the resistance value of the fourth connection route RT4, the resistance value of the sixth connection route RT6, and the resistance value of the eighth connection route RT8 in the case where the four semiconductor chips 21*eu*, 21*fu*, 21*gu*, and 21*hu* are connected in parallel.

Although detailed description is omitted, the configuration on the high side and the failed element determination method are similar to the configuration on the low side and the failed element determination method in the case where the semiconductor chip 21*eu* is read as the semiconductor chip 21*au*, the semiconductor chip 21*fu* is read as the semiconductor chip 21*bu*, the semiconductor chip 21*gu* is read as the semiconductor chip 21*cu*, the semiconductor chip 21*hu* is read as the semiconductor chip 21*du*, the resistance adjustment unit 48*lou* is read as the resistance adjustment unit 48*upu*, the relay pattern 49*loef* is read as the relay pattern 49*upab*, the relay pattern 49*logh* is read as the relay pattern 49*upcd*, the bonding wire 62*ef* is read as the bonding wire 62*ab*, the bonding wire 62*gh* is read as the bonding wire 62*cd*, the bonding wire 67*f* is read as the bonding wire 67*b*, the bonding wire 67*h* is read as the bonding wire 67*d*, the bonding wire 68*e* is read as the bonding wire 68*a*, and the bonding wire 68*f* is read as the bonding wire 68*c*.

Although the illustration and detailed description are omitted, it is possible to determine by using the same method as the U phase, whether or not a failure occurs even in each of the four semiconductor chips on the high side and the four semiconductor chips on the low side, which are provided in the V phase, and the four semiconductor chips on the high side and the four semiconductor chips on the low side, which are provided in the W phase.

As described above, the semiconductor module 3 according to this embodiment includes the IGBT 21Q, for example, provided in each of the semiconductor chips 21*eu*, 21*fu*, 21*gu*, and 21*hu* connected in parallel switching of which being controlled by the gate voltage based on the gate signal, and the external terminals Galou and Gblou input with the gate signal. The semiconductor module 3 includes the first connection route group RTG1 having the first connection route RT1, the third connection route RT3, the fifth connection route RT5, and the seventh connection route RT7 connecting the external terminal Galou and the IGBT 21Q provided in each of the semiconductor chips 21*eu*, 21*fu*, 21*gu*, and 21*hu*. The semiconductor module 3 includes the second connection route group RTG2 having the second connection route RT2, the fourth connection route RT4, the sixth connection route RT6, and the eighth connection route RT8 connecting the external terminal Gblou and the IGBT 21Q provided in each of the semiconductor chips 21*eu*, 21*fu*, 21*gu*, and 21*hu*.

With such a configuration, the semiconductor module 3 can determine a semiconductor chip in which a short-circuit failure has occurred without being disassembled.

The present invention is not limited to the first embodiment, the second embodiment, and the third embodiment, and various modifications are possible.

The semiconductor module according to the first embodiment to the third embodiment easily adjusts a resistance value by making the shape of a resistance adjustment unit and the joining position of a bonding wire different to thereby make the resistance values of a plurality of connection routes different, but the present invention is not limited to this. For example, the resistance adjustment unit may have a plurality of resistance elements different in resistance value, and one or a plurality of these resistance elements may form a part of a plurality of connection routes, or the resistance value may be adjusted by the length of the bonding wire. Thus, since the semiconductor module is capable of making the resistance values of the plurality of connection routes different, the same effect as that of the semiconductor module according to the first embodiment to third embodiment can be obtained.

In the semiconductor module according to the first embodiment to the third embodiment, the signal input terminal, the resistance adjustment unit, and the semiconductor chip are connected by the bonding wire, but the present invention is not limited to this. For example, a part or all of the signal input terminal, the resistance adjustment unit, and the semiconductor chip may be connected by a lead frame. Even in this case, the same effect as that of the semiconductor module according to the first embodiment to the third embodiment can be obtained.

The semiconductor module according to the first embodiment to the third embodiment includes the IGBT as the voltage-controlled switching element, but the present invention is not limited to this. The same effect can be obtained even if the semiconductor module includes, for example, a power MOSFET (Metal-Oxide-Semiconductor Field-Effect Transistor) as a voltage-controlled switching element.

The technical scope of the present invention is not limited to the exemplary embodiments illustrated and described, but also includes all embodiments which produce an effect equivalent to what the present invention is intended for. Further, the technical scope of the present invention is not limited to the combination of the features of the invention defined by the claims, but can be defined by any desired combination of the specific features of all the disclosed features.

REFERENCE SIGNS LIST 1, 2, 3 semiconductor module
10 case
11$u$, 11$v$, 11$w$ storage unit
21$au$, 21$av$, 21$aw$, 21$bu$, 21$bv$, 21$bw$, 21$cu$, 21$cv$, 21$cw$, 21$du$, 21$dv$, 21$dw$, 21$eu$, 21$fu$, 21$gu$, 21$hu$ semiconductor chip
21D freewheel diode
21Q insulated gate bipolar transistor (IGBT)
21S current detection element
23$lou$, 23$lov$, 23$low$, 23$upu$, 23$upv$, 23$upw$, 26$lou$, 26$upu$, 48$lou$,
48$upu$ resistance adjustment unit
24$lou$, 24$lov$, 24$low$, 24$upu$, 24$upv$, 24$upw$, 27$loua$, 27$loub$, 27$upua$, 27$upub$, 49$lopef$, 49$lopgh$, 49$upab$, 49$upcd$ relay pattern
25A anode side temperature detection terminal
25E emitter connection terminal
25G gate signal input terminal
25G1 first gate signal input terminal
25G2 second gate signal input terminal
25K cathode side temperature detection terminal
25$lou$, 25$lov$, 25$low$, 25$upu$, 25$upv$, 25$upw$ terminal group
25S current detection terminal
31 gate drive unit
32, 38 failure determination unit
35 current detection unit
37 temperature detection unit
38 failure determination unit
40, 41, 42, 43, 44, 45, 46, 47, 48, 49, 50, 51, 52, 52$d$, 52$f$, 53, 54, 55, 56$d$, 56$f$, 57$d$, 57$f$, 60, 61, 62$ab$, 62$cd$, 62$ef$, 62$gh$, 63, 64, 65, 66, 67$b$, 67$d$, 67$f$, 67$h$, 68$a$, 68$c$, 68$e$, 68$g$ bonding wire
71 printed circuit board
81 mold resin
111$u$, 111$v$, 111$w$ laminated substrate
200 active section
201 anode pad
202 cathode pad
203 sense pad
204 gate pad
205, 215$a$, 215$b$, 216$a$, 216$b$ gate runner
206 emitter electrode
207 collector electrode
208 interlayer insulating film
208$a$ contact hole
209$a$ gate trench portion
209$a$-1 gate conductive portion
209$a$-2 gate insulating film
209$b$ dummy trench portion
209$b$-1 dummy conductive portion
209$b$-2 dummy insulting film
210 semiconductor substrate
210$a$ emitter region
210$b$ base region
210$c$ storage region
210$d$ drift region
210$e$ buffer region
210$f$ collector region
210$h$ cathode region
211 transistor portion
212 diode portion
212$a$ mesa portion
213 temperature detection element
214 temperature detection wiring
217 edge termination structure portion
218 outer peripheral end
231, 261 first portion
232, 262 second portion
233, 263 third portion
234, 264 fourth portion
235, 265 fifth portion
241 relay pattern
321, 322, 381 detection part
323, 324, 382, 383 comparison part
325, 384 determination part
A anode terminal
Alou, Alov, Alow, Aupu, Aupv, Aupw, Elou, Elov, Elow, Eupu, Eupv, Eupw, Galou, Galov, Galow, Gaupu, Gaupv, Gaupw, Gblou, Gblov, Gblow, Gbupu, Gbupv, Gbupw, Klou, Klov, Klow, Kupu, Kupv, Kupw, Slou, Slov, Slow, Supu, Supv, Supw external terminal
C collector terminal
E emitter terminal
G gate terminal
K cathode terminal Nu, Nv, Nw negative electrode terminal
Ou, Ov, Ow output terminal
Pu, Pv, Pw positive electrode terminal
RT1 first connection route
RT2 second connection route
RT3 third connection route
RT4 fourth connection route
RT5 fifth connection route
RT6 sixth connection route
RT7 seventh connection route
RT8 eighth connection route
RTG1 first connection route group
RTG2 second connection route group
S sense terminal.

The invention claimed is:

1. A semiconductor module comprising:
a plurality of voltage-controlled switching elements connected in parallel, switching of which controlled by a drive voltage based on an input signal;
a first external terminal and a second external terminal input with the input signal;
a first connection route group having a plurality of connection routes connecting the first external terminal and the plurality of voltage-controlled switching elements; and
a second connection route group having a plurality of connection routes connecting the second external terminal and the plurality of voltage-controlled switching elements and different in resistance value from each other.

2. The semiconductor module according to claim 1, wherein the second connection route group has a resistance adjustment unit which changes mutual resistance values of the plurality of connection routes provided in the second connection route group and is common to the plurality of connection routes.

3. The semiconductor module according to claim 2, further comprising:
a substrate having the plurality of voltage-controlled switching elements arranged on the substrate,
wherein the resistance adjustment unit has a conductive pattern formed on the substrate with a conductive material.

4. The semiconductor module according to claim 3, wherein the first connection route group and the second connection route group respectively have bonding wires connected to mutual different positions of the conductive pattern and connecting the conductive pattern and the voltage-controlled switching elements.

5. The semiconductor module according to claim 4, further comprising:
a failure determination unit which determines whether or not a failure occurs in any of the plurality of voltage-controlled switching elements, based on the relationship between a current flowing through the second external terminal and a voltage of the second external terminal.

6. The semiconductor module according to claim 4,
wherein the plurality of voltage-controlled switching elements has at least a first voltage-controlled switching element and a second voltage-controlled switching element,
wherein the first connection route group has as the plurality of connection routes, a first connection route connecting the first external terminal and the first voltage-controlled switching element, and a third connection route connecting the first external terminal and the second voltage-controlled switching element,
wherein the second connection route group has as the plurality of connection routes, a second connection route connecting the second external terminal and the first voltage-controlled switching element, and a fourth connection route connecting the second external terminal and the second voltage-controlled switching element, and
wherein the resistance value of the first connection route and the resistance value of the third connection route are the same, the resistance value of the second connection route and the resistance value of the fourth connection route are different, the resistance value of the first connection route and the resistance value of the second connection route are different, and the resistance value of the third connection route and the resistance value of the fourth connection route are different.

7. The semiconductor module according to claim 3, further comprising:
a failure determination unit which determines whether or not a failure occurs in any of the plurality of voltage-controlled switching elements, based on the relationship between a current flowing through the second external terminal and a voltage of the second external terminal.

8. The semiconductor module according to claim 3,
wherein the plurality of voltage-controlled switching elements has at least a first voltage-controlled switching element and a second voltage-controlled switching element,
wherein the first connection route group has as the plurality of connection routes, a first connection route connecting the first external terminal and the first voltage-controlled switching element, and a third connection route connecting the first external terminal and the second voltage-controlled switching element,
wherein the second connection route group has as the plurality of connection routes, a second connection route connecting the second external terminal and the first voltage-controlled switching element, and a fourth connection route connecting the second external terminal and the second voltage-controlled switching element, and
wherein the resistance value of the first connection route and the resistance value of the third connection route are the same, the resistance value of the second connection route and the resistance value of the fourth connection route are different, the resistance value of the first connection route and the resistance value of the second connection route are different, and the resistance value of the third connection route and the resistance value of the fourth connection route are different.

9. The semiconductor module according to claim 2, further comprising:
a failure determination unit which determines whether or not a failure occurs in any of the plurality of voltage-controlled switching elements, based on the relationship between a current flowing through the second external terminal and a voltage of the second external terminal.

10. The semiconductor module according to claim 2,
wherein the plurality of voltage-controlled switching elements has at least a first voltage-controlled switching element and a second voltage-controlled switching element,
wherein the first connection route group has as the plurality of connection routes, a first connection route connecting the first external terminal and the first voltage-controlled switching element, and a third connection route connecting the first external terminal and the second voltage-controlled switching element,
wherein the second connection route group has as the plurality of connection routes, a second connection route connecting the second external terminal and the first voltage-controlled switching element, and a fourth connection route connecting the second external terminal and the second voltage-controlled switching element, and
wherein the resistance value of the first connection route and the resistance value of the third connection route are the same, the resistance value of the second connection route and the resistance value of the fourth connection route are different, the resistance value of the first connection route and the resistance value of the second connection route are different, and the resistance value of the third connection route and the resistance value of the fourth connection route are different.

11. A failed element determination method for the semiconductor module according to claim 2,
comparing a current flowing through the first external terminal and a current flowing through the second external terminal; and
determining whether or not a failure occurs in any of the plurality of voltage-controlled switching elements.

12. The semiconductor module according to claim 1, further comprising:
a failure determination unit which determines whether or not a failure occurs in any of the plurality of voltage-controlled switching elements, based on the relationship between a current flowing through the second external terminal and a voltage of the second external terminal.

13. The semiconductor module according to claim 12,
wherein the plurality of voltage-controlled switching elements has at least a first voltage-controlled switching element and a second voltage-controlled switching element,
wherein the first connection route group has as the plurality of connection routes, a first connection route connecting the first external terminal and the first voltage-controlled switching element, and a third connection route connecting the first external terminal and the second voltage-controlled switching element,
wherein the second connection route group has as the plurality of connection routes, a second connection route connecting the second external terminal and the first voltage-controlled switching element, and a fourth connection route connecting the second external terminal and the second voltage-controlled switching element, and
wherein the resistance value of the first connection route and the resistance value of the third connection route are the same, the resistance value of the second connection route and the resistance value of the fourth connection route are different, the resistance value of the first connection route and the resistance value of the second connection route are different, and the resistance value of the third connection route and the resistance value of the fourth connection route are different.

14. The semiconductor module according to claim 1,
wherein the plurality of voltage-controlled switching elements has at least a first voltage-controlled switching element and a second voltage-controlled switching element,
wherein the first connection route group has as the plurality of connection routes, a first connection route connecting the first external terminal and the first voltage-controlled switching element, and a third connection route connecting the first external terminal and the second voltage-controlled switching element,
wherein the second connection route group has as the plurality of connection routes, a second connection route connecting the second external terminal and the first voltage-controlled switching element, and a fourth connection route connecting the second external terminal and the second voltage-controlled switching element, and
wherein the resistance value of the first connection route and the resistance value of the third connection route are the same, the resistance value of the second connection route and the resistance value of the fourth connection route are different, the resistance value of the first connection route and the resistance value of the second connection route are different, and the resistance value of the third connection route and the resistance value of the fourth connection route are different.

15. The semiconductor module according to claim 14,
wherein the difference between the resistance value of the first connection route and the resistance value of the third connection route is different from the difference between the resistance value of the second connection route and the resistance value of the fourth connection route.

16. The semiconductor module according to claim 15,
wherein the plurality of voltage-controlled switching elements have a third voltage-controlled switching element,
wherein the first connection route group has as the plurality of connection routes, a fifth connection route connecting the first external terminal and the third voltage-controlled switching element,
wherein the second connection route group has as the plurality of connection routes, a sixth connection route connecting the second external terminal and the third voltage-controlled switching element, and
wherein the resistance value of the fifth connection route and the resistance value of the sixth connection route are different from each other.

17. The semiconductor module according to claim 14,
wherein the plurality of voltage-controlled switching elements have a third voltage-controlled switching element,
wherein the first connection route group has as the plurality of connection routes, a fifth connection route connecting the first external terminal and the third voltage-controlled switching element,
wherein the second connection route group has as the plurality of connection routes, a sixth connection route connecting the second external terminal and the third voltage-controlled switching element, and wherein the resistance value of the fifth connection route and the resistance value of the sixth connection route are different from each other.

18. The semiconductor module according to claim 17, wherein the plurality of voltage-controlled switching elements have a fourth voltage-controlled switching element, wherein the first connection route group has as the plurality of connection routes, a seventh connection route connecting the first external terminal and the fourth voltage-controlled switching element, wherein the second connection route group has as the plurality of connection routes, an eighth connection route connecting the second external terminal and the fourth voltage-controlled switching element, and wherein the resistance value of the seventh connection route and the resistance value of the eighth connection route are different from each other.

19. The failed element determination method for the semiconductor module according to claim 17, comparing a current flowing through the second external terminal and a predetermined comparative current value to determine whether or not a failure occurs in any of the plurality of voltage-controlled switching elements.

20. A failed element determination method for the semiconductor module according to claim 1, comparing a current flowing through the first external terminal and a current flowing through the second external terminal to determine whether or not a failure occurs in any of the plurality of voltage-controlled switching elements.

* * * * *